United States Patent [19]

Buss

[11] 4,093,922
[45] June 6, 1978

[54] MICROCOMPUTER PROCESSING APPROACH FOR A NON-VOLATILE TV STATION MEMORY TUNING SYSTEM

[75] Inventor: Kenneth George Buss, Dallas County, Tex.

[73] Assignee: Texas Instruments Incorporated, Dallas, Tex.

[21] Appl. No.: 778,400

[22] Filed: Mar. 17, 1977

[51] Int. Cl.² .................................................. H04B 1/26
[52] U.S. Cl. .................................. 325/459; 325/464; 325/468; 358/191
[58] Field of Search ............... 325/335, 453, 455, 458, 325/459, 464, 465, 468, 470; 358/191; 340/173 VT; 357/23

[56] References Cited

U.S. PATENT DOCUMENTS

| | | | |
|---|---|---|---|
| 3,845,394 | 10/1974 | Hamada | 325/455 |
| 3,962,644 | 6/1976 | Baker | 325/455 |
| 3,968,440 | 7/1976 | Ehni | 325/417 |
| 3,979,680 | 9/1976 | Sakamoto | 325/464 |
| 3,983,492 | 9/1976 | Fisher | 325/56 |
| 4,058,772 | 11/1977 | Mogi | 325/459 |

*Primary Examiner*—Robert L. Richardson
*Assistant Examiner*—Marc E. Bookbinder
*Attorney, Agent, or Firm*—Jim Comfort; Rene' E. Grossman; Stephen B. Goldman

[57] ABSTRACT

A television tuning system having a non-volatile memory for storing digital tune words is electrically updated by a microcomputer type architecture control circuitry. A ROM memory matrix is provided for the storage of VHF minimum and maximum binary tune words corresponding to each of twelve VHF channels in addition to a UHF minimum and maximum binary tune word encompassing all possible 72 UHF channels. Tuning of individual VHf and UHF channels is accomplished by incrementing or decrementing a given tune word within the minimum and maximum limits established in the ROM memory matrix by means of a microcomputer processing approach.

17 Claims, 54 Drawing Figures

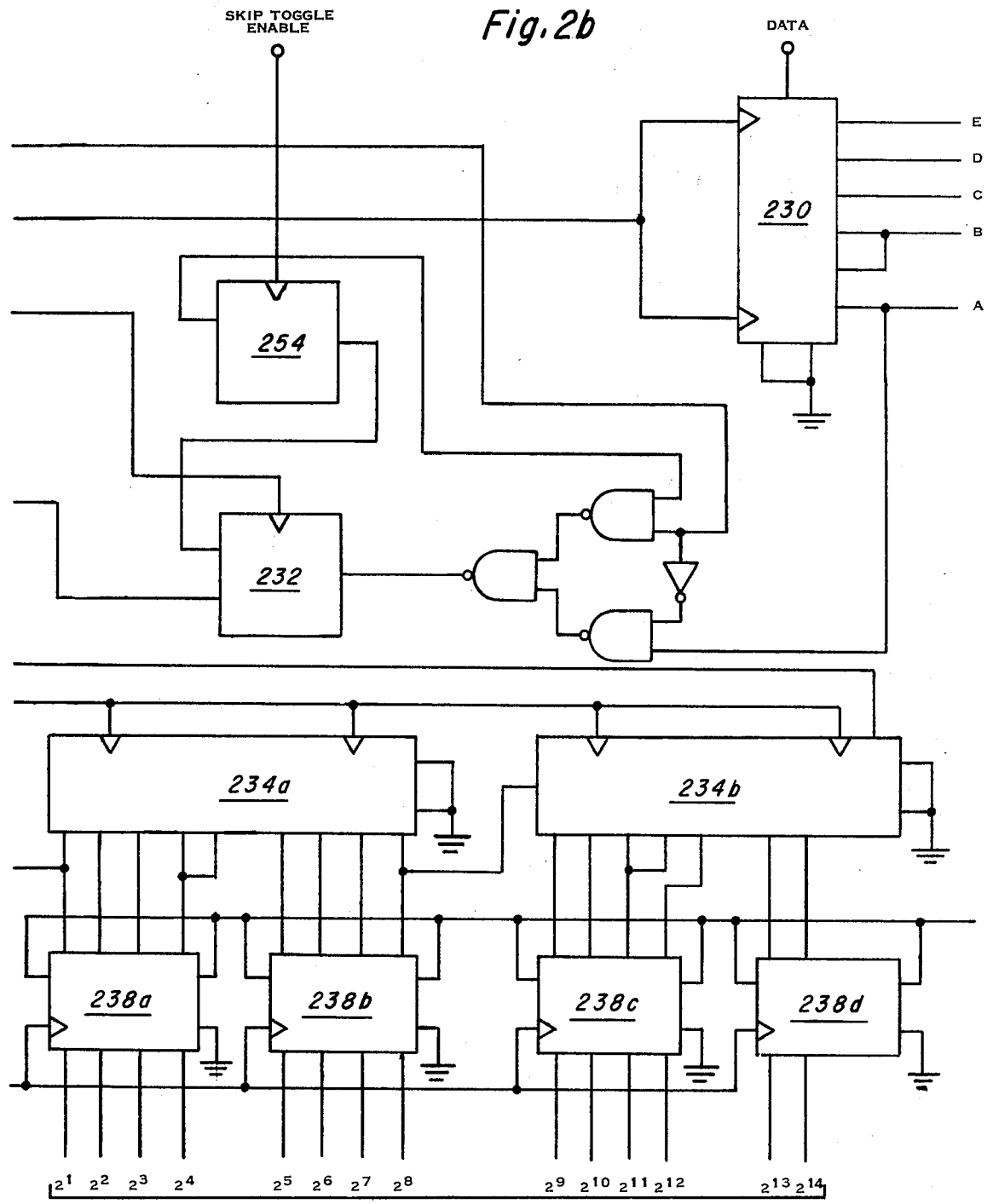

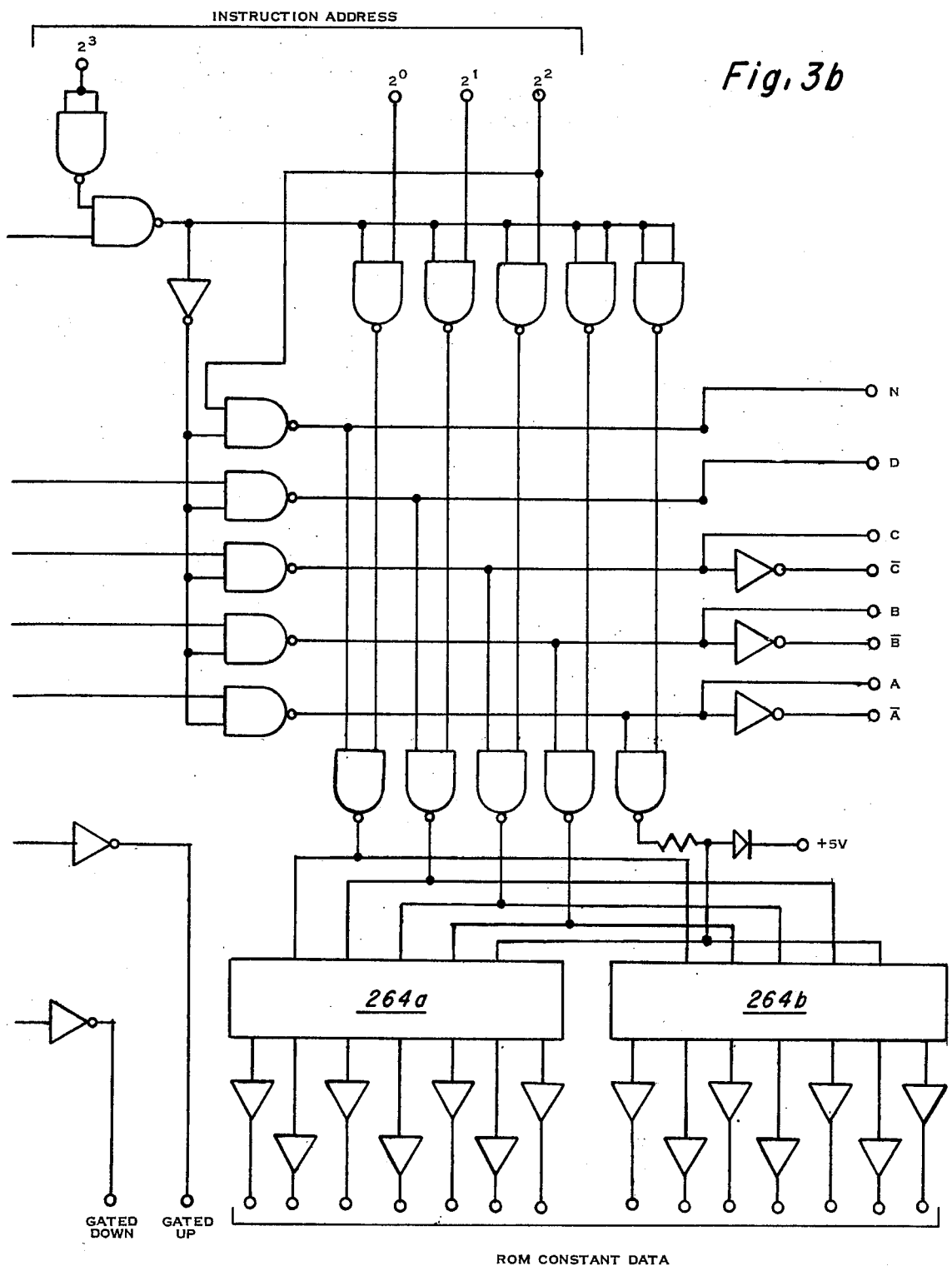

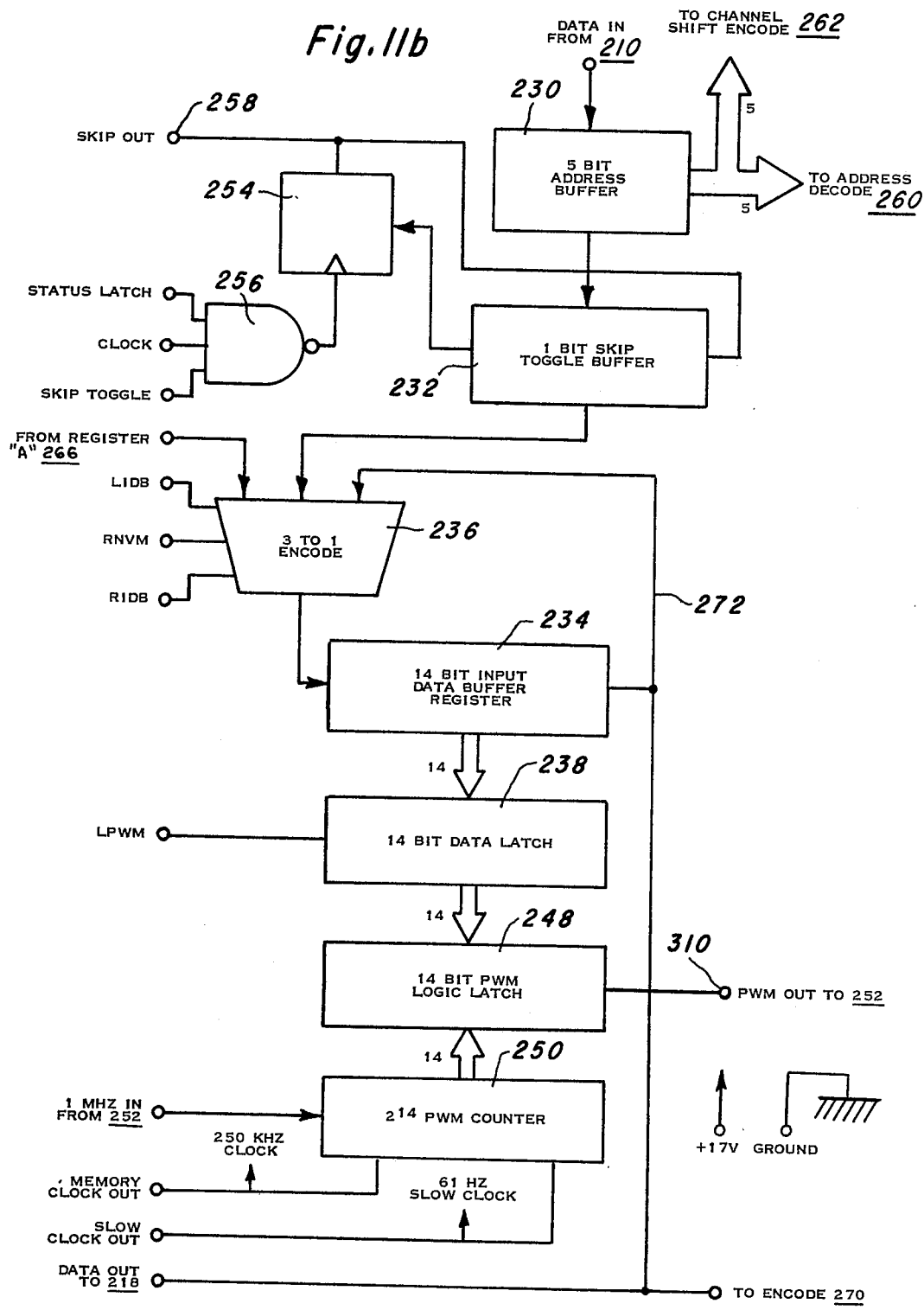

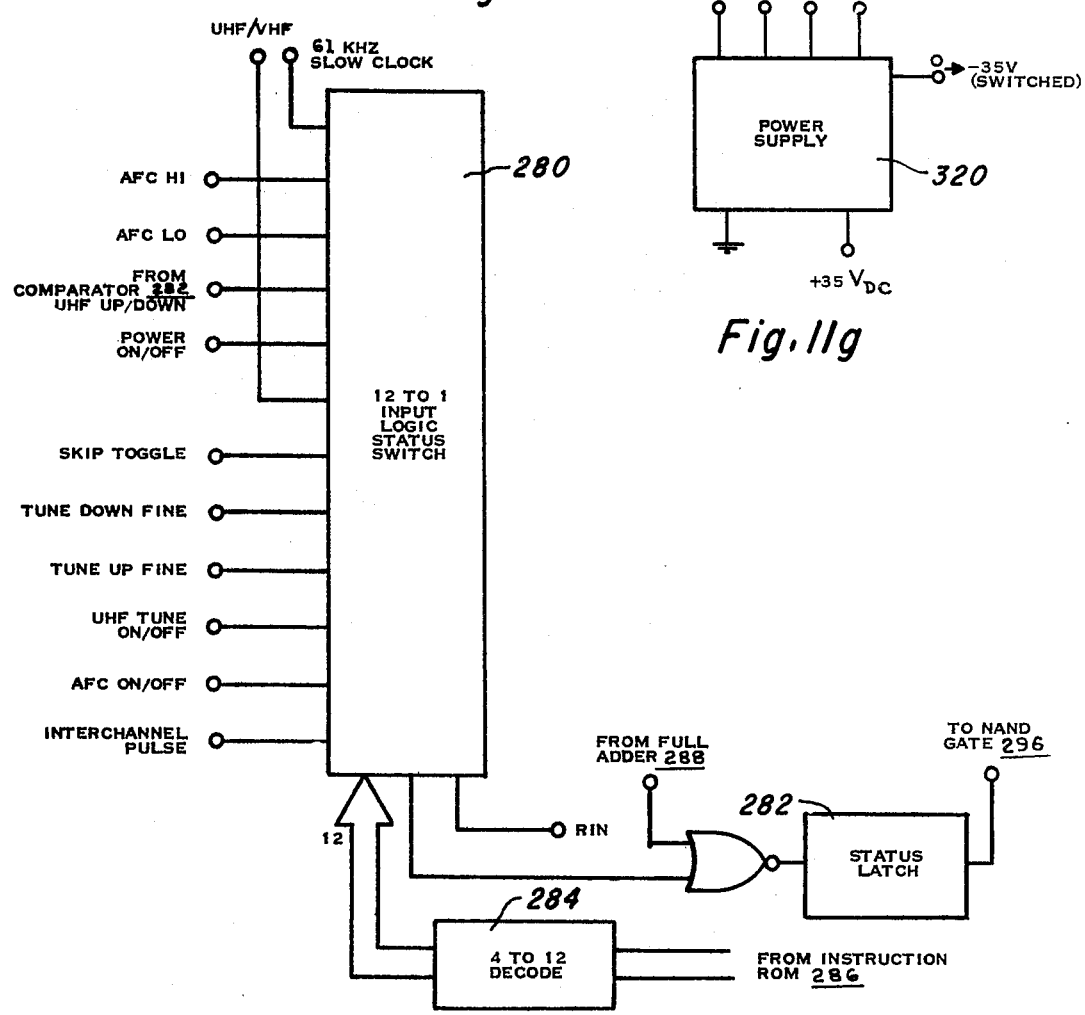

(1) $E_O = E_{AFC}(1 + R_f/R_i) - (R_f/R_i E_i)$ (2) $R_f/R_i = 5.6$ (3) $E_i = (6.6 E_{AFC} - E_O)/5.6$ (4) BITS $= (E_i/0.3052) \, 10^3$

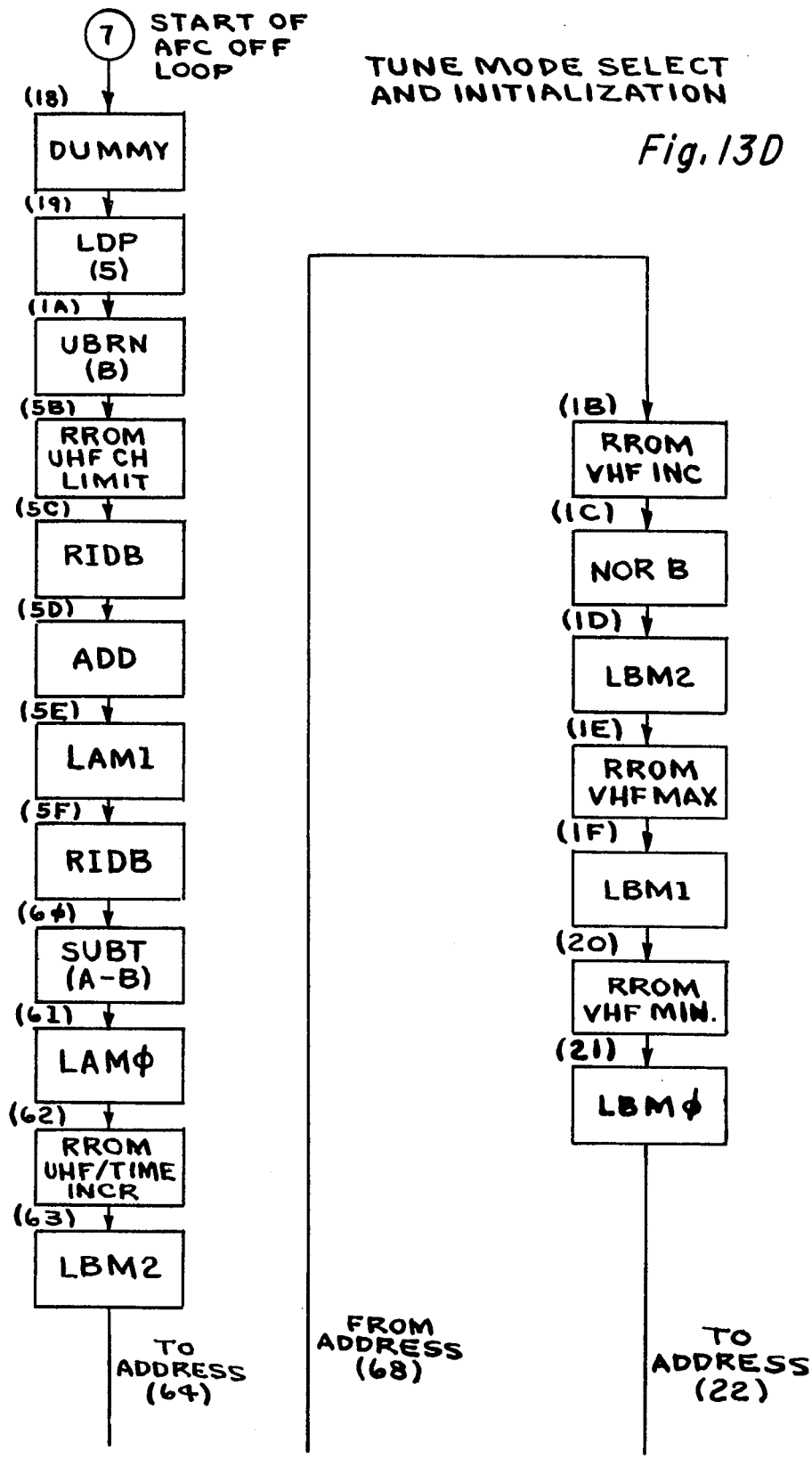

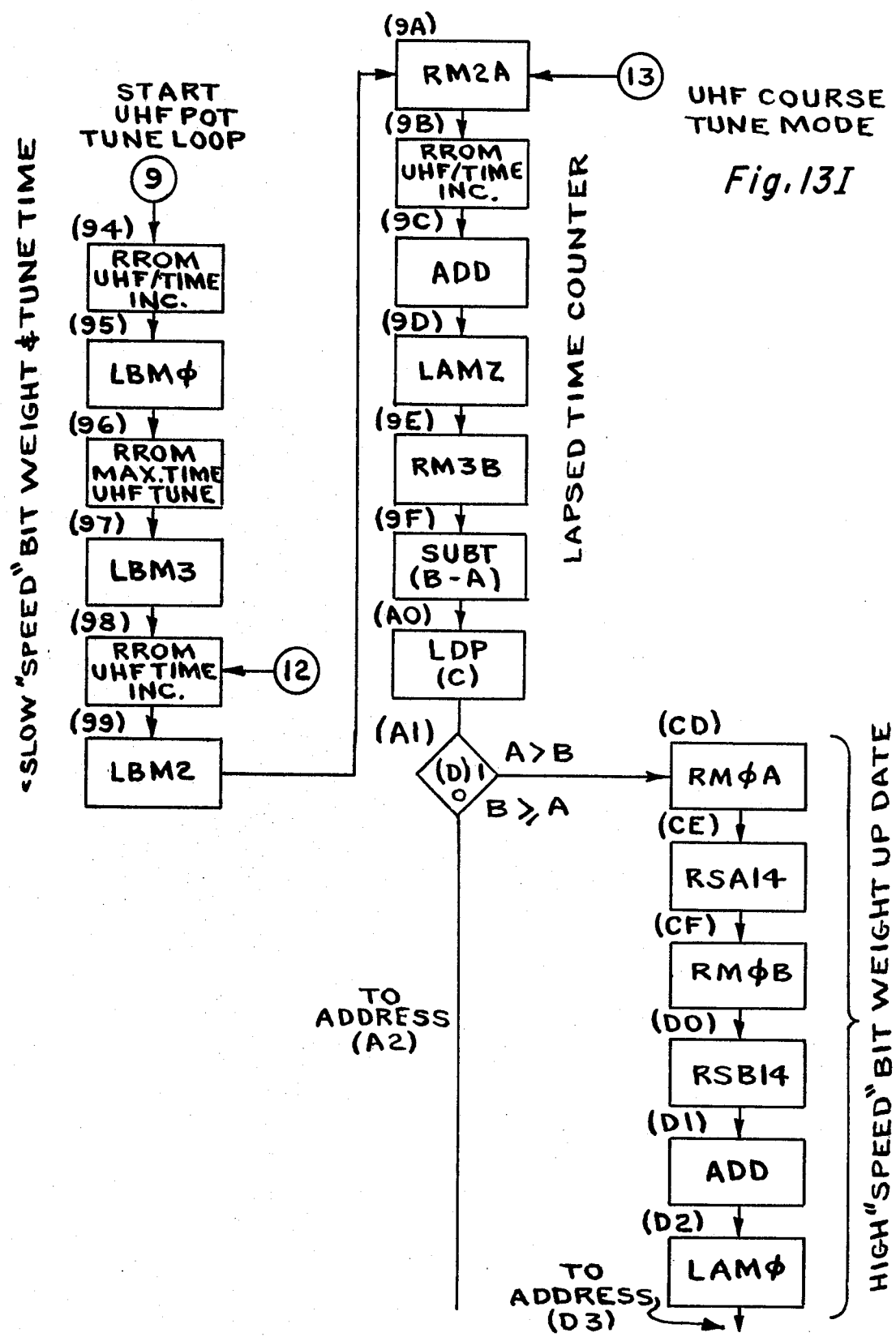

MICROCOMPUTER PROCESSING APPROACH FOR A NON-VOLATILE TV STATION MEMORY TUNING SYSTEM

BACKGROUND OF THE INVENTION

This invention relates in general to the tuning of a broadcast receiver, and more particularly relates to the tuning of a television receiver using a non-volatile memory for storing binary tune words that are electrically updated by a microcomputer type architecture control circuitry.

Previously developed electronic channel tuning systems have not been sufficiently flexible to enable widespread use for a variety of different types of television sets in applications. For example, certain previously developed systems have required extremely uniform varactor tuning diodes to enable channel tuning, thereby allowing insufficient tolerances for conventional variances between varactor diodes. Other previously developed systems have not been sufficiently modular to enable a selection of various types of channel access or displays. Moreover, previously developed electronic channel tuning systems have not been sufficiently economical to fabricate and have required uneconomical printed circuit boards or other uneconomical fabrication techniques for construction. For example, certain prior systems have required expensive potentiometers for each channel desired to be tuned. In addition, previously developed electronic television tuning systems have not satisfactorily satisfied recent regulatory requirements which call for a television tuner to provide a comparable capability and quality of tuning for both VHF and UHF stations. Specifically, such prior tuning systems have not enabled selection of precise UHF channels, nor have the prior systems provided means for easily changing selected UHF channels.

A major disadvantage in the channel tuning sections of television receivers has been the inability to electronically program and store tune voltages under all operating and non-operating conditions without using an auxiliary power source or a mechanically programmed memory. Existing electronically operable tuners use dedicated electronic circuitry to program tune voltage information in volatile memories where the volatile memories require batteries to provide standby power when the main power source is removed. The batteries are undesirable because they represent an additional cost to the manufacturer and a present a long-term tune voltage jeopardy if they fail when the main power source is removed. Memory loss due to battery failure can occur if there are poor battery connections, battery corrosion, or excessive battery drain. Other tuning systems use potentiometers to retain the channel tune voltage, but are also undesirable because they are not electronically alterable, and require a potentiometer for each channel to be tuned.

In accordance with the present invention, the undesirable characteristics are eliminated by using a nonvolatile DIFMOS memory matrix to store the channel tune voltages. The DIFMOS memory (dual injection floating gate MOS technology) is electronically alterable and has a projected memory retention capability of over 100 years with power removed. The control circuitry for the system uses a microcomputer type architecture to integrate the user control inputs and to generate the signals needed to access and alter the DIFMOS memory matrix. A principal advantage of this type of control compared to the dedicated control circuit approach is the ease with which different manufacturers' system requirements can be satisfied by simply reprogramming the algorithm of the instruction memory.

Accordingly, an object of the present invention is to provide an electronically programmable television tuning system having a non-volatile memory matrix for the storage of binary tune words.

Another object of the present invention is to provide electronic alterable tuning means for a broadcast receiver using a microcomputer approach, thereby eliminating the need for dedicated control circuitry.

Yet another object of the present invention is to provide means for electronically updating binary tune words of a selected channel in the tuning of a television receiver and for storing the updated binary words in a non-volatile memory matrix.

Still a further object of the present invention is to provide a means for generating a binary tune word corresponding to a selected UHF or VHF channel within the limits of a binary minimum and maximum word stored in a memory matrix.

SUMMARY OF THE INVENTION

A television tuning system is taught having a nonvolatile RAM memory for storing digital tune words that are electronically updated by a microcomputer type architecture control circuitry. A five-bit binary address word is provided for addressing a 15-bit binary word from a nonvolatile memory matrix. The 15-bit binary word comprises 14 bits corresponding to a tune word for the channel selected and a 15th MSB as a skip toggle indicator. The 20 bits are stored in three shift registers in the data in/out circuit in a 5-bit address buffer, a 1-bit skip toggle buffer, and a 14-bit data buffer register. The 14-bit tune word is placed in a data latch comparator for the PWM generator. An analog circuit provides the voltage conversion of the digital output of the PWM generator proportional to the tune word for applying to the varactor tuner of the TV at a selected frequency.

The binary tune word is incremented or decremented to provide an updated tune word in tuning the system by means of a microcomputer approach. The binary tune word is written and read from the non-volatile memory by the same microcomputer system.

The 14-bit binary tune word is updated either by external user control or AFC tuning. In either mode of operation, the tune word is incremented or decremented within a minimum and maximum binary tune word that is stored in a ROM memory matrix. In addition, increment values and tuning time limits are also stored in the ROM memory matrix. An arithmetic logic unit comprising a temporary storage RAM file, two 14-bit working registers, and a 1-bit full adder provide the means for performing the system's computations.

An 8-bit program counter provides the binary address of instructions in the 8 × 256 instruction ROM which addresses the PLA decode providing for an instruction generator. The PLA decode provides 26 "and" functions and 12 "or" functions. In addition, a 12 to 1 input logic status switch provides the necessary status indication for the 12 external controls. These input signals are detected by a 1-bit status latch.

The system is partitioned into two major functions: the non-volatile memory and the digital to analog converter and control circuits. The channel addressing and varactor diode band selection is generated with a rotary switch assembly. While a rotary switch assembly was used to implement the embodiment, non-volatile memory designs have been generated for addressing and band selection and could be easily implemented. The tune voltage interface between the digital to analog converter and the varactor diodes use standard oscillator and amplifier buffer circuits to provide the AFC summing and UHF tuning functions.

BRIEF DESCRIPTION OF THE DRAWINGS

The novel features believed characteristic of the invention are set forth in the appended claims. The invention itself, however, as well as further objects and advantages thereof, will best be understood by reference to the following detailed description of an illustrated embodiment taken in conjunction with the accompanying drawings, in which:

FIG. 2, 2A–2B are detailed circuit diagrams of the input buffer registers in the data in/out circuit.

FIG. 3, 3A–3B are detailed circuit diagrams of the ROM constant file and its addressing circuitry.

FIG. 11A–11H are detailed architecture diagrams of the microcomputer system.

FIGS. 13, 13A–13L are detailed drawings of the instruction set algorithm for the non-volatile stationary memory tuning system.

DETAILED DESCRIPTION

Figure 1:
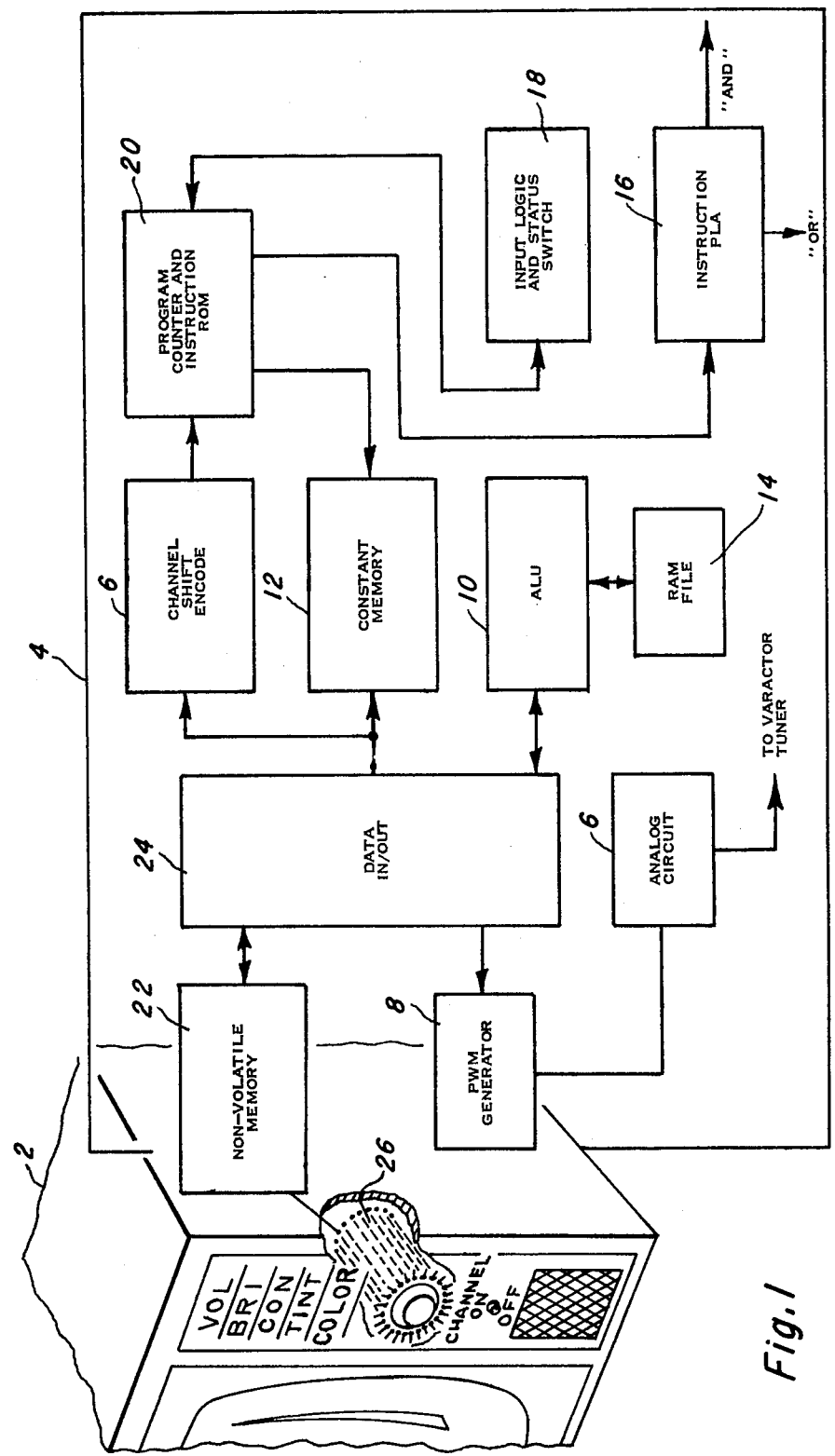
FIG. 1 is a functional blocked diagram employed to illustrate the present invention in a TV receiver.

A more complete understanding of the detailed embodiment will be understood by a brief description of the requirements of the system. The fine tune up or down is accomplished by a rocker switch with center off position. A closed position on the switch will increment the tune voltage at the rate of 2 to 8 steps per second. The fine tune control is operative on VHF and UHF tuning modes.

UHF programming is accomplished by pushing a potentiometer control knob and turning the knob pointer to the desired channel number. When the knob is pushed, a contact is switched to ground. The knob is spring loaded in the out position and cannot be turned unless pushed in. The UHF programming potentiometer has approximately 30 turns. The user is able to fine tune a UHF station with this potentiometer and also with a fine tune rocker switch. The UHF fine tune limit is said to be plus or minus 128 steps from the binary word stored in the non-volatile memory RAM matrix only when the fine tune rocker switch is used. If the user continues to hold the rocker switch in the same mode after 128 steps, the tune voltage reverses direction and increments in the other direction for 256 steps until it hits the other limit where it reverses direction again.

Storage and memory requires approximately 240 milliseconds. The binary tune voltage word and skip signal is stored when the set is turned off. If any tuning control for the channel skip button has been engaged while addressing the channel, the tune voltage and skip will also be stored in the memory when a channel change occurs.

An interchannel AFC defeat pulse occurs between each adjacent channel position. The pulse occurs when a switch contact is momentarily shorted to ground. The duty cyle of the pulse is approximately constant versus the rate of rotation of the channel select knob. The duty cycle is about 25% contact closed and 75% contact open. The binary input address is sampled and latched at the end of a write time or 48–68 milliseconds after receipt of the last interchannel pulse, whichever occurs last. A user programmable skip channel signal output is utilized. The operator uses a pushbutton to change the state of the signal.

The system has been designed for a 20 channel capacity. This includes 12 dedicated VHF channels plus 8 undedicated UHF channels. In VHF mode, a ROM plus nonvolatile RAM approach is used to limit fine tuning. The ROM plus RAM make up a 14-bit tuning word plus a 1-bit skip flag. The RAM is 8-bits tuning word plus skip flag. The system is designed such that the LSB of the 8-bit tuning word can be reprogrammed for each VHF channel to occur anywhere from the LSB position to the 7th bit of the 14-bit tuning word. In the UHF mode the RAM shall be 14-bits for the tuning word plus 1 bit for skip flag.

Figure 11A:
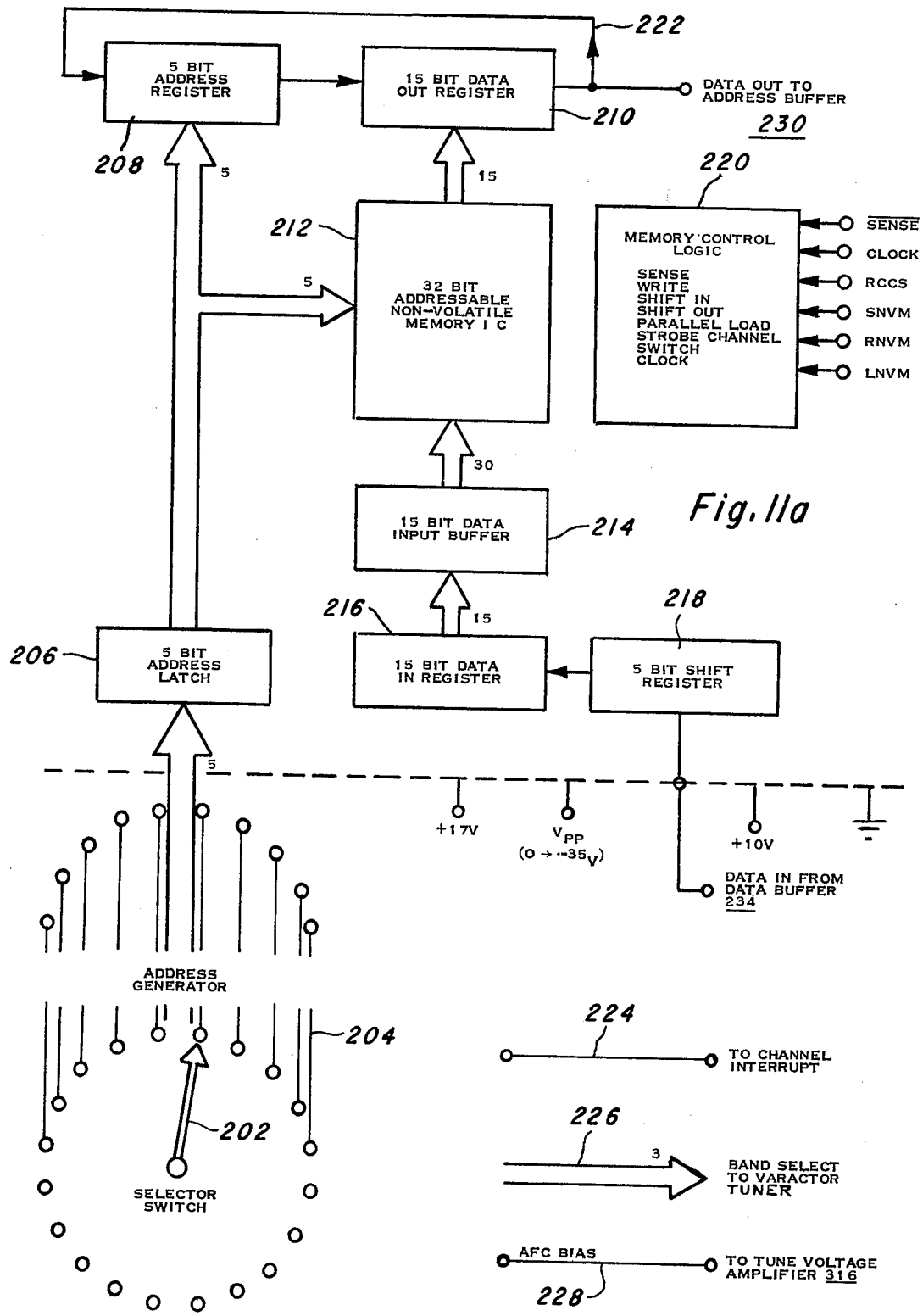

Referring now to the block flow diagram of FIG. 1, the TV tuning microcomputer approach flow diagram is indicated. The television receiver 2 has a selector switch 26 for generating an address for the non-volatile memory matrix contained in the microprocessor circuitry 4. A more detailed block diagram of the non-volatile memory architecture and address architecture is indicated in FIG. 11A. In one embodiment the non-volatile memory comprises a DIFMOS memory matrix (dual injection floating gate metal oxide semiconductor). Data retention without power is achieved by storing charge on an array of floating gates. Any floating gate in the memory array can be charged or discharged by the injection of electrons or holes from an avalanche plasma formed in two special injector structures within each bit. Once a floating gate has been charged, it will stay charged almost forever, unless it is intentionally discharged by reprogramming. The decay rate of a charge from a floating gate has been measured at less than 1% of the initial value per decade of time at 85° C. In the embodiment described the Texas Instruments X-929A decoded 32 bit non-volatile RAM semiconductor memory is used. However, other non-volatile memories may additionally be used in the present invention.

Digital tune words corresponding to the UHF and VHF channels are read from the memory and written into the memory by way of the data in/out circuitry. The data in/out circuitry contains temporary storage registers for the 5 bit channel address, the 1 bit skip toggle indicator, and the 14 bit tune word. The tune word is loaded into the PWM comparator where a PWM counter and PWM generator produce digital output signals proportional to the binary tune word.

These digital output signals are fed to an analog circuit comprising an op-amp for the conversion to the analog voltage required to be applied to the varactor tuner of the television for tuning at the selected channel.

The channel shift encode is provided to normalize the 5 bit weighting of the increment value for selected VHF channels. The normalized binary word is applied to the micro-program counter to provide shift controls to the various shift registers of the tuning circuitry in the VHF mode.

Input commands by the user is read into the system by means of the input logic and status latch. This provides a means of detecting a change of state on the input switches during a tuning function so that the system may be changed to the latest input command. The change of state is detected by a status latch which loads a new address of the instruction ROM into the program counter.

The program counter provides any one of 256 instruction addresses of the instruction ROM. The instruction ROM addresses the constant memory matrix which contains the upper and lower limits for the VHF and UHF channels, increment values for both VHF and UHF tuning, time increments, write time, and maximum times. In addition, the instruction ROM addresses the instruction PLA which contains decoding for 26 "and" functions and 12 "or" functions.

The ROM constant memory matrix transfers the data to the arithmetic logic unit which contains 2 working registers, a 1 bit full adder and a RAM temporary storage file. The arithmetic logic unit provides for the operation of incrementing and decrementing tune words, providing for write times, and time out functions. The new binary tune word from the arithmetic logic unit is loaded into the data in/out circuitry or read from it. In all aspects of the operation of the present invention, the binary tune word corresponding to the individually selected channel in both the VHF and UHF mode are stored in the non-volatile RAM memory matrix for addressing upon channel selection.

Figure 2:
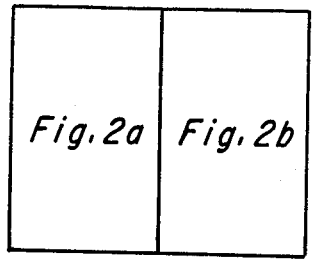
Figure 2A:
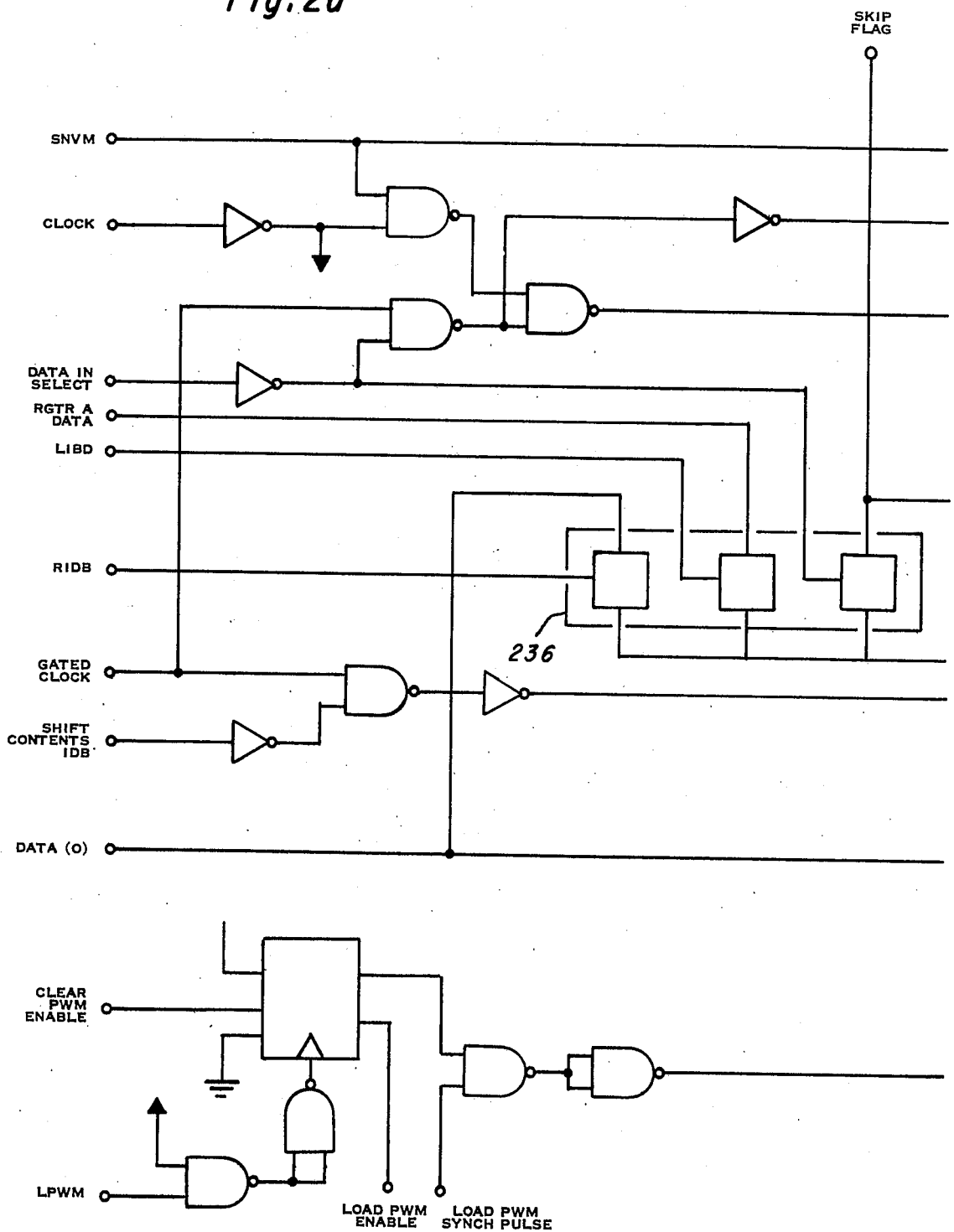

Referring now to FIGS. 2A–2B the data in/out circuitry comprising the input buffer registers is indicated in greater detail. A 5 bit address buffer serial register 230 is provided in addition to 2 D flip flops 232 and 254. A 3 to 1 enocde 236 is provided for transmitting of data to the 14 bit input data buffer serial register 234A–234B. Data stored in the input data buffer is parallel loaded into the 14 bit data latch serial register 238A–238B the output of which is parallel loaded into a 14 bit pulse width modulated logic latch serial register. The D flip flop 232 provides as a 1 bit skip toggle buffer for the MSB of the tune word.

Figure 3:
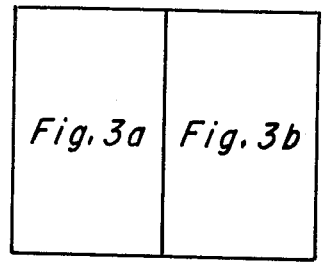
Figure 5:
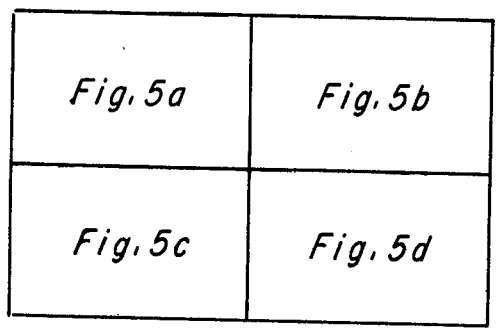
FIG. 5, 5A–5D are detailed circuit diagrams of the instruction ROM, program counter, and microprogram counter.
Figure 6:
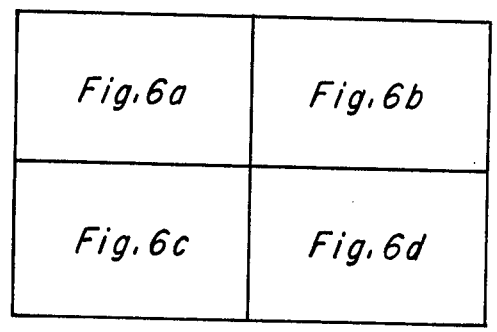
FIG. 6, 6A–6D are detailed circuit diagrams of the instruction PLA.
Figure 7:
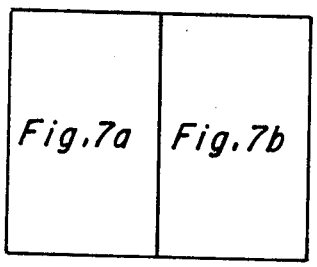
FIG. 7, 7A–7B are detailed circuit diagrams of the input logic status switch.
Figure 8:
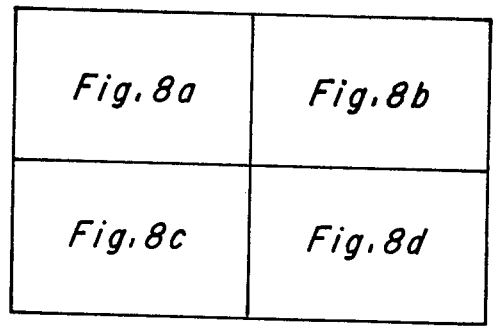
FIG. 8, 8A–8D are detailed circuit diagrams of the arithmetic logic unit.
Figure 3A:
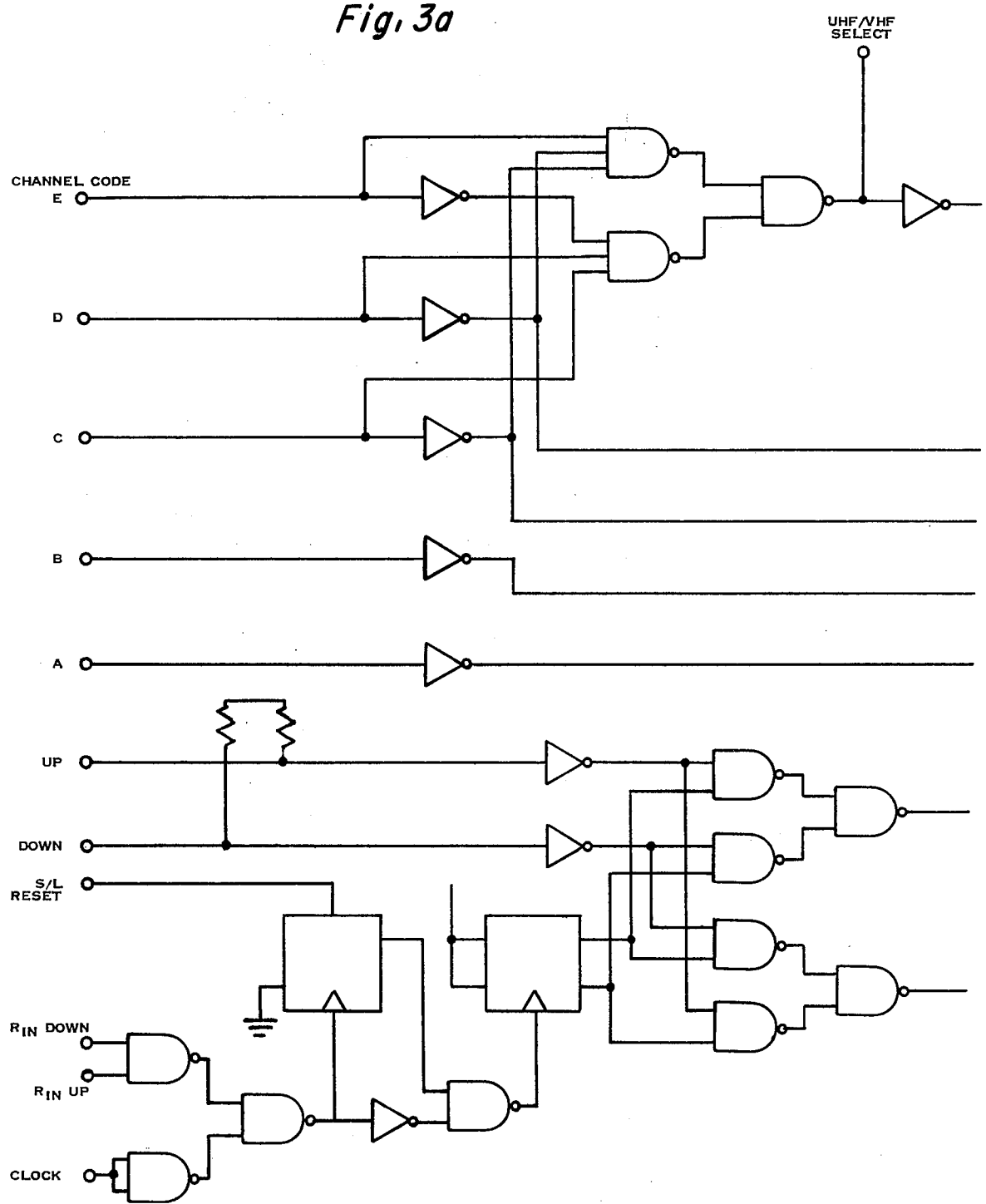

A more detailed circuit diagram of the address decode and ROM constant file is indicated in FIGS. 3A–3B. Five bits from the address generator and 4 bits from the instruction ROM are decoded to address the 32 by 14 bit ROM constant file 264A–264B. The output of the ROM constant file is loaded into a 14 bit B working register.

Figure 4:
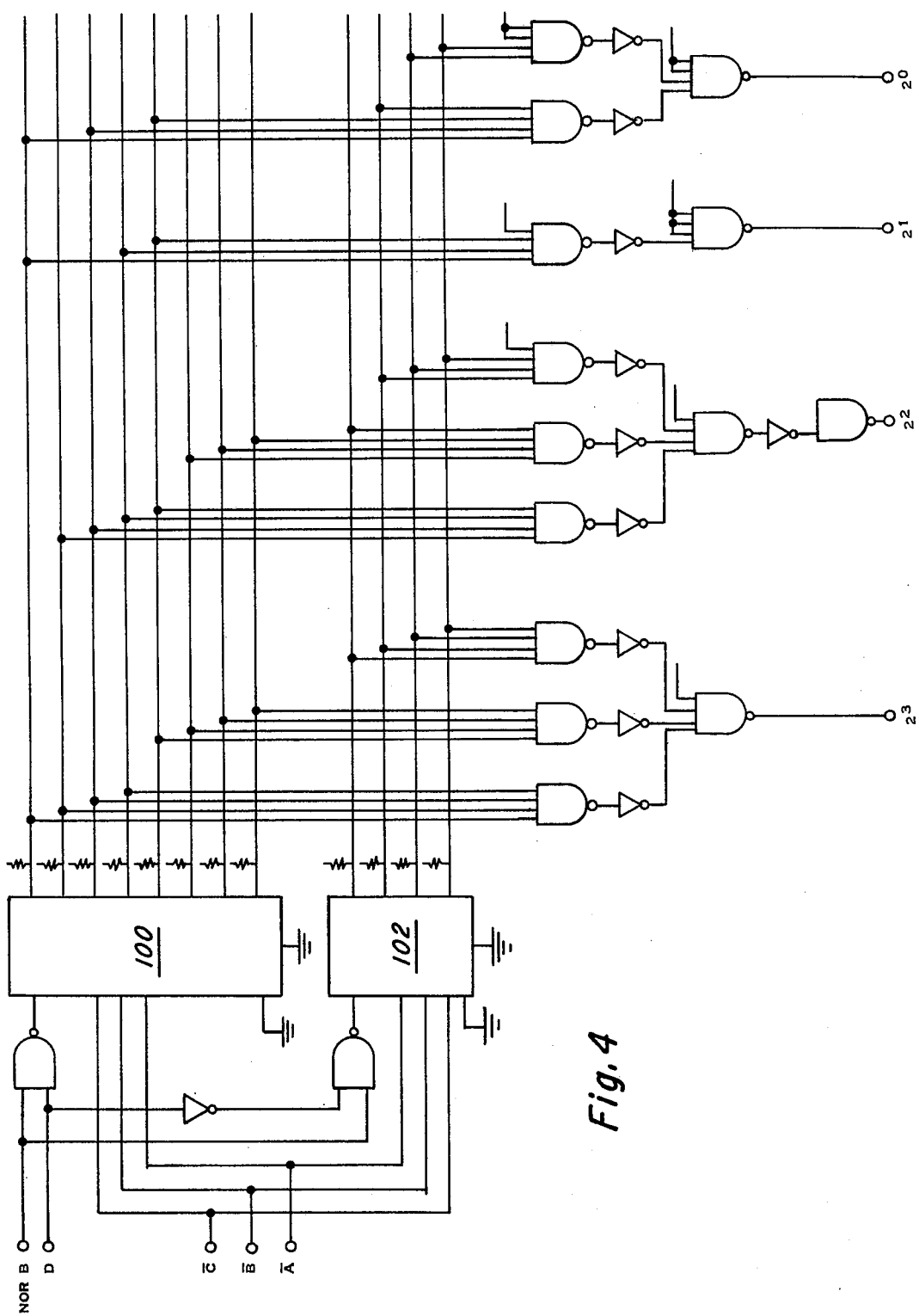
FIG. 4 is a detailed circuit diagram of the automatic channel shift encode.
Figure 5A:
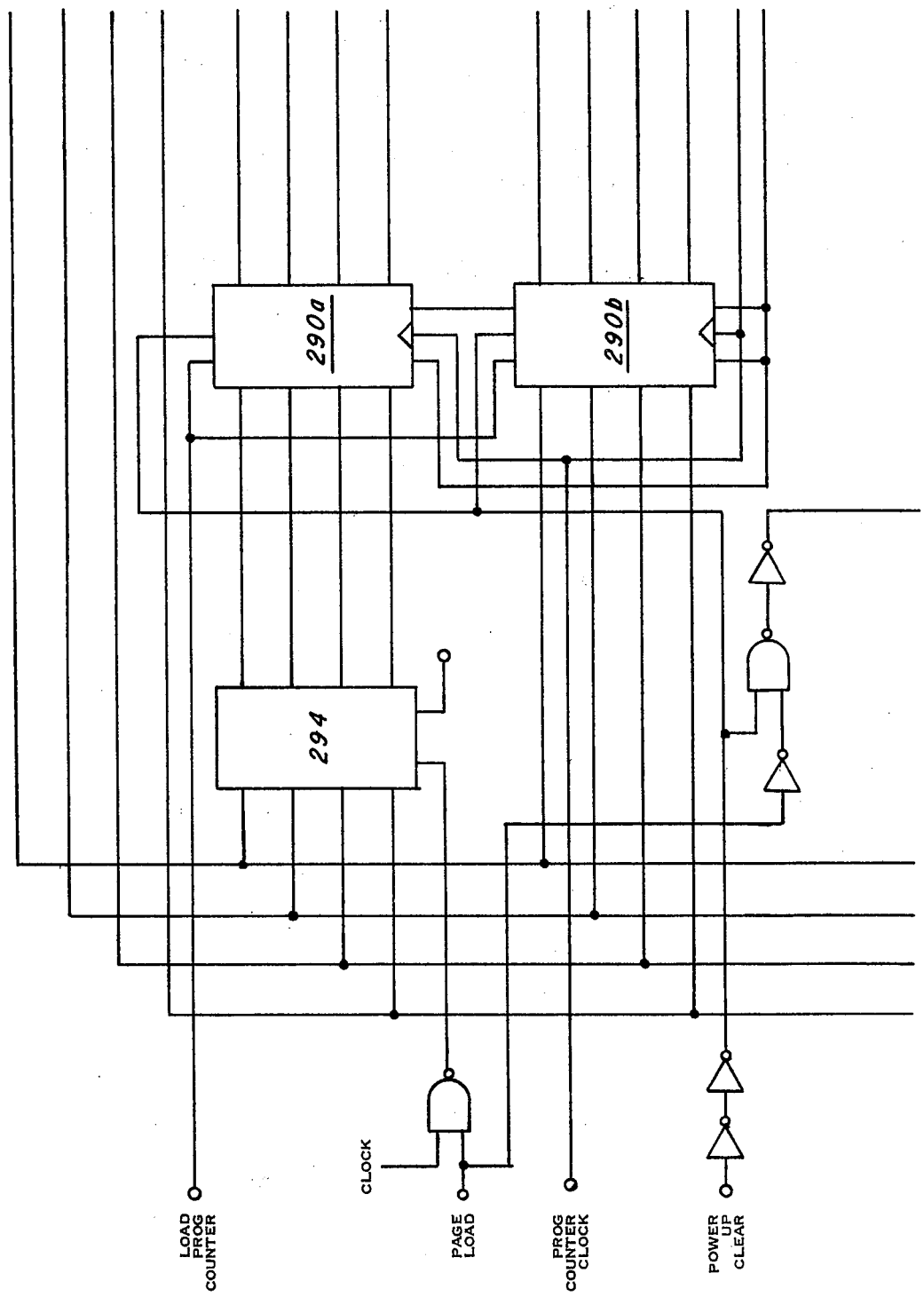
Figure 5B:
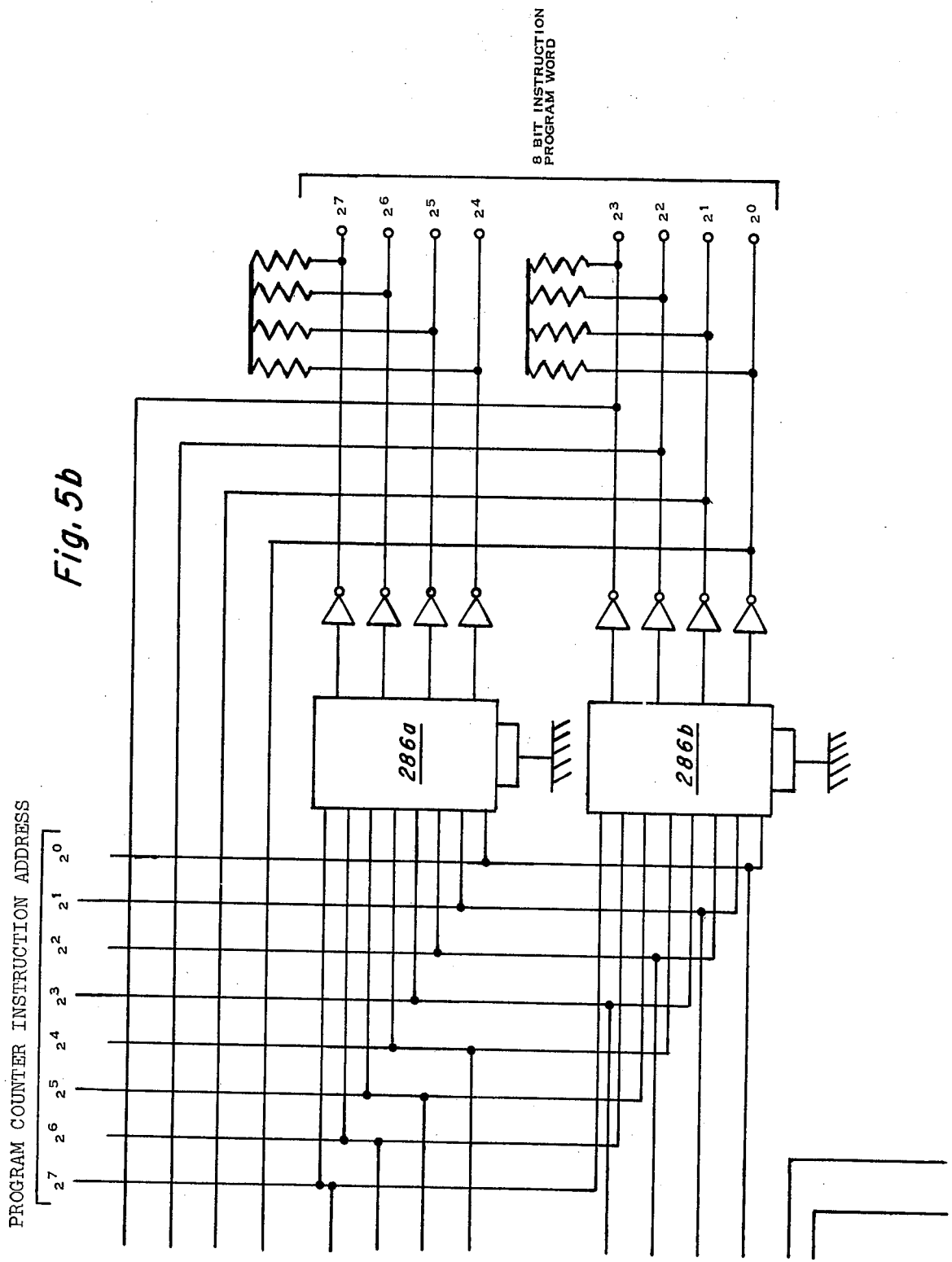
Figure 5C:
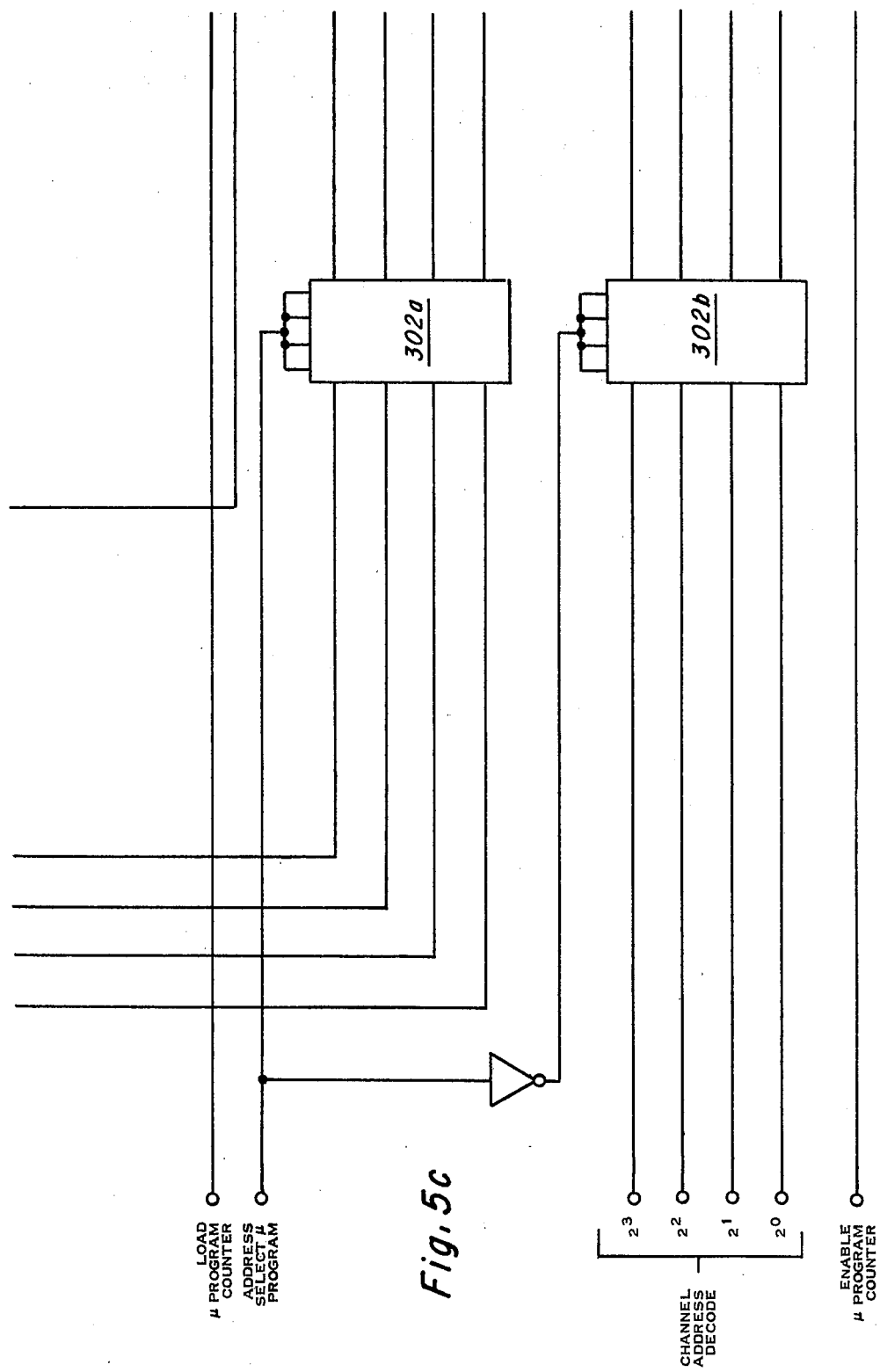
Figure 5D:
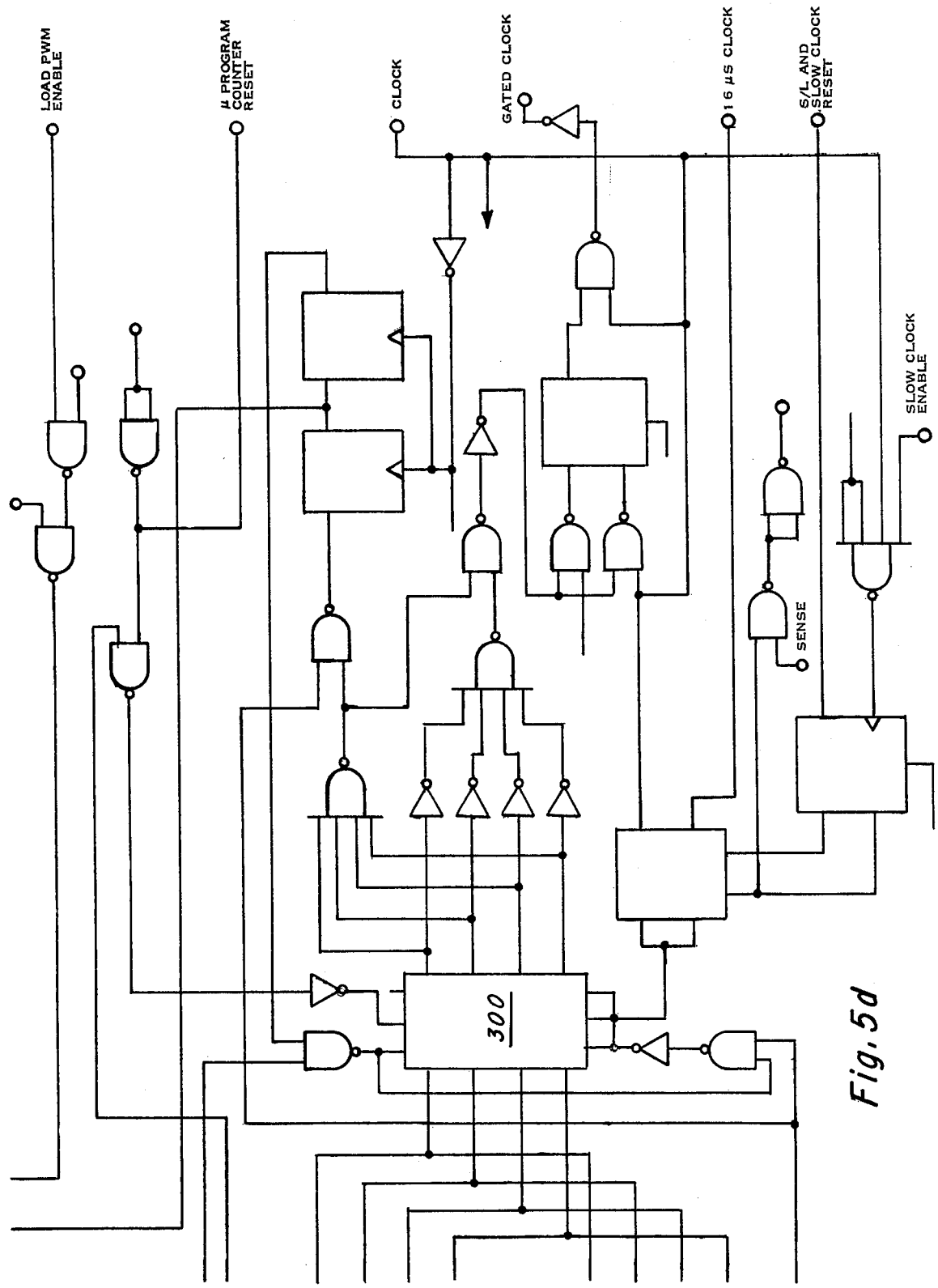

The automatic channel shift encode for normalization in VHF tuning is indicated in greater detail by the circuit diagram in FIG. 4. The 4 LSB's of output is applied to an encode of the microprogram counter. Two serial shift registers 100 and 102 are provided for transfer of data in the decode operation.

The instruction ROM, program counter, and microprogram counter circuitry are indicated in greater detail in FIGS. 5A–5D. The 8 by 256 bit instruction ROM 286A–286B is addressed by the 8 bit program counter 290A–290B. The 8 bit program counter is divided into two serial registers comprising 4 MSB's and 4 LSB's. The LSB's are loaded directly from the 8 bit instruction program word from the instruction ROM. The 4 MSB's are loaded into the program counter by means of the 4 bit page latch 294. In addition, 6 bits of the instruction program word are applied to a PLA decode and 4 LSB's of the instruction program word are applied to a 9 by 32 address decode of a ROM constant file. The 8 to 4 encode 302A and 302B in addressed by 4 LSB's from the 8 bit instruction word and 4 bits from an automatic channel shift encode. These 8 bits are encoded to 4 bits which addresses the 4 bit microprogram counter 400. Also, the 4 LSB's from the instruction ROM addresses a 4 to 12 decode for an input logic status switch. Two of the 4 LSB's addresses a 2 to 4 decode of a temporary storage RAM file in the arithmetic logic unit.

Figure 6A:
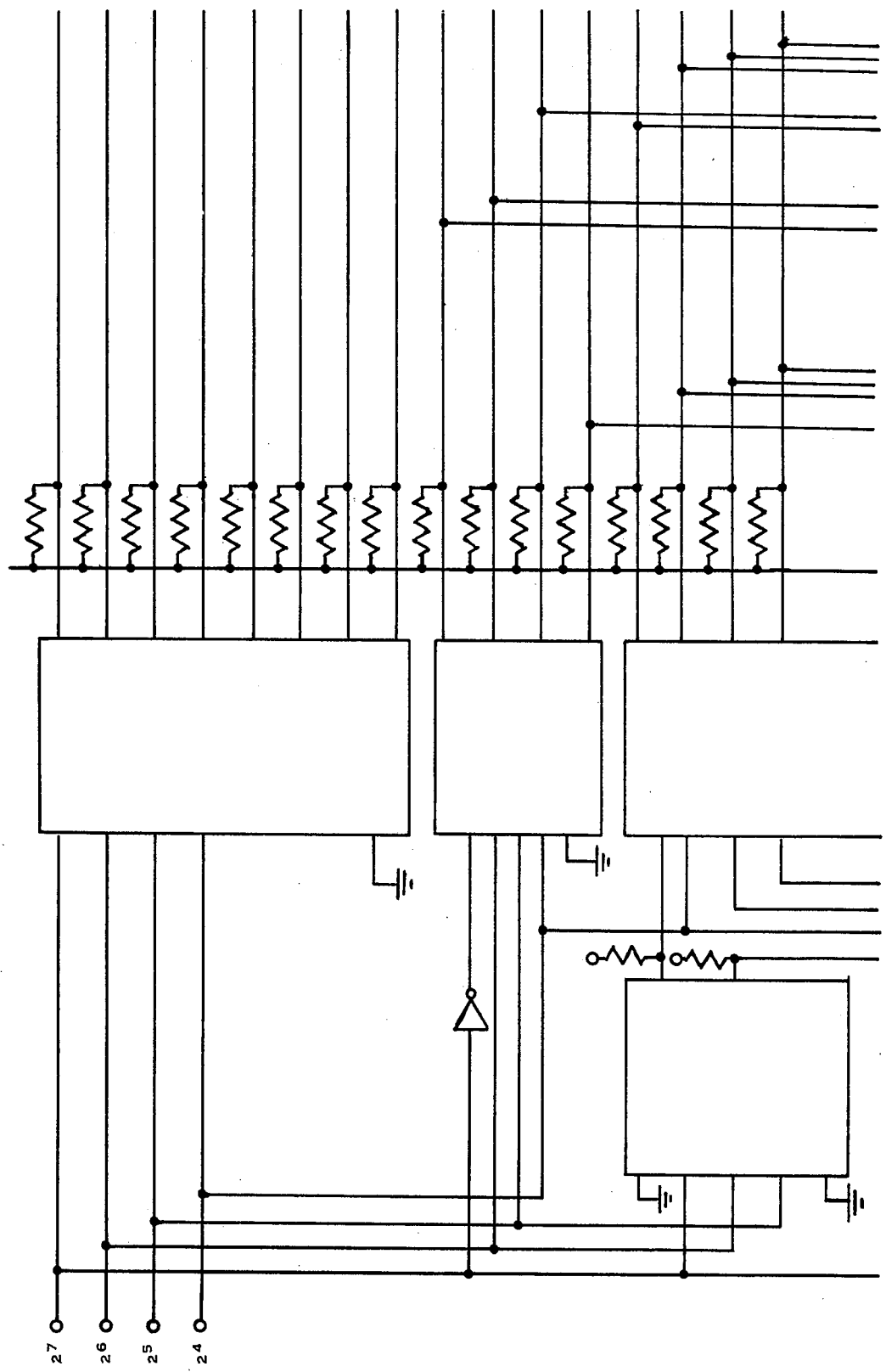
Figure 6B:
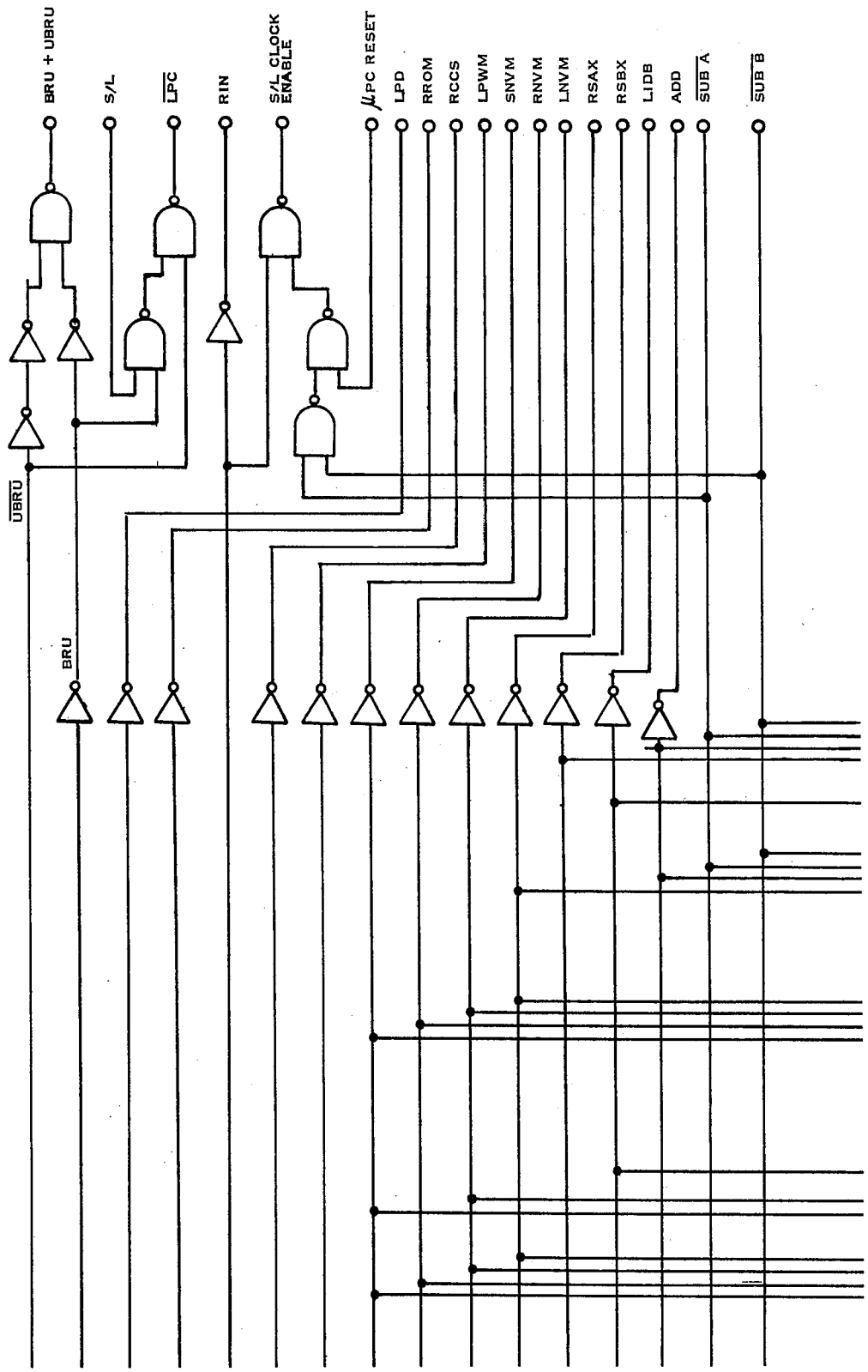
Figure 6C:
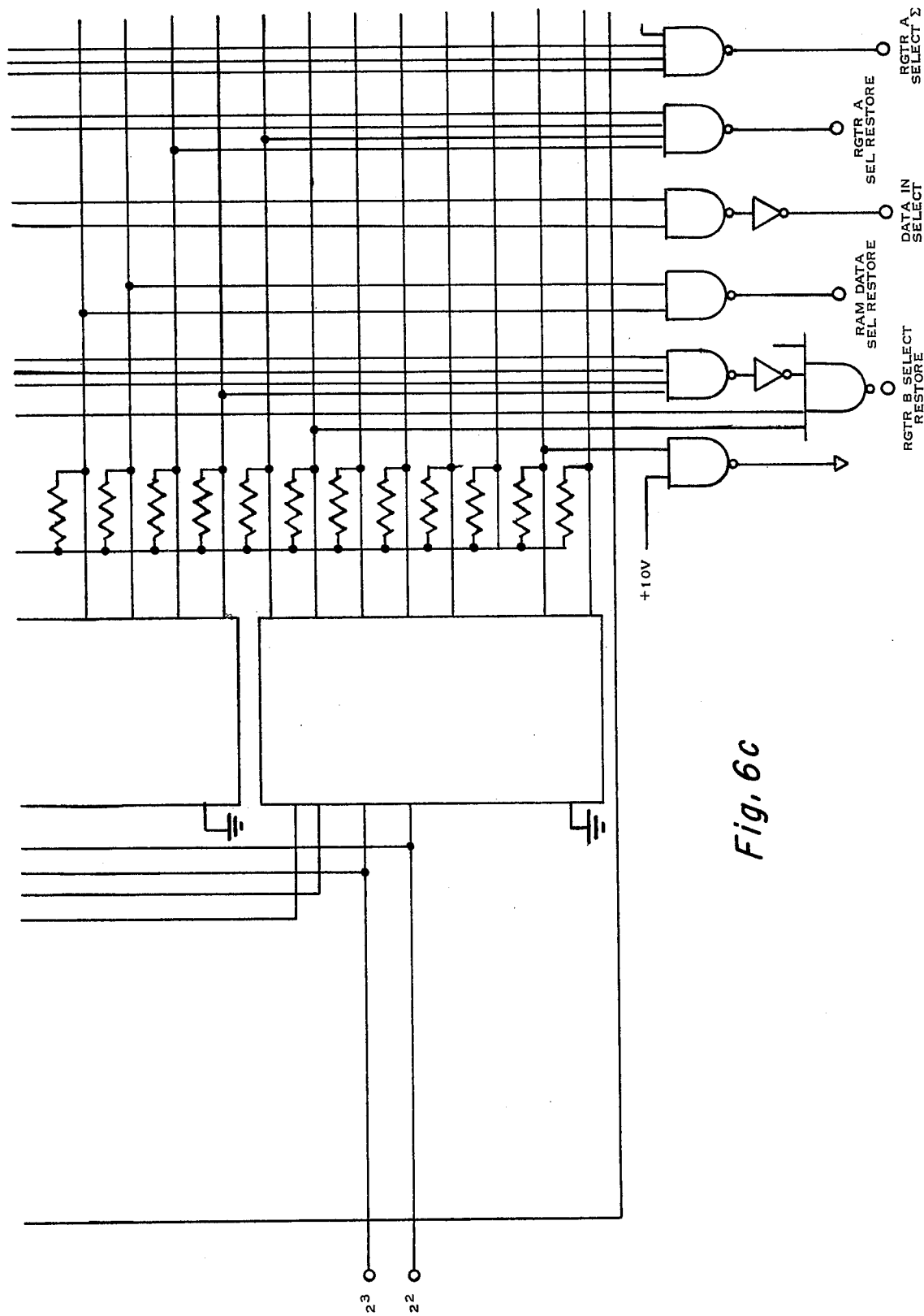
Figure 6D:
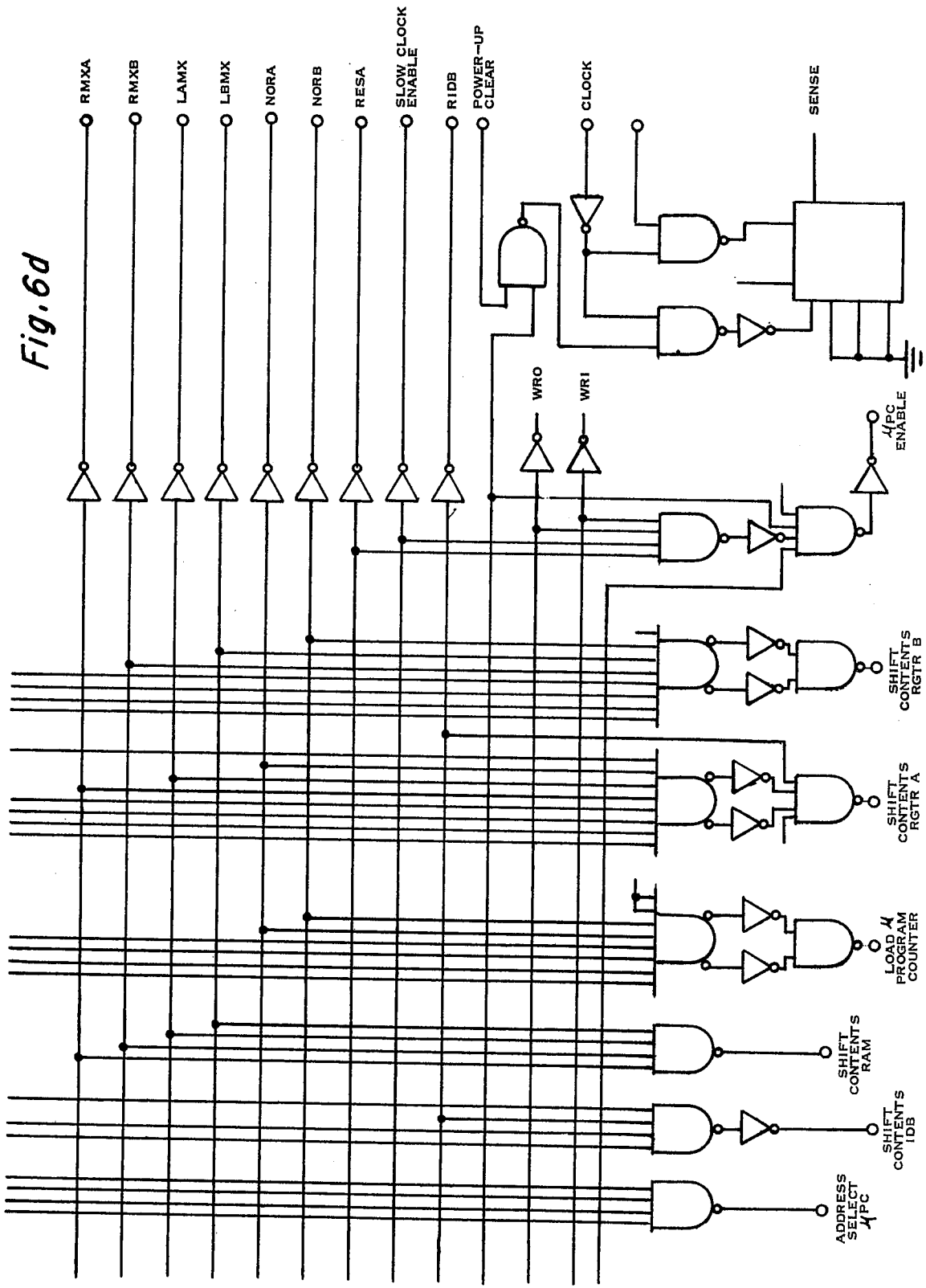

FIGS. 6A–6B is a more detailed circuit diagram of the instruction PLA. Six bits of address from the instruction ROM are used to address the 6 by 28 by 12 bit PLA decode. The output of the PLA comprise 26 "and" functions and 12 "or" functions.

Figure 7A:
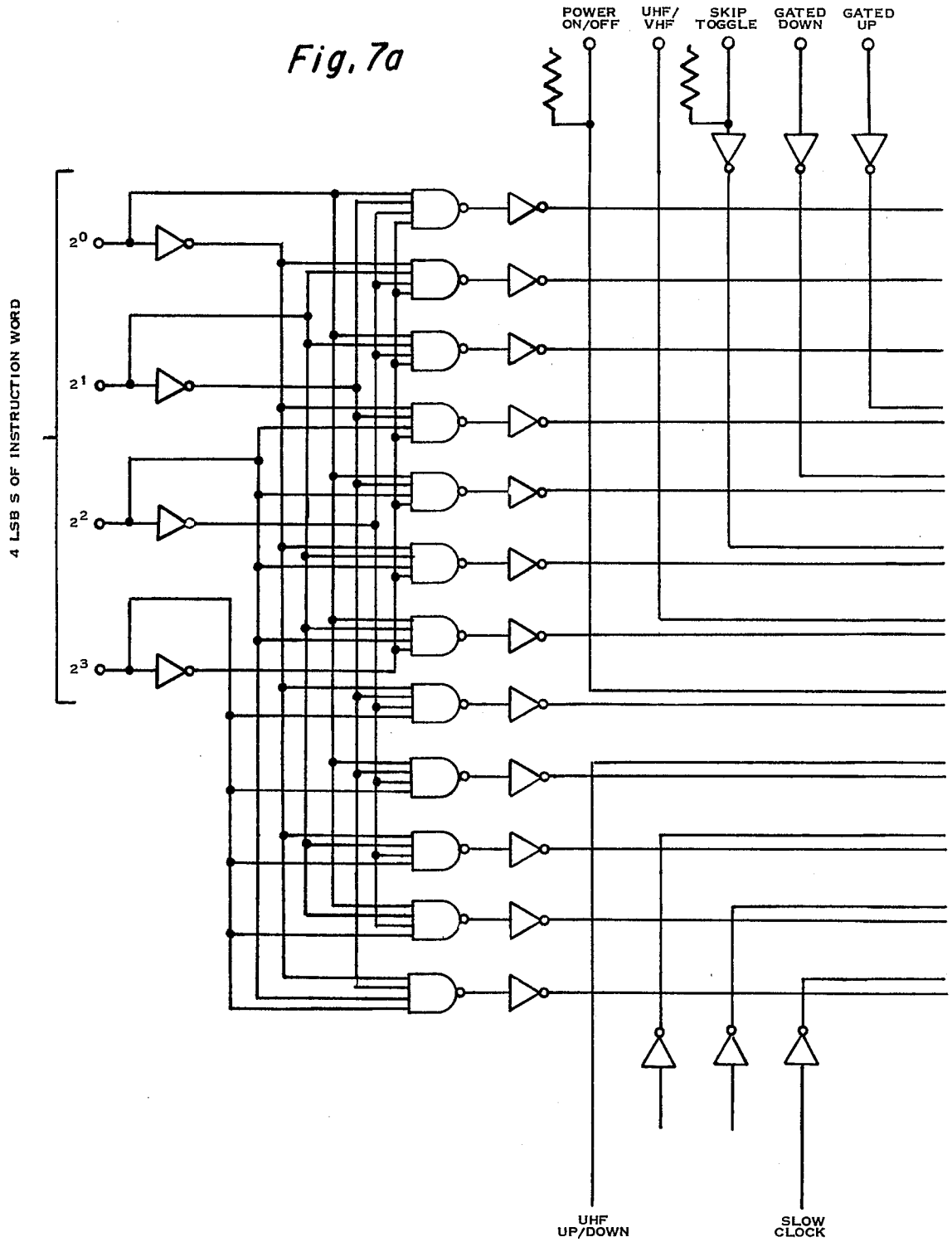
Figure 7B:
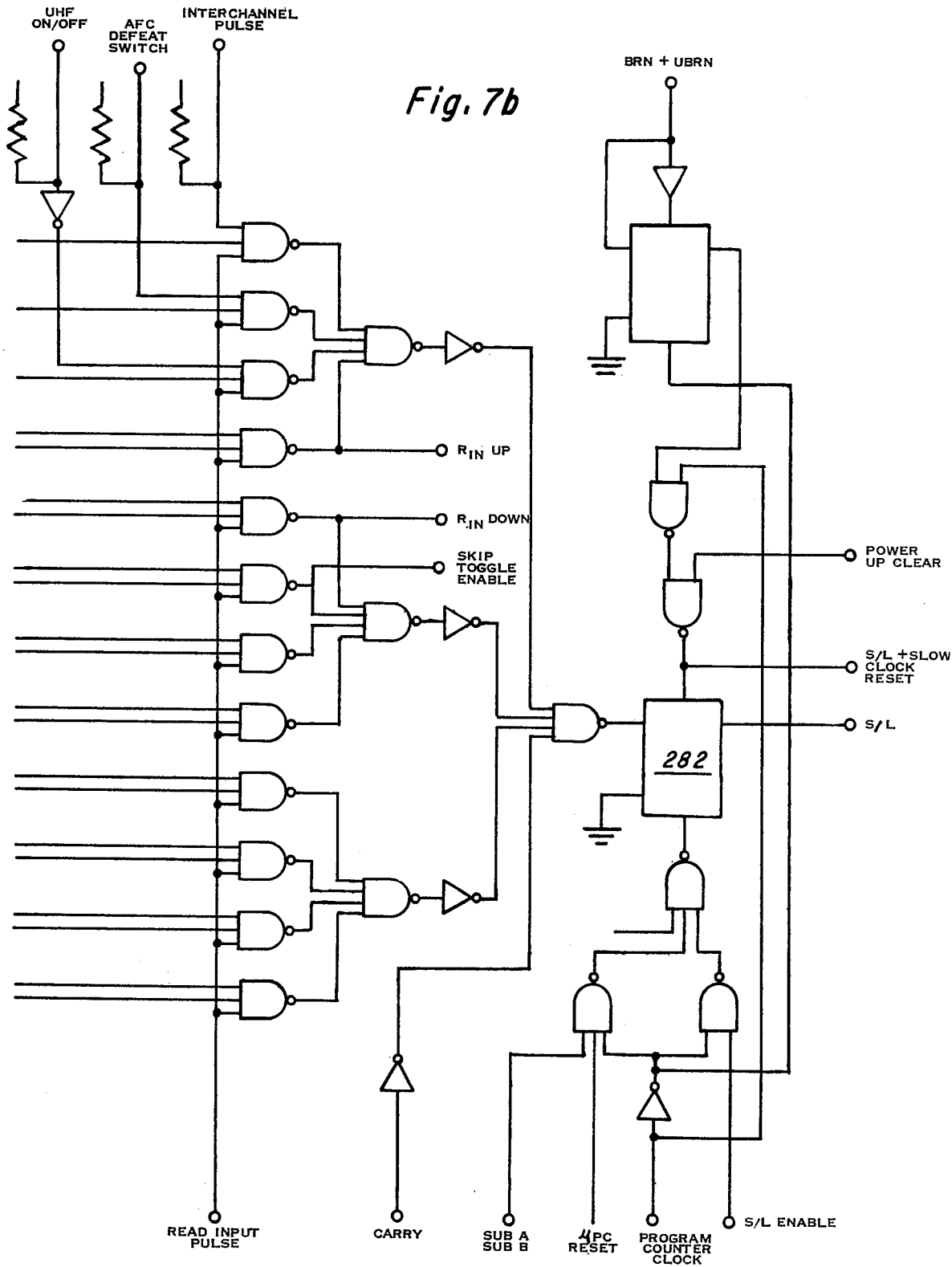
Figure 8A:
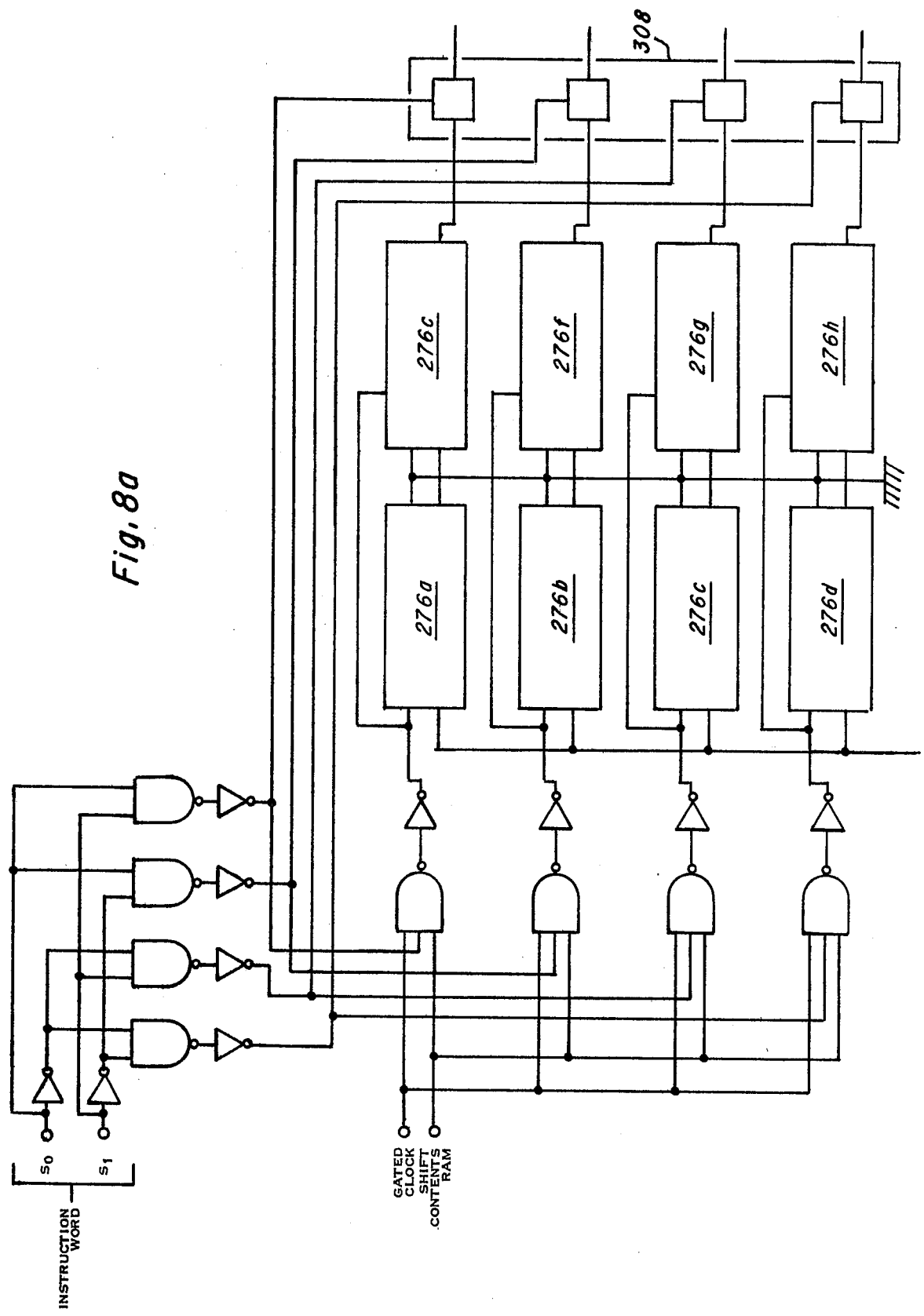
Figure 8B:
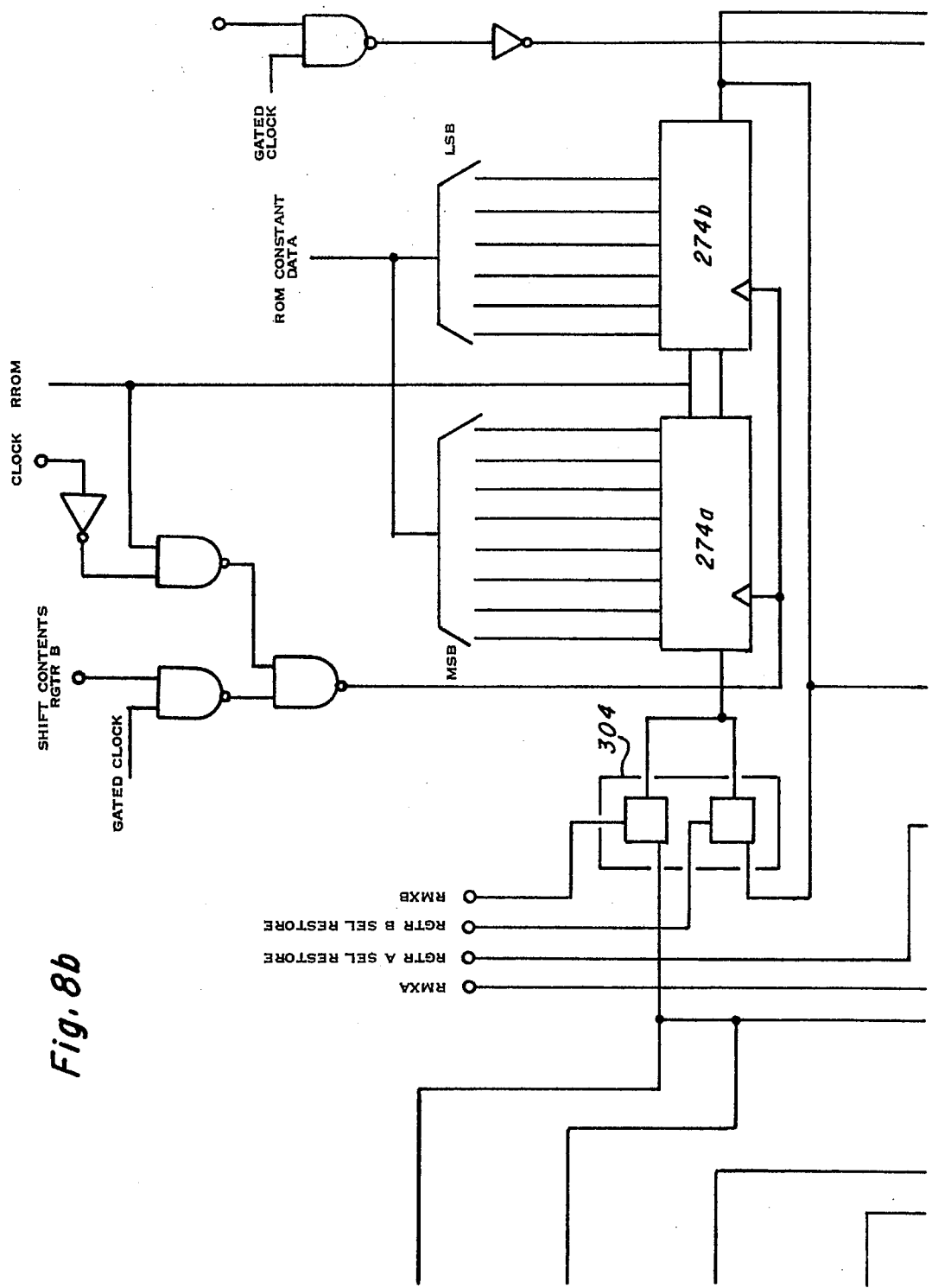
Figure 8C:
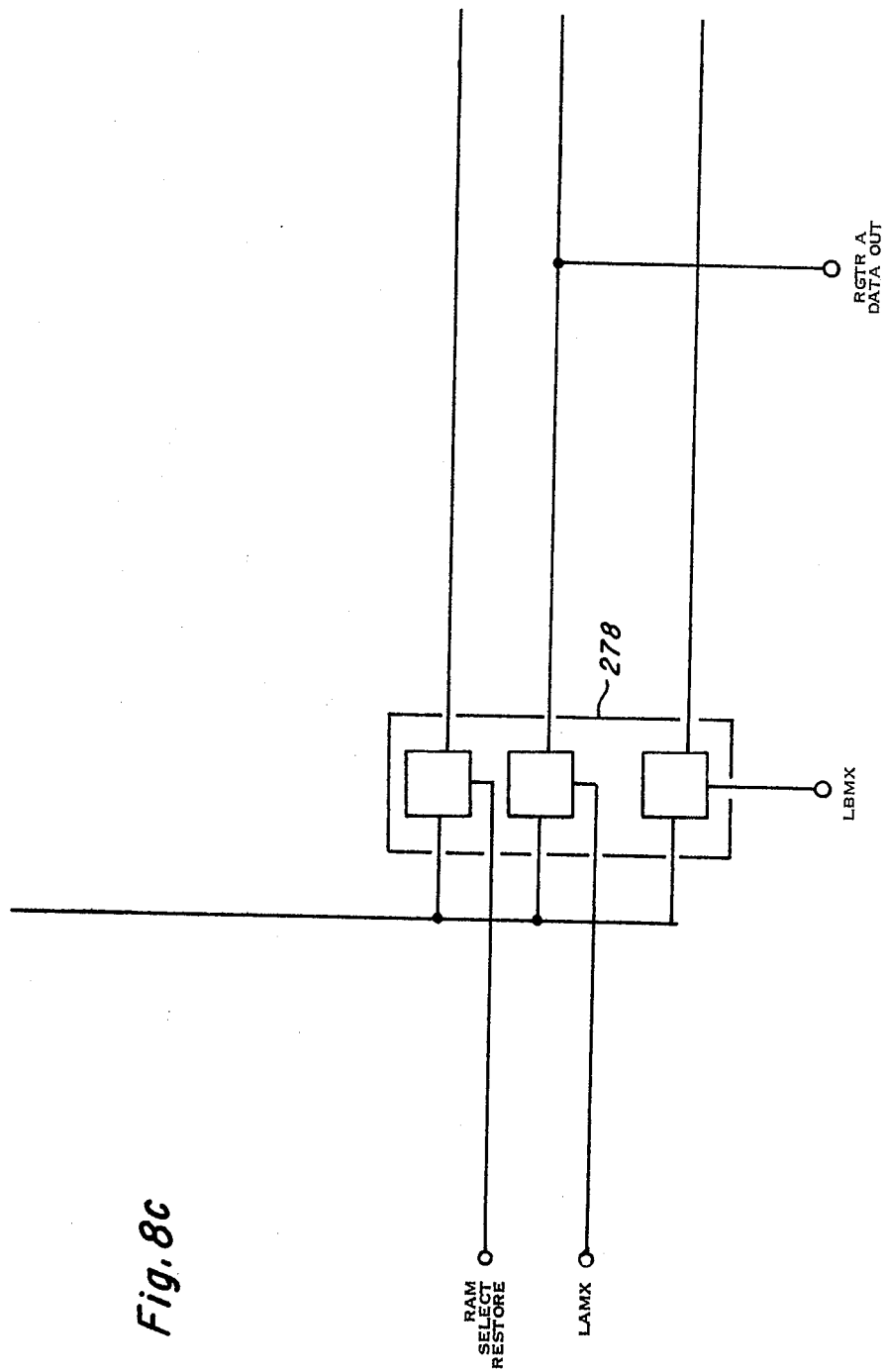
Figure 8D:
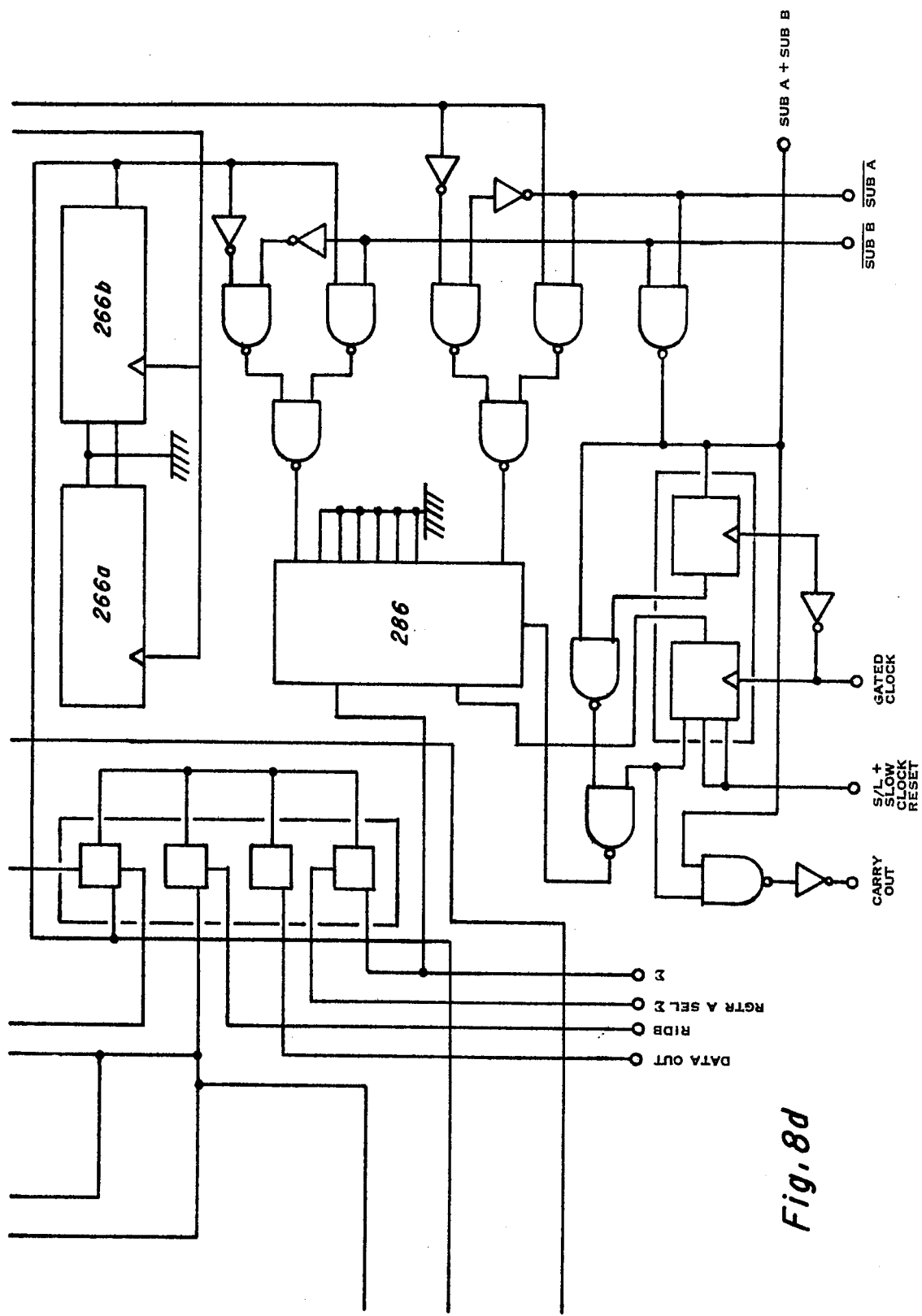
Figure 10:
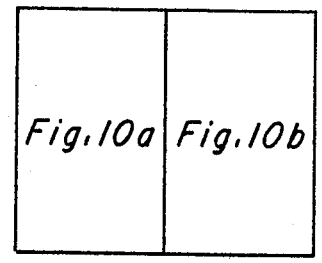
FIG. 10, 10A–10B are detailed circuit diagrams of the analog circuitry.
Figure 13:
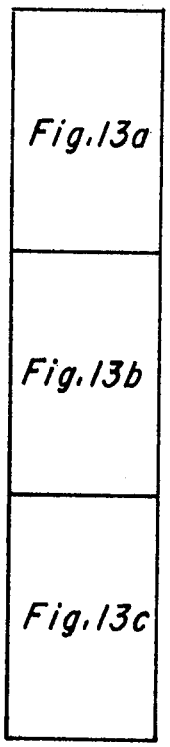
Figure 13:
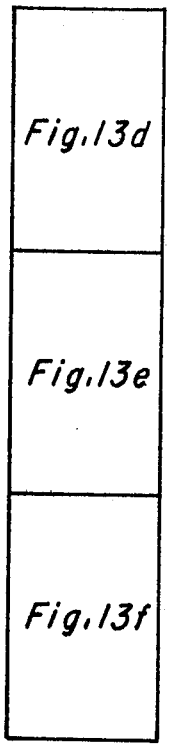
Figure 13:
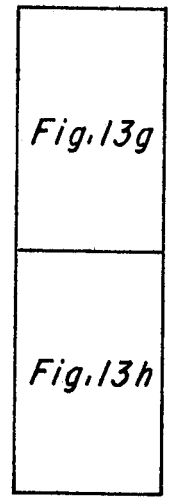
Figure 13:
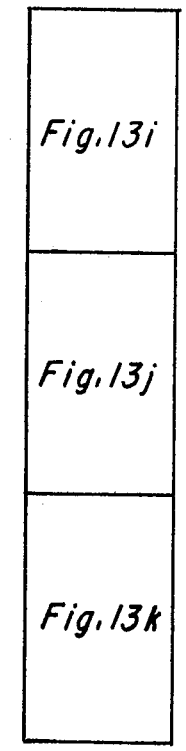
Figure 13:
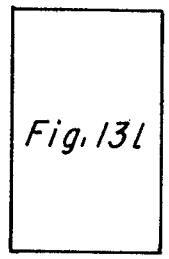

FIGS. 7A–7B is a more detailed circuit diagram of the input logic status switch. The 12 inputs to the status switch are read by decoding 4 LSB's of instruction word from an instruction ROM. An indication of a match between the decode and the 1 of 12 inputs is indicated by the setting of a status latch 282. This status latch is loaded to the one state in the presence of any of the 12 input functions and a matching code.

FIGS. 8A–8D are a more detailed circuit diagram of the arithmetic logic unit and temporary storage RAM file. The 14 bit word from a ROM constant file is parallel loaded into the 14 bit B working serial register 274A–274B. A 4 by 14 bit temporary storage RAM file 276A–276H is provided for temporary storage of the data from the ROM constant file and working registers. The temporary storage RAM file has four memory locations that are selected by the 4 to 1 decode 308. Access to working register B is by means of a 2 to 1 encode 304 and access to the 14 bit A working shift register 266A–266B is by means of the 4 to 1 encode 270. The temporary storage RAM file is accessed by means of the 3 to 1 encode 278. A 1 bit full adder 288 is provided for addition and subtraction of the A and B working registers. Two LSB's of instruction word are used to address the temporary storage RAM file.

Figure 9:
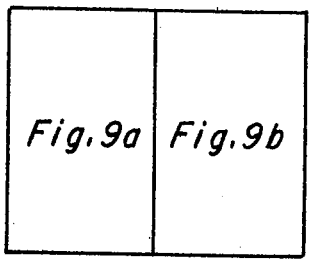
FIG. 9, 9A–9B are detailed circuit diagrams of the PWM generator.
Figure 9A:
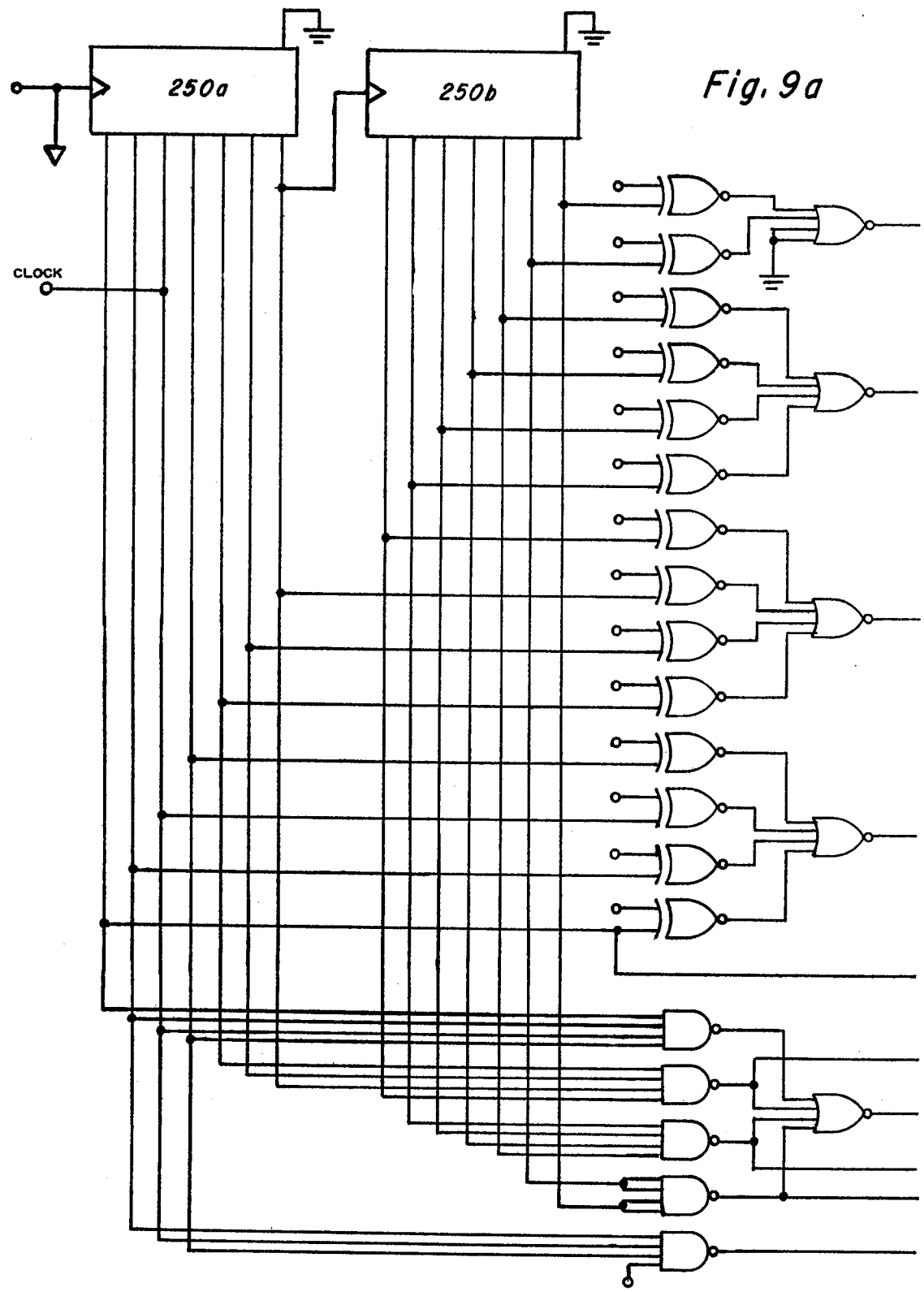
Figure 9B:
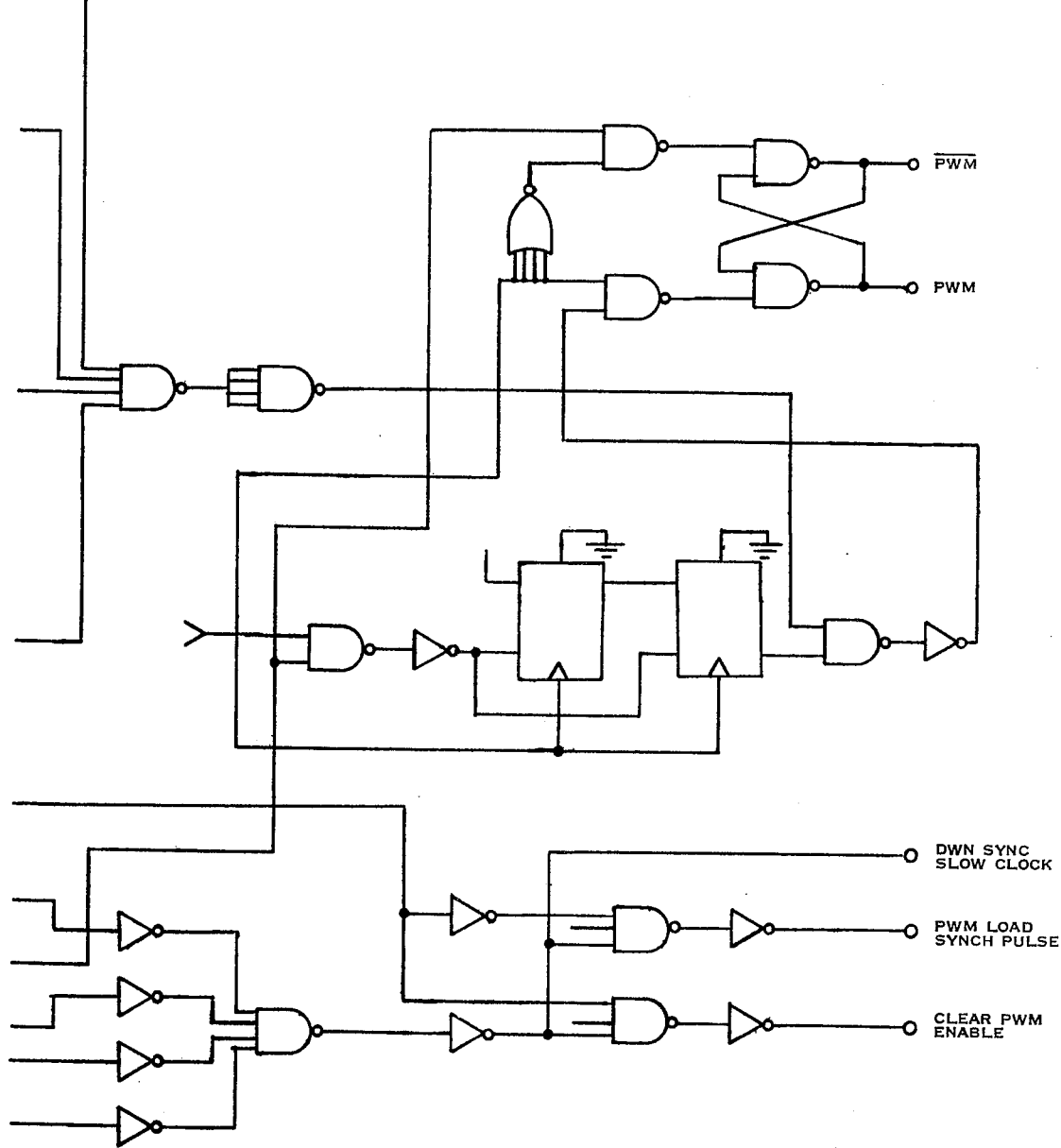

FIGS. 9A–9B is a more detailed circuit diagram of the pulse width modulator (PWM) generator. A $2^{14}$ PWM counter 250A–250B is provided. The binary word output is parallel loaded into a 14 bit PWM logic latch. When the 14 bit binary word from the PWM counter matches the 14 bit tune word stored in the 14 bit data latch the PWM logic latch is tripped and the PWM digital output is generated.

Figure 10A:
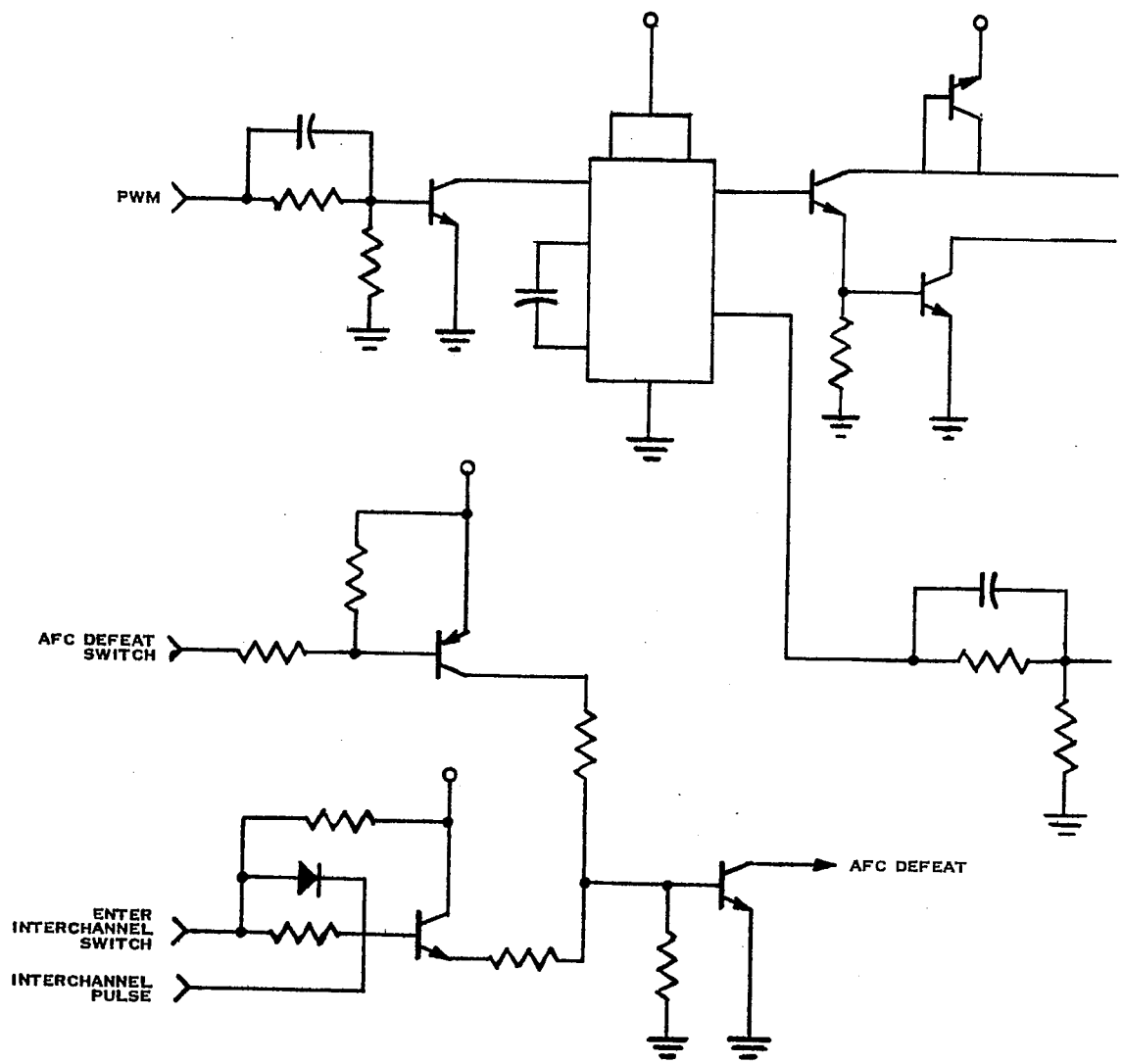
Figure 10B:
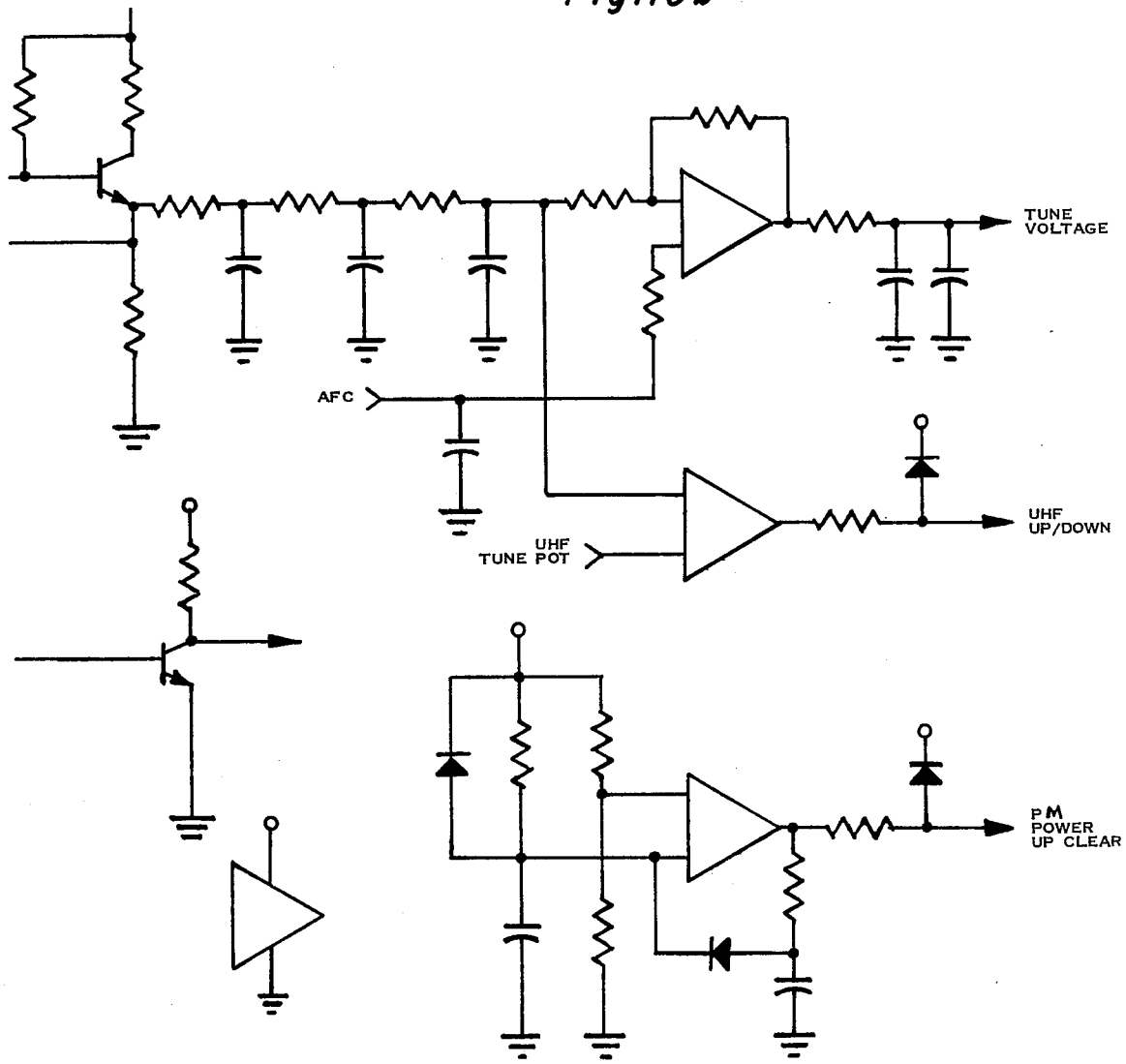

FIGS. 10A–10B are a more detailed circuit diagram of the analog circuit for converting the digital output of the PWM generator to an analog voltage to be applied to the varactor tuner of the television. In addition, circuits for PWM power up clear, AFC defeat, interchannel pulse, and UHF up/down circuitry are provided.

Referring now to the system diagram of FIGS. 11A–11H, the TV tuning microprocessor architecture is indicated in greater detail than the block diagram of FIG. 1. The 5 bit binary channel address is read off the 20 position selector switch 202 by means of the address generator 204 in FIG. 11A. The binary address corresponds to any one of 20 channels, 12 of which are VHF channels and 8 of which are UHF channels. In addition to the channel addressing the selector switch has means for channel interrupt selection 224, means to select the varactor band of the TV tuner 226, and means to program AFC bias on and off 228. The channel address is read directly into the 5 bit address latch 206 in the nonvolatile RAM circuitry. Information in the 5 bit address latch 206 is used to address the 32 bit addressable nonvolatile RAM matrix and also provides a parallel input into a 5 bit address shift register 208. The 5 bit address on a multibus line from the selector switch is used to address one of the 20 locations in the non-volatile memory circuitry used to retain the binary tune word. Provided in the memory circuitry are 12 VHF binary tune words and 8 UHF binary tune words.

In series with the shift register 208 is a 15 bit data out shift register 210. These two shift registers 208 and 210 are in a read mode when not programmed to shift out. Therefore they are always looking at and reading the address latch 206 and the 15 bits of the memory matrix 212. Fourteen bits of the non-volatile RAM matrix are used for representing the binary tune word and the 15th MSB is used for a skip toggle indicator. The 20 bits comprising 5 from the address register and 15 bits from the data out register are serially shifted out when we read the non-volatile memory 212. As the bits are serially shifted out they are also fed back into the stack in a serial manner by loop 222 so that the 5 bit address and the 15 bit data tune word are restored into the registers.

The address and data tune word as they are shifted out of the registers into the control chip are fed into a 20 bit input data buffer comprising a 5 fit address buffer 230, a 1 bit skip toggle buffer 232, and a 14 bit input data buffer register 234 indicated in FIG. 11B. The address buffer register 230 contains the last bits shifted out of the non-volatile memory block which comprises the 5 address bits. The 6th MSB is the skip toggle bit and resides in the skip toggle buffer register 232 immediately following the address buffer. The 14 bit data tune word is steered through a selector switch encode 236 into the 14 bit input data buffer register 234. The selector switch encode 236 has 3 select states comprising load input data buffer (LIDB), read non-volatile memory (RNVM), and read input data buffer (RIDB). The 14 bit tune word is loaded into the data buffer register 234 by selecting the read non-volatile memory mode of the selector switch encode 236.

The binary tune word in data buffer register 234 is loaded parallel into the 14 bit PWM logic latch 248 when there is a load PWM (LPWM) signal on the 14 bit data latch 238. The 14 bit tune word in the PWM logic latch 248 is used as a compare word for the 14 bit pulse width modulator counter 250. The pulse width modulator operates with a 1 MHz input clock from the PWM buffer and oscillator 252 that is fed into the $2^{14}$ PWM counter 250 and runs continuously.

The PWM counter 250 counts from binary 0 in a binary manner until it reaches one of two conditions. First, if the binary word of the counter 250 compares with the 14 bit tune word in the PWM logic latch 248 then the PWM logic latch which is performing a magnitude compare will provide an output signal and trip a flipflop which will then remain in that state until the counter completes its count-out cycle. The second condition is when the PWM logic latch 248 is at an all 1 state whereby the PWM counter would count up to an all 1 state that also corresponds to the runover point of the counter. Therefore, the PWM counter will always count up to $2^{14}$ and then run over where $2^{14}$ with a 1 MHz input corresponds to a writeout at 16 milliseconds.

In the PWM generator we therefore have a magnitude compare of the PWM counter with the 14 bit tune word stored in the 14 bit PWM logic latch 248 and when the first time there is a match of the counter and the binary magnitude we receive an output signal from the PWM logic latch 248 proportional to the tune word. To tune the television we alter the pulse width modulated signal from the PWM logic latch 248. We alter the pulse width modulated signal by changing the bit value of the binary tune word contained in the PWM logic latch thereby giving us a modulated pulse width at a duty cycle of 16 milliseconds.

The skip toggle bit in the skip toggle buffer register 232 may be altered by means of the skip toggle inputs through the MAND gate 256. In the program algorithm when the skip toggle is altered we read the information out and write it into memory once the function is complete. Altering of the skip toggle information is achieved by first reading the state of the skip toggle buffer 232 which contains an MSB that was read out of memory, loading that bit into a D register 254, and changing that information if we have a program input to change the state of the skip toggle. A skip toggle output 258 is provided to give an indication that the skip toggle has been altered and the present program condition of the skip toggle. The skip toggle is not applicable to a mechanical rotary type selector switch system as indicated in this embodiment whereas the selector switch 202 is of a rotary type. However, by replacing the rotary selector switch with an electronically addressable circuit as disclosed in U.S. Pat. No. 3,968,443 issued on July 6, 1976, assigned to Texas Instruments Incorporated, the same assignee of the present patent application, then a skip function would be applicable in the present tuning circuitry.

Figure 11C:
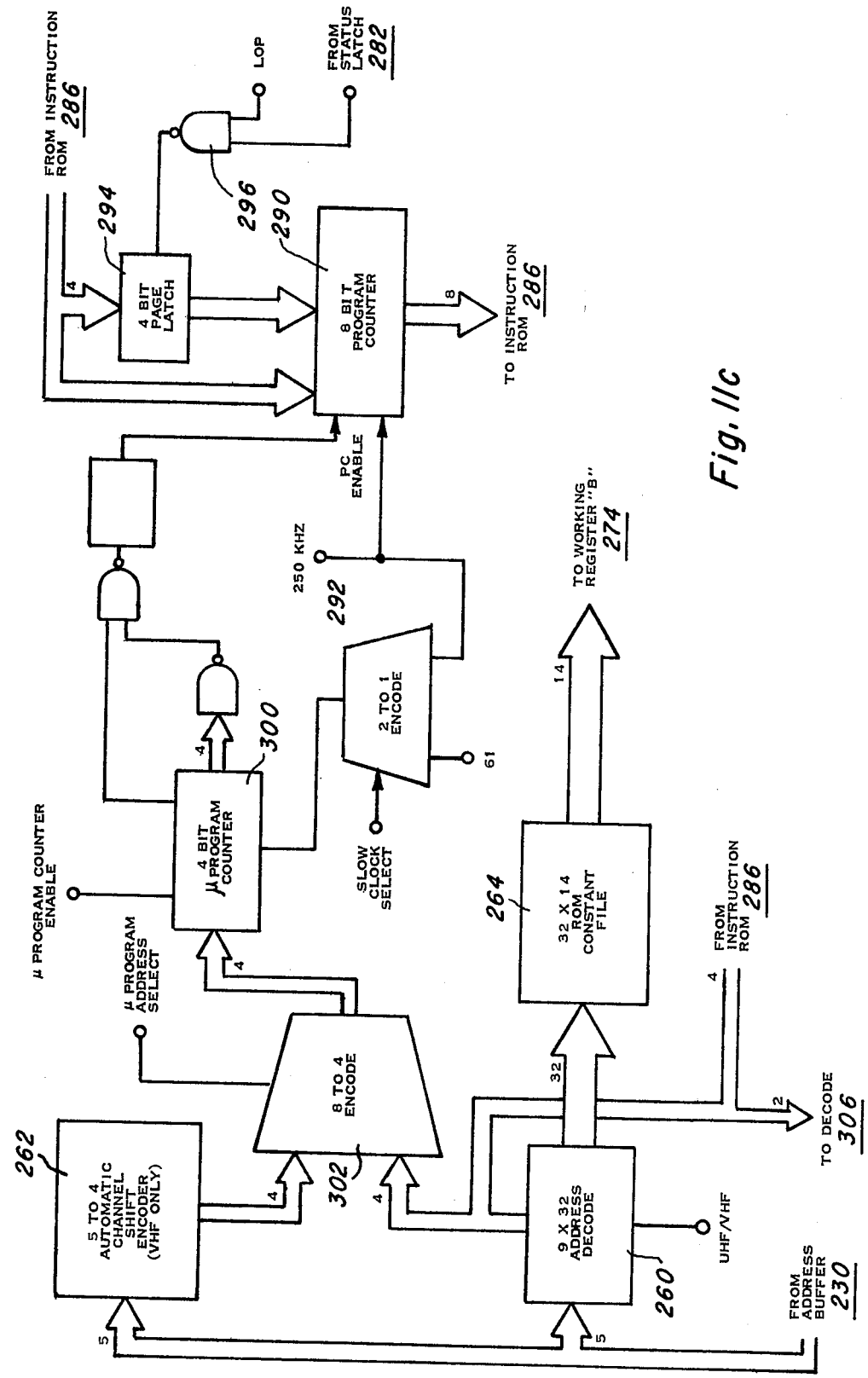

After loading the address buffer 230 with the 5 bits of address from the address generator 204 these 5 address bits are transferred in a parallel mode to the 9 by 32 address decode 260 and the 5 to 4 automatic channel shift encode (VHF only) 262 indicated in FIG. 11C. The automatic channel shift encode is used to determine whether the system is functioning in the UHF or VHF mode. If the system is functioning in the VHF mode the automatic channel shift encode provides one of four possible codes for incrementing the VHF tune word. The four codes corresponding to the particular incrementing bit value that applies to the VHF channel that has been selected by the address generator 204. Since there are only four increment rate values and 12 VHF tune words, the encode 262 selects depending upon which channel the system is on one of the four incrementing rate values to be applied to the given tune word.

The 5 bit address from the address buffer 230 is also parallel applied to the 9 by 32 address decoder 260 to select a 14 bit data word stored in the ROM constant file 264. The 5 bit address which determines the VHF or UHF channel is decoded by the 9 by 32 address decoder into a 32 bit address word to address the 32 by 14 ROM constant file. The four LSB's of the instruction code determines which of the 32 words we are addressing. These 32 fourteen bit words in the ROM constant file comprise upper and lower limits for the VHF channels, UHF channel limits, increment values for both VHF and UHF tuning, time increments, maximum times, and write time.

When we have read a tune word into the input data buffer 234 and want to perform a tuning function upon it, we transfer the 14 bits of data out of the input data buffer register and into the 14 bit A working register 266 by means of a read input data buffer (RIBD) command at the 4 to 1 encode switch 270. Also, the 14 bit word is serially transferred back into itself by means of loop 272. After loading register A with the 14 bit tune word, the tune limit and increment value is outputted from the 14 bit ROM constant file and loaded into the 14 bit B working register 274. These values are now loaded into the temporary storage RAM file 276 by selection of the LBMX command on the selector switch encode 278. The temporary storage file comprises a 4 by 14 bit RAM file. Tuning is now performed by adding an increment value which is stored in register B to the 14 bit tune word stored in register A if the system is in a tune upmode and subtracting them if the system is in a tuned downmode. The incremented or decremented tune word is restored into the A working register by means of the "A" normalize command on the selector switch encode 270 indicated in FIG. 11D.

After the restore operation the updated 14 bit tune word is transferred into the input data buffer 234 by performing a load input data buffer (LIDB) command on selector switch encode 236. The updated tune word is now stored into the input data buffer and also restored into register A. The updated tune word is now loaded into the 14 bit PWM logic latch 248 whereby the PWM counter 250 can compare its out to updated tune word.

Whenever a tuning function is performed the system goes through a sequence whereby it performs an addition and a time out routine in the arithmetic logic unit by decrementing out timing word until a negative number is reached. In each case information is read from the ROM constant file and stored into the temporary storage RAM file. This information is a function of the particular channel and whether the channel is a UHF or VHF channel. In the sequence the system always goes through reading the input switches so if there is a change of state on our input switches during a tuning function it will be detected and the system function will be changed to the latest input command.

These input control functions are read into the system by means of the 12 to 1 input logic status switch 280 having 12 inputs indicated in FIG. 11F. A 61 kilohertz slow clock is provided to perform the write function which in the case of the non-volatile memory comprising DIFMOS memory cells takes in the order of 100 milliseconds to write a 0 into the memory, therefore requiring a clock running at a slower rate then the control or processing clock that is normally used. The slow clock is also used to provide dampening when in the power up mode or after we have already completed a write command in writing into memory so that the system doesn't read the new word while it is still settling.

Another input is the UHF/VHF control line that is a function of the particular address that has been detected from out selector switch 202. A third and fourth input is an AFC high and an AFC low select. The function of the AFC high/low is to provide a digial AFC control function. The means of achieving the digital AFC control is not indicated in the figures or represented in the algorithm. However, the digital AFC control system could be incorporated into the architecture by means of a couple of comparator windows and the appropriate addition of control logic to the present algorithm.

A fifth input is a UHF up/down control that is a control from a comparator 282 that determines whether the tune voltage is above or below the corresponding potentiometer setting of the UHF channel coarse tune potentiometer 284. An additional input is a power on/off select. Upon a power down input the 14 bit tune word stored in the input data buffer register 234 is written into the addressable non-volatile memory.

The seventh input is a skip toggle input which is not incorporated into the present system. This skip function if made available would allow for the skipping over of selected channels but is not applicable to a mechanical rotary switch as noted above.

The eighth and ninth inputs comprise the rocker arm fine tuneup and fine tunedown for the control voltage. The UHF tune on/off control places the tuning function into a coarse UHF tuning mode. The AFC on/off switch is used to activate the internal AFC tuning function or to allow for the external manual tuning mode. The final switch on the input logic status switch is the interchannel pulse that is inputted from the selector switch 202 by means of the channel interrupt line 224. The interchannel pulse provides an indication that the selector switch is in between channels in a changing mode and also detects the completed change.

The twelve inputs are read into the input logic status switch. If one of the twelve logic status switches is activated it is compared with a particular select code and if there is any indication of a match on the read command of that given instruction to the particular switch being closed or opened as the case may be, the status latch flip-flop 282 is set. The status switch inputs are decoded by the 4 to 12 decoder 284 which is addressed by four LSB's of instruction from the instruction ROM 286. The status latch 282 provides an indication that the system has received an input corresponding to one that has been coded in the instruction table of the decoder 284.

The second input to the status latch 282 is the carry input from the one bit full adder when the system is in a subtract routine and if the subtract routine results in a negative number. The negative number indication is used to perform compare tests to determine whether an upper or lower tuning limit or timing limit has been reached. The setting of the status latch 282 provides an input to the instruction ROM 286 to load the program counter with a new page of instruction address.

The eight bit program counter 290 indicated in FIG. 11C receives its count clock input from the 250 kilohertz clock 292 which is a one quarter division of the one megahertz clock from the PWM counter 250. The program counter gives any one of 256 instruction addresses for the instruction ROM 286. The location of the program counter in its counting sequence may be altered by loading in a new eight bit word into the program counter. The four LSB's from the instruction ROM are parallel loaded into the four LSB positions of the eight bit program counter and parallel loaded into a four bit page batch 294. If the status latch is set by a subtract operation from reading an input from the logic status switch, then upon a load page command (LPD) applied to the NAND gate 296 the four LSB bits of address will be loaded from the page latch into the program counter in the MSB position.

Figure 11D:
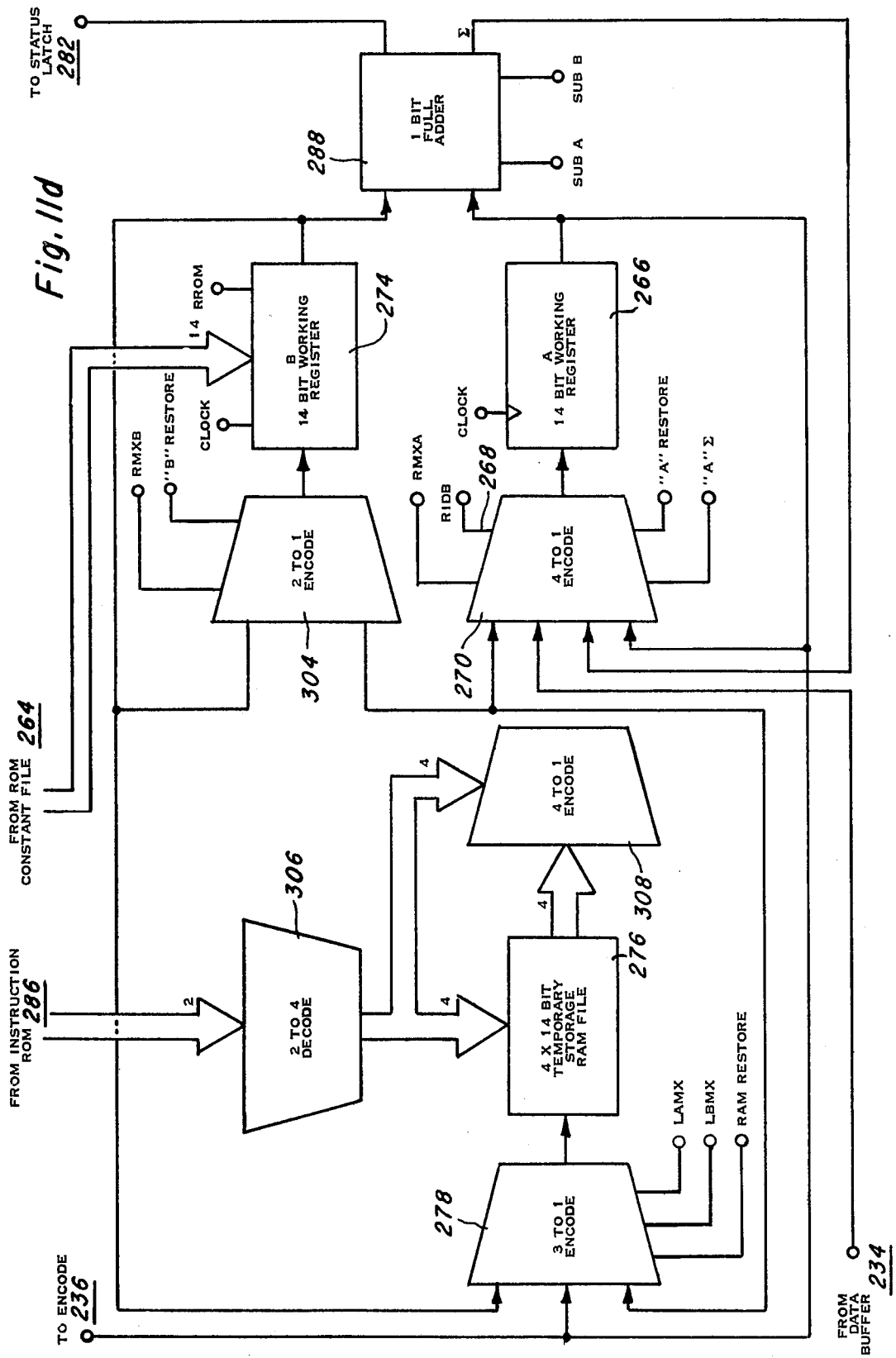
Figure 11E:
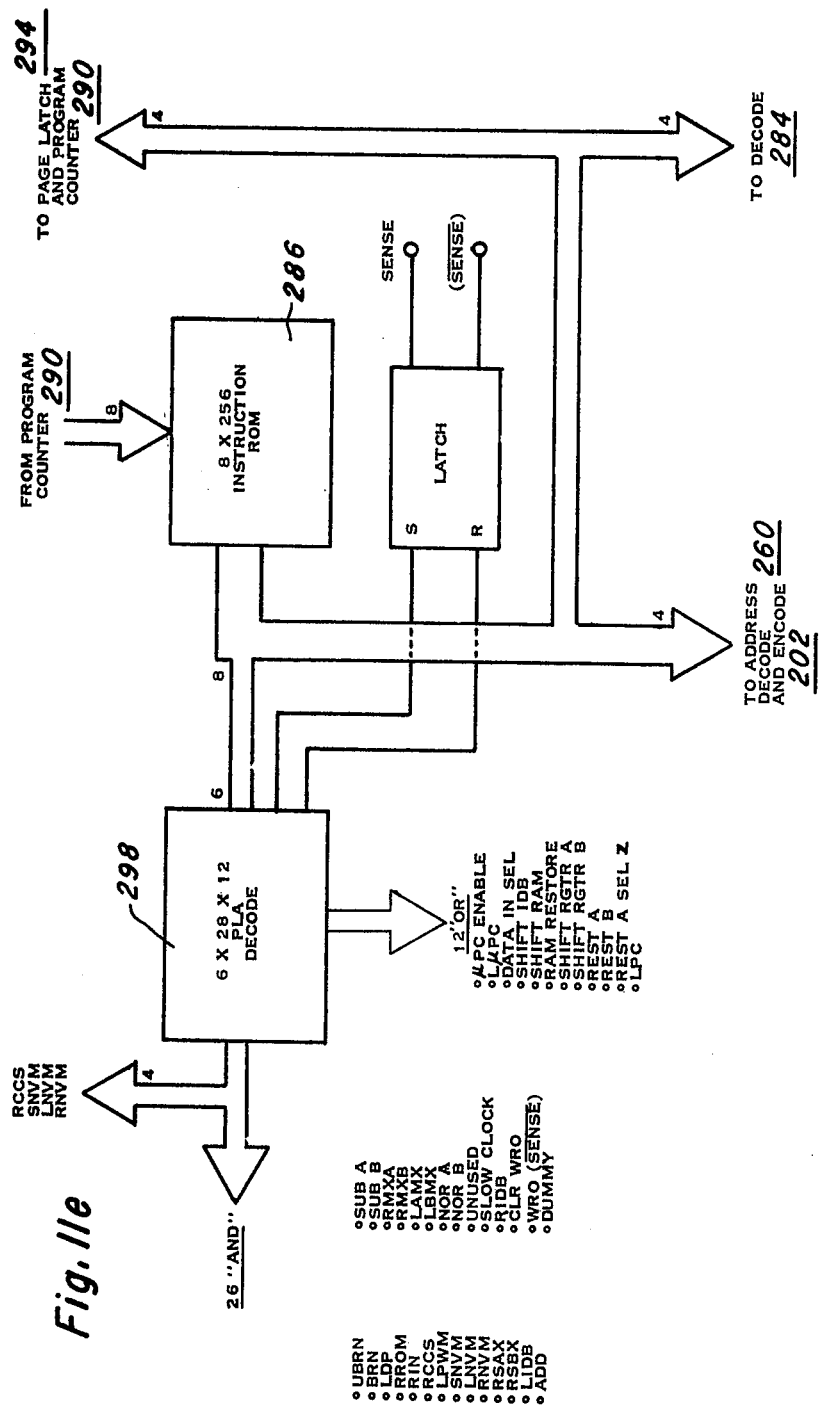
Figure 11H:
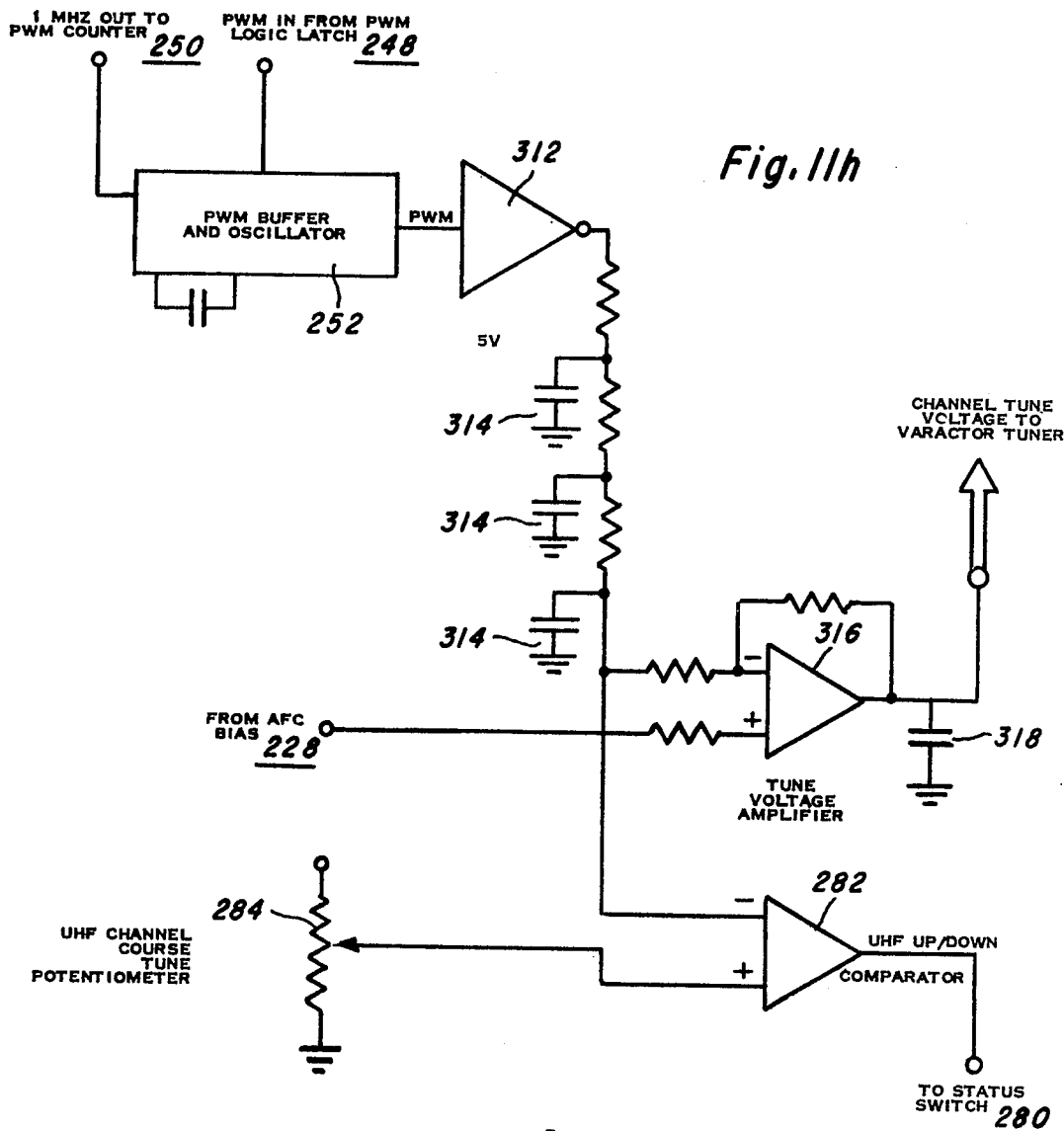

The output of the instruction ROM 286 feeds into the instruction PLA circuitry 298 which outputs 26 "and"

functions and 12 "or" functions indicated in FIG. 11E. The instruction PLA decode comprises the 6 by 28 by 12 bit memory. These "and" and "or" functions correspond to the instruction set that is used to program the system.

The four bit microprogram counter 300 is used to provide shift controls to the various shift registers of the tuning circuitry. And more particular, the microprogram counter allows for the shifting of the 14 bit data word in working register A into the input data buffer register. In addition it allows for the addition and subtraction of working registers A and B and also allows for the transfer of data to the non-volatile memory.

The maximum number of serial shifting by the microprogram counter is 14 bits. When the shifting produced by the microprogram counter is completed, the system operation is returned to the eight bit program counter where it is indexed to the next address in the program. The eight bit microprogram instruction is selected by the microprogram address select encode 302. Four bits from the automatic channel shift encode 262 and four LSB's from the instruction ROM are loaded parallel into the address select encode to provide four bits of instruction address for the microprogram counter 300.

Referring to FIG. 11D a switch encode 304 is provided to allow for a restore operation whereby the 14 bit word in the B working register is shifted back into itself. In addition the switch encode provides for a shifting of the 14 bit word from the temporary storage RAM file 276 into the working register. Switch encode 270 allows for the shifting of a 14 bit word into the A working register from the temporary storage RAM file, the input data buffer register 234, a sum product from the addition of working register A and register B by means of the one bit full adder 288, and finally the restore of the word in the A register into itself.

The temporary storage RAM file 276 is addressed by two bits from the instruction ROM through a 2 to 4 encode 306. The four bit word from the encode is used to select one of four 14 bit storage files in the RAM file 276 by means of the 4 to 1 selector encode 308.

The pulse width modulated output 310 from the PWM logic latch is fed into the PWM buffer 252. The PWM signal from the PWM buffer is fed into a driver buffer 312 that is referenced to +5 volts in FIG. 11H. The PWM output continues through a three stage PWM filter to provide the IC filtering required for the resolution and ripple voltage needed for a pulse width modulated signal of the longest duration to an acceptable level in the UHF mode. The VHF mode would not need as much filtering to generate a PWM at an acceptable ripple level. However, at least three stages are required for UHF filtering.

The output of the three stage filter is a DC voltage that is proportional to the pulse width modulated signal, the pulse width modulated signal being proportional to the 14 bit tune word that has been loaded into the 14 bit input data buffer register and PWM logic latch. The tune voltage is amplified by inverting voltage amplifier 316 and subsequently filtered by an additional single stage filter 318. The final DC analog tune voltage is passed to the television varactor tuner for tuning to the selected channel.

A second comparator 282 comprises a UHF up-/down comparator which receives its inputs from the three stage PWM filter and a UHF course tune potentiometer 284. The potentiometer is referenced to the same +5 volts as the driver buffer 212. The comparator 282 provides an indication as to whether or not the system is in the coarse tune mode of UHF, whether or not the system is above or below the desired tune voltage for the particular channel setting, and provides a coarse tuning signal for the controller.

FIG. 320 represents the power supply required for the operation of the tuning system. The +35 volts used to provide the upper voltage for the tuning amplifier for the varactor tune voltage output. The +17 volts is used for biasing of the MOS circuitry of the non-volatile memory. The +10 volts is used for biasing the CMOS logic in the system. The +5 volts is used for the TTL and I²L logic in the system. Finally, the 0 to −35 switch voltage is used for programming the non-volatile memory when the system is in a write mode.

In performing a tuning function using the micro-computer approach in the VHF mode a binary tune word that is stored in the input data buffer register is incremented or decremented within the limits for the minimum and maximum tune voltages for the selected channel that is stored in the ROM constant file. The ROM constant file contains a binary word for the maximum tune voltage and minimum tune voltage for each of the 12 VHF channels. These limits establish the range of tuning permitted by the system. These values are individually selected for each of the VHF channels. In a similar manner minimum and maximum limits are established for the UHF channel. However, due to the large number of UHF channels the minimum and maximum limit are established so as to encompass all 72 UHF channels with tuning for the selected UHF channel falling therebetween.

Figure 12:
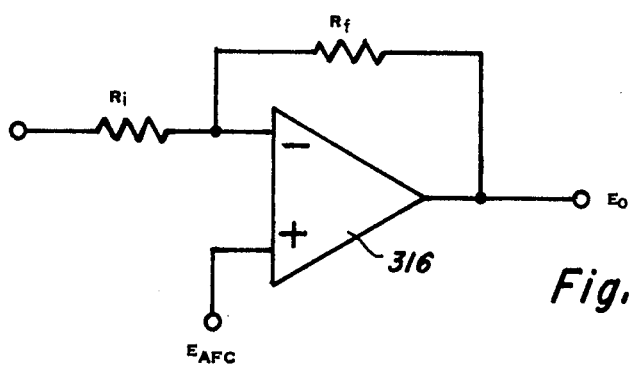
FIG. 12 represents the tune voltage amplifier diagram and related equations for calculating binary words corresponding to tune voltages.

Referring now to FIG. 12 the schematic diagram used for calculating the minimum and maximum tune voltages is indicated in addition to the equations used. Equation 3 is the input voltage as a function of the output tune voltage. Given the desired tune voltage to $E_O$ the input voltage $E_i$ may be calculated. In addition, by using equation 4 the bits corresponding to the input voltage is calculated thereby resulting in the binary tune word corresponding to the calculated input voltage.

In this regard, Table I indicates the VHF ROM constants for the minimum limits as established by equations 3 and 4. Each of the VHF channels have a unique binary word corresponding to the minimum voltage limit. In a similar manner Table II indicates the VHF ROM constant for the maximum tune voltage. As noted the nominal tube voltage for tuning the television will lie somewhere between these two established limits. The binary words comprise 14 data bits and are addressed by the 5 bit binary address from the selector switch.

TABLE I

| | | | | | VHF ROM CONSTANTS (MINIMUM) | | | | | | | | | | | | |
|---|---|---|---|---|---|---|---|---|---|---|---|---|---|---|---|---|---|
| CH# | NOM EAFC | MAX Eo | MIN Ei | BITS | 8192 | 4096 | 2048 | 1024 | 512 | 256 | 128 | 64 | 32 | 16 | 8 | 4 | 2 | 1 |
| 2 | 1.549 | 2.149 | 1.442 | 4725 | 0 | 1 | 0 | 0 | 1 | 0 | 0 | 1 | 1 | 1 | 0 | 1 | 0 | 1 |
| 3 | 1.814 | 4.320 | 1.367 | 4479 | 0 | 1 | 0 | 0 | 0 | 1 | 0 | 1 | 1 | 1 | 1 | 1 | 1 | 1 |
| 4 | 2.310 | 7.158 | 1.444 | 4731 | 0 | 1 | 0 | 0 | 1 | 0 | 0 | 1 | 1 | 1 | 1 | 0 | 1 | 1 |
| 5 | 4.589 | 23.000 | 1.301 | 4263 | 0 | 1 | 0 | 0 | 0 | 0 | 1 | 0 | 1 | 0 | 0 | 1 | 1 | 1 |

TABLE I-continued

| CH# | NOM EAFC | MAX Eo | MIN Ei | BITS | VHF ROM CONSTANTS (MINIMUM) ||||||||||||||
|---|---|---|---|---|---|---|---|---|---|---|---|---|---|---|---|---|---|
| | | | | | 8192 | 4096 | 2048 | 1024 | 512 | 256 | 128 | 64 | 32 | 16 | 8 | 4 | 2 | 1 |
| 6 | 4.528 | 29.885 | -0- | -0- | 0 | 0 | 0 | 0 | 0 | 0 | 0 | 0 | 0 | 0 | 0 | 0 | 0 | 0 |
| 7 | 2.299 | 7.550 | 1.361 | 4459 | 0 | 1 | 0 | 0 | 0 | 1 | 0 | 1 | 1 | 0 | 1 | 0 | 1 | 1 |
| 8 | 2.490 | 9.440 | 1.249 | 4092 | 0 | 0 | 1 | 1 | 1 | 1 | 1 | 1 | 1 | 1 | 1 | 1 | 0 | 0 |
| 9 | 2.726 | 11.790 | 1.107 | 3627 | 0 | 0 | 1 | 1 | 1 | 0 | 0 | 0 | 1 | 0 | 1 | 0 | 1 | 1 |
| 10 | 3.021 | 14.710 | 0.934 | 3060 | 0 | 0 | 1 | 0 | 1 | 1 | 1 | 1 | 1 | 1 | 0 | 1 | 0 | 0 |
| 11 | 3.594 | 18.370 | 0.955 | 3129 | 0 | 0 | 1 | 1 | 0 | 0 | 0 | 0 | 1 | 1 | 1 | 0 | 0 | 1 |
| 12 | 4.409 | 23.000 | 0.665 | 2179 | 0 | 0 | 1 | 0 | 0 | 0 | 1 | 0 | 0 | 0 | 0 | 0 | 1 | 1 |
| 13 | 4.621 | 29.920 | 0.103 | 337 | 0 | 0 | 0 | 0 | 0 | 1 | 0 | 1 | 0 | 1 | 0 | 0 | 0 | 1 |

TABLE II

| CH# | NOM EAFC | MIN Eo | MAX Ei | BITS | VHF ROM CONSTANTS (MAXIMUM) ||||||||||||||
|---|---|---|---|---|---|---|---|---|---|---|---|---|---|---|---|---|---|
| | | | | | 8192 | 4096 | 2048 | 1024 | 512 | 256 | 128 | 64 | 32 | 16 | 8 | 4 | 2 | 1 |
| 2 | 1.549 | 0.400 | 1.754 | 5747 | 0 | 1 | 0 | 1 | 1 | 0 | 0 | 1 | 1 | 1 | 0 | 0 | 1 | 1 |
| 3 | 1.814 | 0.888 | 1.979 | 6484 | 0 | 1 | 1 | 0 | 0 | 1 | 0 | 1 | 0 | 1 | 0 | 1 | 0 | 0 |
| 4 | 2.310 | 2.149 | 2.339 | 7664 | 0 | 1 | 1 | 1 | 0 | 1 | 1 | 1 | 1 | 1 | 0 | 0 | 0 | 0 |
| 5 | 4.589 | 4.682 | 4.572 | 14,980 | 1 | 1 | 1 | 0 | 1 | 0 | 1 | 0 | 0 | 0 | 0 | 1 | 0 | 0 |
| 6 | 4.528 | 12.260 | 3.147 | 10,311 | 1 | 0 | 1 | 0 | 0 | 0 | 0 | 1 | 0 | 0 | 0 | 1 | 1 | 1 |
| 7 | 2.299 | 4.624 | 1.884 | 6173 | 0 | 1 | 1 | 0 | 0 | 0 | 0 | 0 | 1 | 1 | 1 | 1 | 0 | 1 |
| 8 | 2.490 | 6.010 | 1.861 | 6098 | 0 | 1 | 0 | 1 | 1 | 1 | 1 | 1 | 0 | 1 | 0 | 0 | 1 | 0 |
| 9 | 2.726 | 7.550 | 1.865 | 6111 | 0 | 1 | 0 | 1 | 1 | 1 | 1 | 0 | 1 | 1 | 1 | 1 | 1 | 0 |
| 10 | 3.021 | 9.440 | 1.875 | 6144 | 0 | 1 | 1 | 0 | 0 | 0 | 0 | 0 | 0 | 0 | 0 | 0 | 0 | 0 |
| 11 | 3.594 | 11.790 | 2.130 | 6979 | 0 | 1 | 1 | 0 | 1 | 1 | 0 | 1 | 0 | 0 | 0 | 0 | 1 | 1 |
| 12 | 4.049 | 14.710 | 2.145 | 7028 | 0 | 1 | 1 | 0 | 1 | 1 | 0 | 1 | 1 | 1 | 0 | 1 | 0 | 0 |
| 13 | 4.621 | 18.370 | 2.166 | 7097 | 0 | 1 | 1 | 0 | 1 | 1 | 1 | 0 | 1 | 1 | 1 | 0 | 0 | 1 |

The data including the VHF minimum and maximum limits are stored in the ROM constant file as indicated in Table III. As noted the ROM constant file has 32 separate data values stored therein. The VHF and UHF increment values are also stored in the ROM constant file. The maximum time for both VHF tuning and UHF tuning are also stored therein. In addition, the time increment value is also stored. Finally, the UHF minimum tune word and the UHF maximum tune word including the write time is stored in the ROM constant file.

TABLE III

| PROM INSTRUCTION | ROM CONSTANT FILE |||| 
|---|---|---|---|---|
| | ADDRESS || CODE ||
| | NO. | BINARY | MSB | LSB |
| # 2 VHF MIN | 0 | 00000 0 | 010 0100 | 0 111 0101 |
| # 2 VHF MAX | 1 | 00001 0 | 010 1100 | 0 111 0011 |
| # 3 VHF MIN | 2 | 00010 0 | 010 0010 | 0 111 1111 |
| # 3 VHF MAX | 3 | 00011 0 | 011 0010 | 0 101 0100 |
| # 4 VHF MIN | 4 | 00100 0 | 010 0100 | 0 111 1011 |
| # 4 VHF MAX | 5 | 00101 0 | 011 1011 | 0 111 0000 |
| # 5 VHF MIN | 6 | 00110 0 | 010 0001 | 0 010 0111 |
| # 5 VHF MAX | 7 | 00111 0 | 111 0101 | 0 000 0100 |
| # 6 VHF MIN | 8 | 01000 0 | 000 0000 | 0 000 0000 |
| # 6 VHF MAX | 9 | 01001 0 | 101 1000 | 0 100 0111 |
| # 7 VHF MIN | 10 | 01010 0 | 010 0010 | 0 110 1011 |
| # 7 VHF MAX | 11 | 01011 0 | 011 0000 | 0 001 1101 |
| # 8 VHF MIN | 12 | 01100 0 | 001 1111 | 0 111 1100 |
| # 8 VHF MAX | 13 | 01101 0 | 010 1111 | 0 101 0010 |
| # 9 VHF MIN | 14 | 01110 0 | 001 1100 | 0 010 1011 |
| # 9 VHF MAX | 15 | 01111 0 | 010 1111 | 0 101 1111 |
| #10 VHF MIN | 16 | 10000 0 | 001 0111 | 0 111 0100 |
| #10 VHF MAX | 17 | 10001 0 | 011 0000 | 0 000 0000 |
| #11 VHF MIN | 18 | 10010 0 | 001 1000 | 0 011 1001 |
| #11 VHF MAX | 19 | 10011 0 | 011 0110 | 0 100 0011 |
| #12 VHF MIN | 20 | 10100 0 | 001 0001 | 0 000 0011 |
| #12 VHF MAX | 21 | 10101 0 | 011 0110 | 0 111 0100 |
| #13 VHF MIN | 22 | 10110 0 | 000 0010 | 0 101 0001 |
| #13 VHF MAX | 23 | 10111 0 | 011 0111 | 0 011 1001 |
| VHF INCREMENT | 24 | 11000 0 | 000 0000 | 0 100 0000 |
| TIME INCREMENT | 25 | 11001 0 | 000 0000 | 0 000 0001 |
| MAX TIME (ROCKER) | 26 | 11010 0 | 000 0101 | 0 000 1100 |
| UHF INCREMENT | 27 | 11011 0 | 000 0001 | 0 001 0101 |
| UHF MIN V | 28 | 11100 0 | 000 0000 | 0 010 0000 |
| UHF MAX V | 29 | 11101 0 | 111 0100 | 0 101 0110 |
| WRITE TIME | 30 | 11110 0 | 000 1100 | 0 001 1011 |
| MAX TIME(UHF) | 31 | 11111 0 | 000 0000 | 0 010 1000 |

Table IV indicates the PLA logic for automatic right shift addressing (VHF only) of the microprogram counter. As noted from Table III the VHF increment value has a 1 in the 7th bit position. During the incrementing or decrementing of the VHF word it is desired to increment or decrement at a particular bit weight value unique to each of the VHF channels. To accomplish this, the automatic channel shift encode provides for right shifting of the increment value so as to normalize it to provide a different bit weight for each of the 12 UHF channels. The number of right shift in the VHF mode for each of the selected channels is indicated in Table IV in addition to the encode word for the microprogram counter preset. Since the UHF tuning is performed by a process which provides for the increasing of the bit weight of the increment value, the normalization by right shifting the increment value is not needed.

TABLE IV

PLA LOGIC FOR AUTOMATIC RIGHT SHIFT ADDRESSING (VHF ONLY) OF $\mu$ PROGRAM COUNTER

| VHF CHANNEL || NO. OF RIGHT SHIFTS FOR NORMAL RATION | ENCODE WORD FOR $\mu$ PROGRAM COUNTER PRESET |
|---|---|---|---|
| NO. | BINARY WORD | | |
| 2 | 00000 | 4 | 1011 |
| 3 | 00001 | 3 | 1100 |
| 4 | 00010 | 2 | 1101 |
| 5 | 00011 | 1 | 1110 |
| 6 | 00100 | 0 | 1111 |

TABLE IV-continued
PLA LOGIC FOR AUTOMATIC RIGHT SHIFT ADDRESSING (VHF ONLY) OF μ PROGRAM COUNTER

| VHF CHANNEL NO. | BINARY WORD | NO. OF RIGHT SHIFTS FOR NORMAL RATION | ENCODE WORD FOR μ PROGRAM COUNTER PRESET |
|---|---|---|---|
| 7 | 00101 | 3 | 1100 |
| 8 | 00110 | 3 | 1100 |
| 9 | 00111 | 3 | 1100 |
| 10 | 01000 | 3 | 1100 |
| 11 | 01001 | 2 | 1101 |
| 12 | 01010 | 2 | 1101 |
| 13 | 01011 | 2 | 1101 |
| UHF | 01100 10100 | 0 | N.A. |

The instructional logic from the PLA decode is indicated in Tables V and VI. In Table V the instruction ROM decode outputs comprising 12 NOR gate outputs is indicated. These 12 outputs provide the "OR" logic functions for the microcomputer program. Table VI indicates the 28 instruction ROM decode outputs of the PLA decode. These outputs comprise 28 "AND" logic functions for the microcomputer programming.

TABLE V
INSTRUCTION
ROM DECODE OUTPUTS
(NOR GATE OUTPUTS)

1. LPC = UBRN + BRN S/L
2. μPC ENABLE = RNVM + LNVM + RSAX + RSBX + ADD + SUBA + SUBB + RMXA + RMXB + LAMX + LBMX + NORA + NORB + RESA + RESB + RIDB + LIDB + WRO + WRI + $2^7$ BIT (OF P.C.)
3. LD μPC = RNVM + LNVM + RSAX + RSBX + NORA + NORB + RESA + RESB
4. DATA IN SEL IDB = SHIFT CONT. IN CODE = RNVM + LNVM
5. SHIFT CONT. IDB = RIDB + RNVM + LNVM + LIDB
6. SHIFT CONT. RAM = RMXA + RMXB + LAMX + LBMX
7. RAM DATA RESTORE SEL = RMXA + RMXB
8. SHIFT CONT. REG A = RMXA + LAMX + RSAX + ADD + SUBA + SUBB + NORA + RESA
9. REG A SEL RESTORE A = RESA + LAMX + LIDB
10. REG A SEL Σ = ADD + SUBA + SUBB
11. SHIFT CONT. REG B = RMXB + LBMX + RSBX + ADD + SUBA + SUBB + NORB + RESB
12. REG B SEL RESTORE B = RESB + LBMX

TABLE VI
INSTRUCTION
ROM DECODE OUTPUTS
(NAND GATE OUTPUTS)

0. UNCONDITIONAL BRANCH (UBRN)
   A. IF S/L = 1 OR 0 (i.e. DON'T CARE)
      1. PARALLEL LOADS PROGRAM COUNTER ON CLK WITH CONTENTS OF PAGE LATCH AND 4 LSB'S OF UBRN CODE.
      2. CLEARS S/L ON $\overline{CLK}$
1. BRANCH (BRN)
   1. A. IF S/L = 1
      1. PARALLEL LOADS PROGRAM COUNTER ON CLK WITH CONTENTS OF PAGE LATCH AND 4 LSB'S OF BRN CODE.
      2. CLEARS S/L ON $\overline{CLK}$
   B. IF S/L = 0
      1. DO NOTHING
2. LOAD PAGE (LDP)
   A. LOADS 4 BIT ADDRESS CODE INTO PAGE LATCH (4 MSB'S OF ADDRESS).
3. READ ROM (RROM)
   A. PARALLEL LOADS REG. B WITH CONTENTS OF ROM STORED AT LOCATION DEFINED BY 4 BIT ADDRESS CODE AND/OR CHANNEL SELECT CODE (IF VHF).
4. READ INPUTS (RIN)
   A. ENABLES INPUT DEFINED BY 4 BIT ADDRESS TO BE GATES THRU TO THE S/L FLIP/FLOP. IF INPUT IS "0" THEN S/L IS LOADED WITH A "1" ON CLK. IF INPUT IS A "1" THEN S/L IS LOADED WITH A "0" ON CLK.

TABLE VI Continued

5. READ CHANNEL CODE SW. (RCCS)
   A. SETS INPUT STROBE TO A "1" LEVEL SO THAT THE CHANNEL SELECT SWITCH CODE CAN BE PARALLEL LOADED INTO THE NVM LATCH BUFFER ON THE MEMORY IC.
6. LOAD PWM (LPWM)
   A. PARALLEL LOADS THE CONTENTS OF THE INPUT DATA BUFFER REGISTER INTO THE PWM DATA REGISTER DURING CLK.
7. SENSE NVM (SNVM)
   A. SETS SENSE LINE TO "0" SO THAT THE CONTENTS OF THE NVM CAN BE PARALLEL LOADED INTO THE DATA BUFFER REGISTERS ON THE MEMORY IC DURING CLK.

*THE FOLLOWING FUNCTIONS ENABLE THE μ PROGRAM COUNTER*

8. READ NVM BUFFER (RNVM)
   A. SELECTS 4 BIT ADDRESS CODE TO BE LOADED INTO μ PROGRAM COUNTER.
   B. LOADS 4 BIT ADDRESS (0101) INTO μ PROGRAM COUNTER TO RESET IT FOR 10 RIGHT SHIFT FUNCTIONS. LOAD OCCURS DURING CLK.
   C. ON CLK THE PROGRAM COUNTER IS DISABLED, AND THE μ PROGRAM COUNTER IS ENABLED.
   D. A RIGHT SHIFT COMMAND IS PROVIDED FOR THE INPUT BUFFER REGISTERS AND THE NVM BUFFER REGISTERS UNTIL

THE μ PROGRAM COUNTER REACHES THE 1111 STATE (10 SHIFTS).
E. WHEN THE μPC IS 1111 THEN ON THE NEXT CLOCK PULSE (WHICH SETS THE μPC TO 0000) THE CLK INPUT TO THE μPC IS DISABLED, AND THE CLK INPUT TO THE PROGRAM COUNTER IS RESTORED.
F. NOTE: THIS COMMAND SETS THE DATA SELECT LINE TO THE MEMORY IC TO A LOGIC "1" LEVEL, SO THAT DATA CAN BE SEQUENCED OUT OF THE IC INTO THE DAC.

TABLE VI Continued

9. LOAD NVM BUFFER (LNVM)
   A. SAME AS READ NVM BUFFER EXCEPT SEQUENCE (F) IS: NOTE: THIS COMMAND SETS THE DATA SELECT LINE TO THE MEMORY IC TO A LOGIC "0" LEVEL, SO DATA CAN BE SEQUENCED INTO THE MEMORY IC FROM THE DAC IC.
10. RIGHT SHIFT A (R.S.A. X)
11. RIGHT SHIFT B (R.S.B. X)
    A. SELECTS 4 BIT VARIABLE ADDRESS CODE TO BE LOADED INTO μ PROGRAM COUNTER.
    B. LOADS μ PROGRAM COUNTER DURING CLK.
    C. DISABLES PROGRAM COUNTER ON $\overline{CLK}$.
    D. ENABLES μ PROGRAM COUNTER ON $\overline{CLK}$.
    E. ENABLES DATA SHIFT IN (A) OR (B) REGISTER. DATA IN REGISTER (A) OR (B) IS WITH LEADING ZERO'S DURING μ PROGRAM COUNT TIME THEN RIGHT SHIFTED ACCORDING TO THE FOLLOWING SHIFT CODE.

| CODE | RIGHT SHIFT OPERATIONS |
|------|------------------------|
| 0000 | 14 |
| 0001 | 14 |
| 0010 | 13 |
| 0011 | 12 |
| 0100 | 11 |
| 0101 | 10 |
| 0110 | 9 |
| 0111 | 8 |
| 1000 | 7 |
| 1001 | 6 |
| 1010 | 5 |
| 1011 | 4 |
| 1100 | 3 |
| 1101 | 2 |
| 1110 | 1 |
| 1111 | 0 |

TABLE VI Continued

F. WHEN μPC IS 1111 THEN ON NEXT CLK PULSE THE μPC CLK INPUT IS DISABLED AND THE PC CLK IS ENABLED.
12-1 ADD (A & B) (ADD)
   A. PROGRAM COUNTER IS DISABLED ON $\overline{CLK}$.
   B. μPC IS ENABLED ON $\overline{CLK}$.
   C. SHIFT CONTROLS TO REG. A AND REG. B ARE ENABLED.
   D. REG. B RESTORE SEL. IS ENABLED.
   E. REG. A Σ INPUT SELECT IS ENABLED.
   F. WHEN μPC IS 1111 THE μPC CLK IS DISABLED AND THE PC IS ENABLED.

12-2,3 SUBTRACT (B-A) (SUBA)
   SUBTRACT (A-B) (SUBB)
   A. ENABLES INVERTER INPUT TO ADDER (E) FROM REG. A OR REG. B.
   B. SETS CARRY BIT IN $E_1$ TO "1".
   C. PC IS DISABLED ON $\overline{CLK}$.
   D. μPC IS ENABLED ON $\overline{CLK}$.
   E. REG A AND REG B SHIFT CONTROL IS ENABLED.
   F. DATA IS SHIFTED SERIALLY FROM REG A AND REG B INTO Σ.
   G. DATA IN REG B IS RESTORED INTO REG B WITHOUT CHANGE.
   H. Σ DATA OUT IS STORED IN REG A.
   I. WHEN μPC IS 1111 THEN PC IS ENABLED AND μPC IS DISABLED.
13-1 READ RAM → A (RMXA)
    READ RAM → B (RMXB)
    A. ADDRESS BITS (2 BITS) SELECT RAM STORAGE LOCATION.
    B. CONTROL ENABLES RAM READ RESTORE GATE.
    C. CONTROL ENABLED RAM → A OR RAM → B SELECT.
    D. PC IS DISABLED ON $\overline{CLK}$.
    E. μPC IS ENABLES ON $\overline{CLK}$.

TABLE VI Continued

F. RAM & REG A OR REG B SHIFT GATES ARE ENABLED.
   G. DATA IS SHIFTED FROM RAM TO REF A OR B UNTIL μPC IS 1111 THEN μPC CLK IS DISABLED AND PC CLK IS ENABLED.
13-3 LOAD A → RAM (LAMX) 1,2,3,4
    LOAD B → RAM (LBMX) 1,2,3,4
    A. PROGRAM COUNTER IS DISABLED ON $\overline{CLK}$.
    B. μPC IS ENABLED ON $\overline{CLK}$.
    C. ADDRESS BITS (2 BITS) SELECT RAM STORAGE LOCATION.
    D. SHIFT CONTROLS FOR SELECTED MEMORY LOCATION ARE ENABLED.
    E. REG A → M SEL. AND REG A DATA RESTORE.
14-1 NORMALIZE A (NORA)
14-2 NORMALIZE B (NORB)
    A. SELECTS 4 BIT CHANNEL ENCODE ADDRESS TO BE LOADED INTO μPC (NORMALIZED CODE).
    B. LOADS 4 BIT CHANNEL ENCODE ADDRESS INTO μPC DURING CLK.
    C. PC IS DISABLED ON $\overline{CLK}$.
    D. μPC IS ENABLED ON $\overline{CLK}$.
    E. CONTROL ENABLES SHIFT GATES OF REG. A OR B.
    F. CONTROL SETS REG. A AND REG. B INPUTS (SERIAL) TO "0".
    G. DATA IS SHIFTED IN REG. A OR B UNTIL μPC IS 1111 THEN μPC CLK IS DISABLED & PC CLK IS ENABLED.
14-3 UNUSED CODE
14-4 SLOW CLOCK ENABLE (SLOC) SWITCHES THE CLOCK INPUT TO THE μPC FROM T1 CLOCK LINE TO THE SLOW CLK LINE (16ms PERIOD).

TABLE VI Continued 15-1 READ INPUT DATA BUFFER (RIDB)

A. ENABLES BUFFER DATA SELECT INTO REG A.
B. ENABLES INPUT BUFFER DATA RESTORE SELECT GATE INTO DATA BUFFER.
C. ENABLES INPUT DATA BUFFER AND REG. A DATA SHIFT CONTROL.
D. PC IS DISABLED ON $\overline{CLK}$.
E. μPC IS ENABLED ON $\overline{CLK}$.
F. DATA IS SHIFTED FROM DATA BUFFER INTO REG. A UNTIL μPC is 1111, μPC IS DISABLED AND PC IS ENABLED.

15-2 LOAD INPUT DATA BUFFER (LIDB)
A. ENABLES REG. A DATA SELECT GATE INTO DATA BUFFER REG.
B. ENABLES RESTORE SELECT GATE INTO REG. A.
C. CONTROL ENABLES REG. A AND INPUT DATA BUFFER SHIFT GATE.
D. PC IS DISABLED ON $\overline{CLK}$.
E. μPC IS ENABLED ON $\overline{CLK}$.
F. DATA IS SHIFTED FROM REG. A TO DATA BUFFER UNTIL μPC IS 1111, THEN μPC IS DISABLED AND PC IS ENABLED.

15-3 CLEAR WRITE (CWRO) RESETS THE SENSE LINE TO THE MEMORY IC TO A "1"; SWITCHING THE MEMORY CELLS FROM A WRITE MODE TO A READ MODE.

15-4 WRITE (WRO) SETS THE SENSE LINE TO "0" ON $\overline{CLK}$; THEREBY PERMITTING DATA TO BE WRITTEN INTO THE MEMORY IC CELLS.

15-5 DUMMY (UNUSED) UNUSED CODE USED FOR DUMMY OPERATIONS.

The op-codes for the single clock instructions including their address are indicated in Table VII.

TABLE VII

| SINGLE CLOCK INSTRUCTIONS | | OP-CODES | | | |
|---|---|---|---|---|---|
| FUNCTION | OP-CODE | ADDRESS | | | |
| UBRN | 0000 | 1/0 | 1/0 | 1/0 | 1/0 |
| BRN | 0001 | 1/0 | 1/0 | 1/0 | 1/0 |
| LDP | 0010 | 1/0 | 1/0 | 1/0 | 1/0 |
| RROM | 0011 | 1/0 | 1/0 | 1/0 | 1/0 |
| RIN | 0100 | 1/0 | 1/0 | 1/0 | 1/0 |
| RCCS | 0101 | X | X | X | X |
| LPWM | 0110 | X | X | X | X |

TABLE VII-continued

| SINGLE CLOCK INSTRUCTIONS | | OP-CODES | | | |
|---|---|---|---|---|---|
| FUNCTION | OP-CODE | ADDRESS | | | |
| SNVM | 0111 | X | X | X | X |

The 4 bit and 6 bit op-codes for the microprogram control instructions including their addresses are indicated in Table VII.

TABLE VIII

| | MICROPROGRAM CONTROL INSTRUCTIONS | | OP-CODES | | | |
|---|---|---|---|---|---|---|
| | FUNCTION | OP-CODE | ADDRESS | | | |
| 4 BIT OP-CODE | RNVM | 1000 | 1/0 | 1/0 | 1/0 | 1/0 |
| | LNVM | 1001 | 1/0 | 1/0 | 1/0 | 1/0 |
| | RSAX | 1010 | 1/0 | 1/0 | 1/0 | 1/0 |
| | RSBX | 1011 | 1/0 | 1/0 | 1/0 | 1/0 |
| 6 BIT OP-CODE | LIDB | 110000 | — | — | 0 | 0 |
| | ADD | 110001 | — | — | X | X |
| | SUBA (B-A) | 110010 | — | — | X | X |
| | SUBB (A-B) | 110011 | — | — | X | X |
| | RMXA | 110100 | — | — | 1/0 | 1/0 |
| | RMXB | 110101 | — | — | 1/0 | 1/0 |
| | LAMX | 110110 | — | — | 1/0 | 1/0 |
| | LBMX | 110111 | — | — | 1/0 | 1/0 |
| | NORA | 111000 | — | — | X | X |
| | NORB | 111001 | — | — | X | X |
| | UNUSED | 111010 | — | — | X | X |
| | SLOC | 111011 | — | — | 1 | 1 |
| | RIDB | 111100 | — | — | 0 | 0 |
| | CLR WRO | 111101 | — | — | 1 | 1 |
| | WRO | 111110 | — | — | X | X |
| | DUMMY | 111111 | — | — | 1 | 1 |

The input control line read codes are indicated in Table IX. The input functions each have the same 4 MSB's (0100) and differ only in the 4 LSB's.

TABLE IX

| INPUT CONTROL LINE READ CODES | | |
|---|---|---|
| | RIN CODE | |
| INPUT FUNCTION | 4 MSB'S | 4 LSB'S |
| UNUSED | 0100 | 0000 |
| CHANNEL INTERRUPT | 0100 | 0001 |
| AFC ON/OFF | 0100 | 0010 |
| UHF ON/OFF | 0100 | 0011 |
| FINE TUNE UP | 0100 | 0100 |
| FINE TUNE DWN | 0100 | 0101 |
| SKIP TOGGLE | 0100 | 0110 |
| UHF/VHF | 0100 | 0111 |
| POWER ON/OFF | 0100 | 1000 |
| UHF UP/DWN | 0100 | 1001 |
| AFC HI | 0100 | 1010 |
| AFC LO | 0100 | 1011 |
| SLOW CLOCK | 0100 | 1100 |
| UNUSED | 0100 | 1101 |
| UNUSED | 0100 | 1110 |
| UNUSED | 0100 | 1111 |

The ROM constant address codes are indicated in Table X. It is to be noted that the 12 VHF channels are encoded to 12 minimum limits and 12 maximum limits and use the first 24 ROM addresses (00000 to 10111). The remaining 8 words are located in the last 8 ROM addresses (11000 to 11111), thus using a 32 word by 14 bit ROM structure. A greater understanding of the tuning system and the information contained in Tables I-X is gained by referring to the instructions set algorithm.

TABLE X

| ROM CONSTANT ADDRESS CODES | | |
|---|---|---|
| | RROM CODE | |
| STORED WORD (14 BITS) | 4 MSB'S | 4 LSB'S |
| VHF MIN LIMIT | 0011 | 00XX |
| VHF MAX LIMIT | 0011 | 01XX |
| VHF INCREMENT | 0011 | 1000 |

TABLE X-continued
ROM CONSTANT ADDRESS CODES

| STORED WORD (14 BITS) | RROM CODE 4 MSB'S | 4 LSB'S |
|---|---|---|
| TIME/UHF INCREMENT | 0011 | 1001 |
| MAX FINE TUNE TIME | 0011 | 1010 |
| UHF CHANNEL LIMIT | 0011 | 1011 |
| UHF MIN BAND LIMIT | 0011 | 1100 |
| UHF MAX BAND LIMIT | 0011 | 1101 |
| WRITE TIME | 0011 | 1110 |
| MAX UHF COARSE TUNE TIME | 0011 | 1111 |

The instruction set algorithm for the nonvolatile station memory tuning system as indicated in FIGS. 13A–13L. The algorithm can be divided into a series of four operating modes. The first operating mode comprises the non-tuning mode, FIGS. 13A–13C, the second mode is the start of the AFC off loop which comprises the tuning mode select and initialization FIGS. 13D–13F, the third mode comprises the start of the Rocker Tune loop that is the channel fine tuning mode FIGS. 13G–13H, and the fourth loop is the UHF Pot Tune loop comprising the UHF coarse tuning mode FIGS. 13I–13L.

Figure 13A:
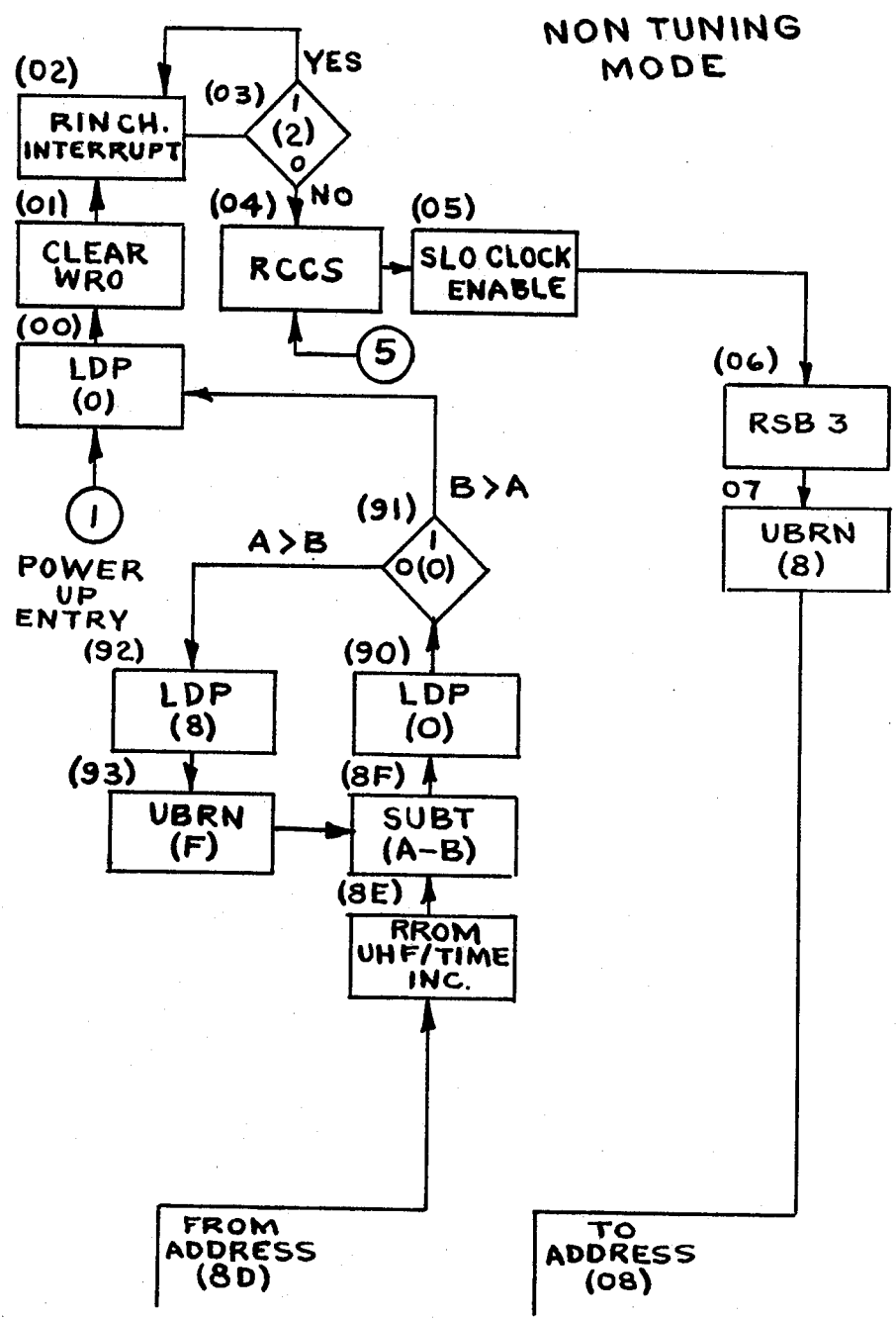
Figure 13B:
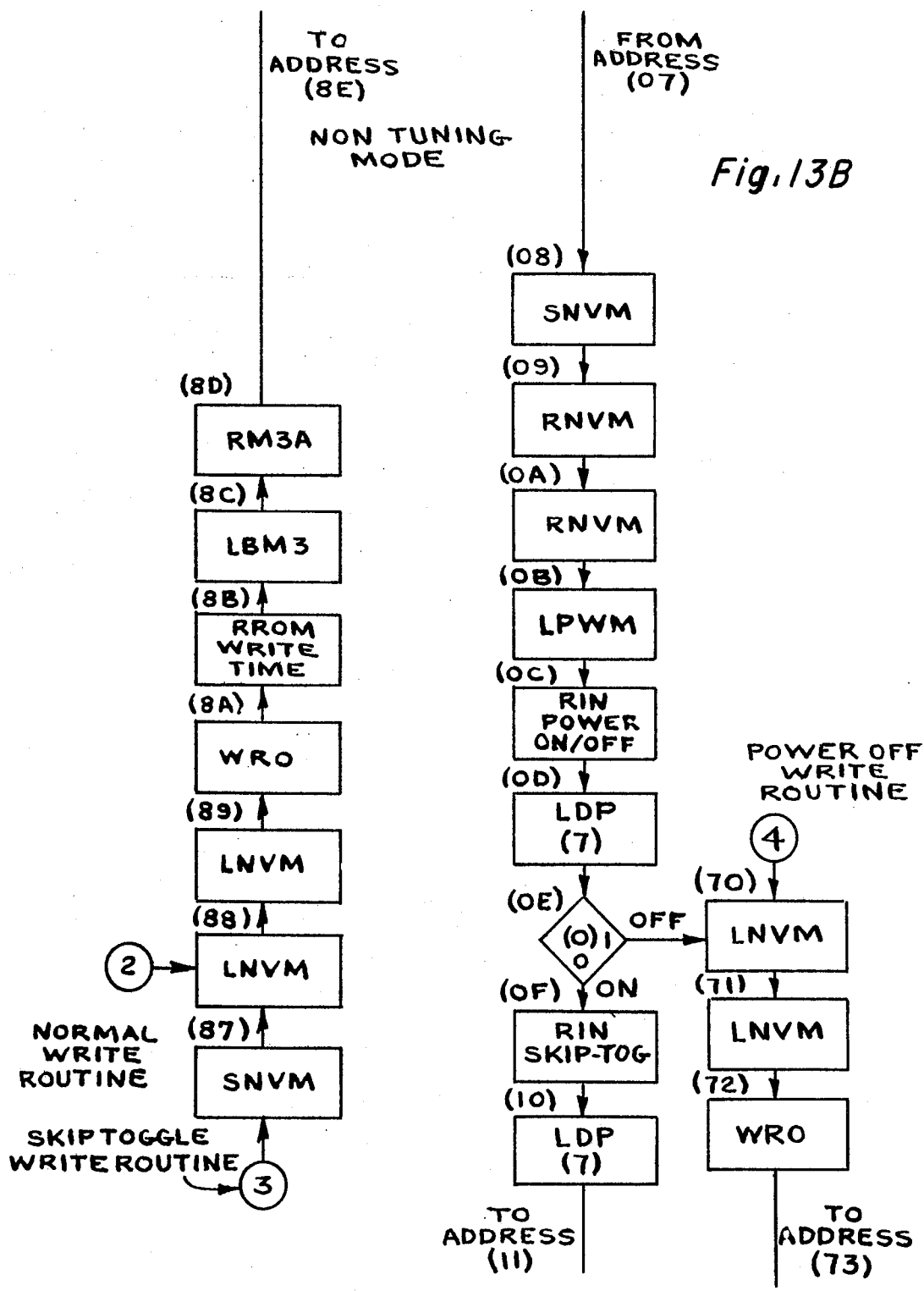
Figure 13C:
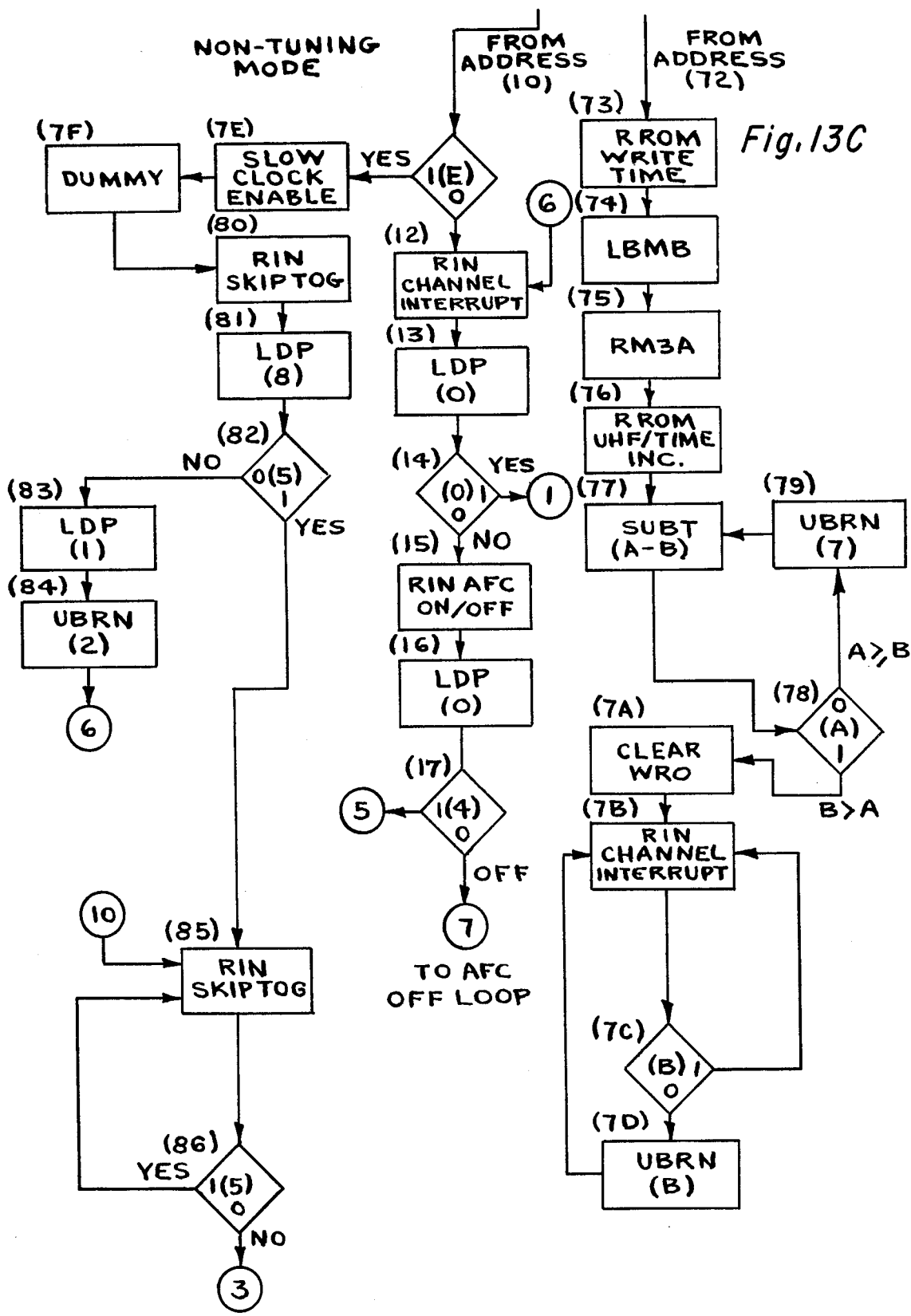
Figure 13E:
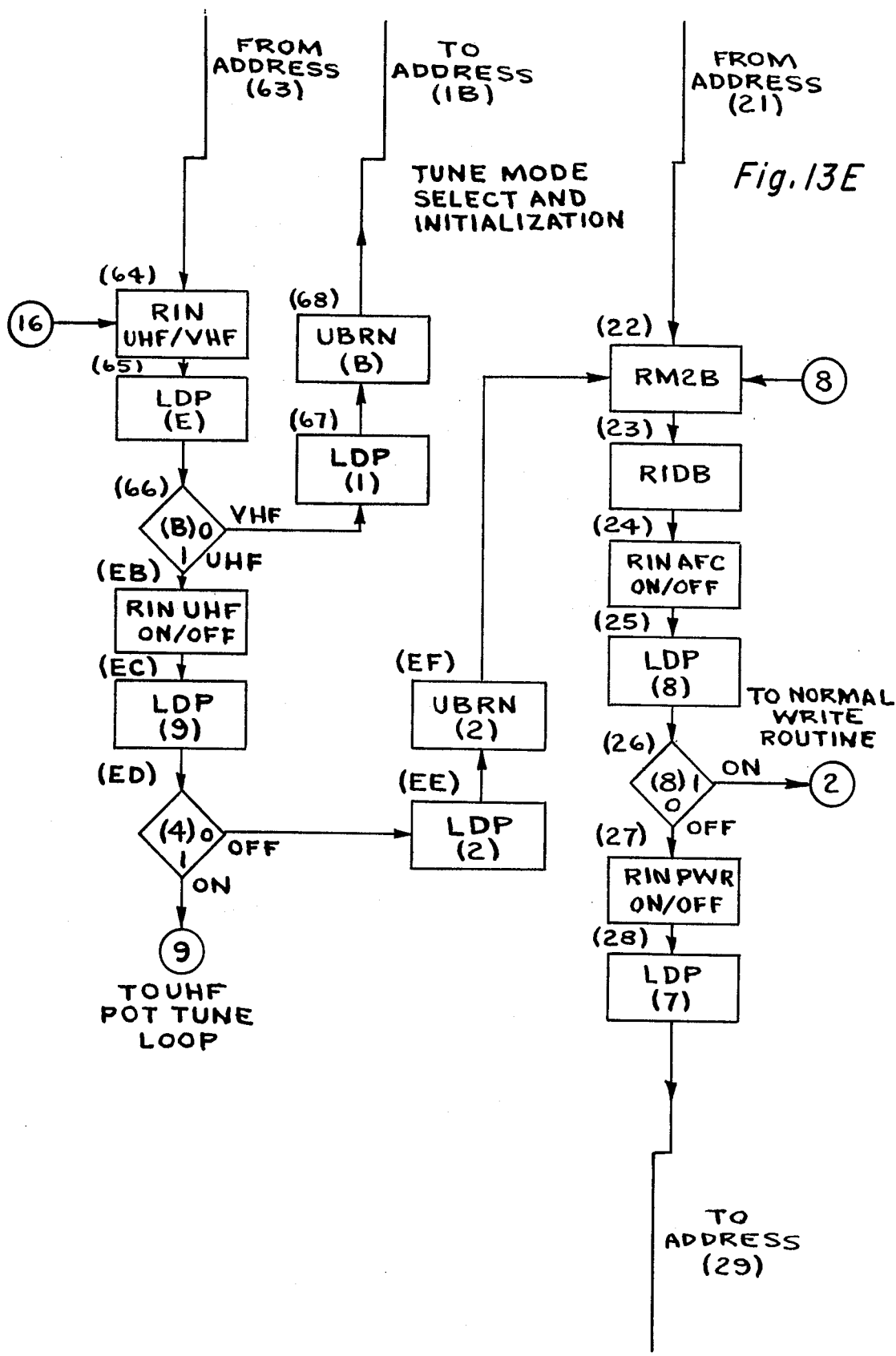
Figure 13F:
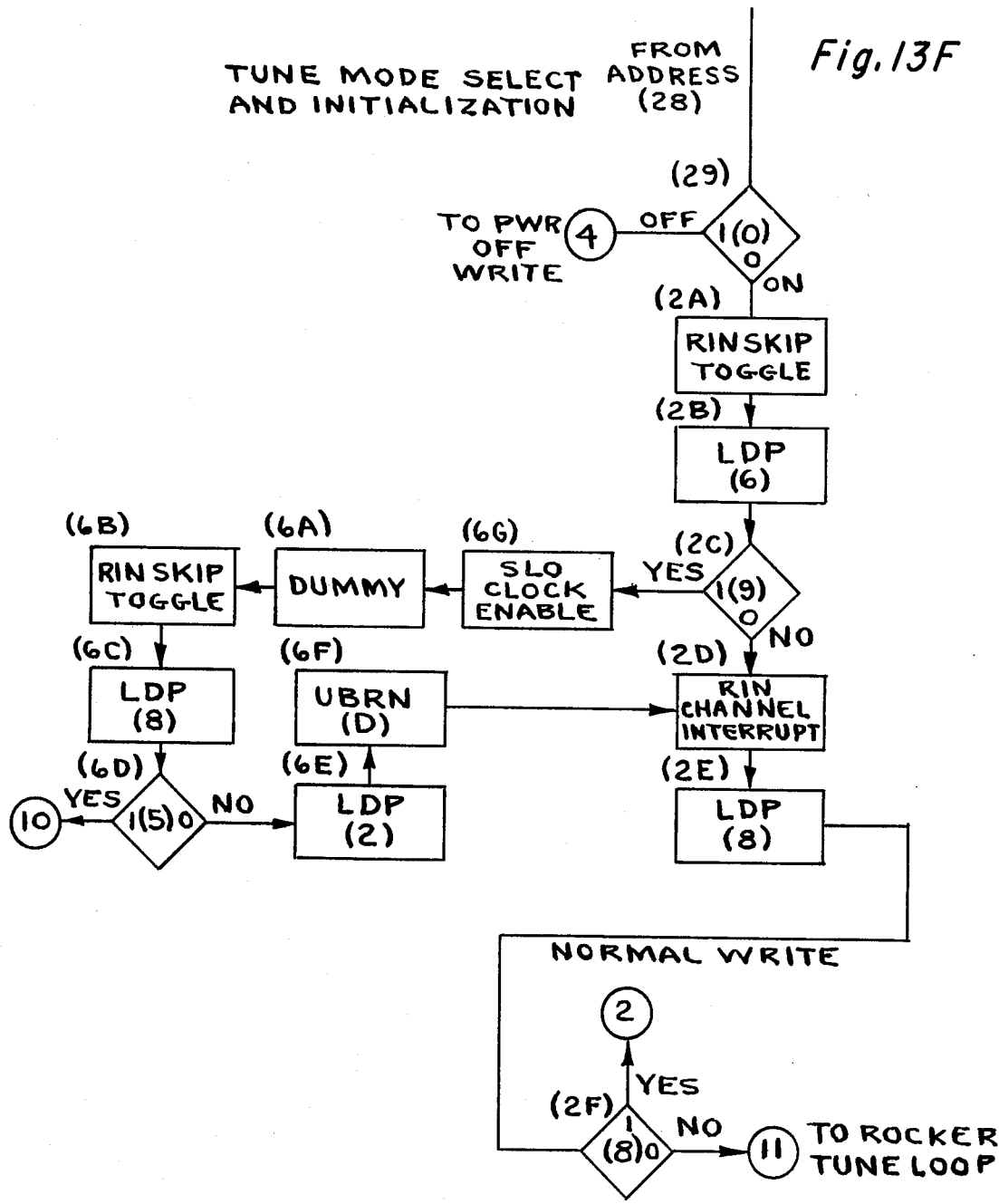
Figure 13G:
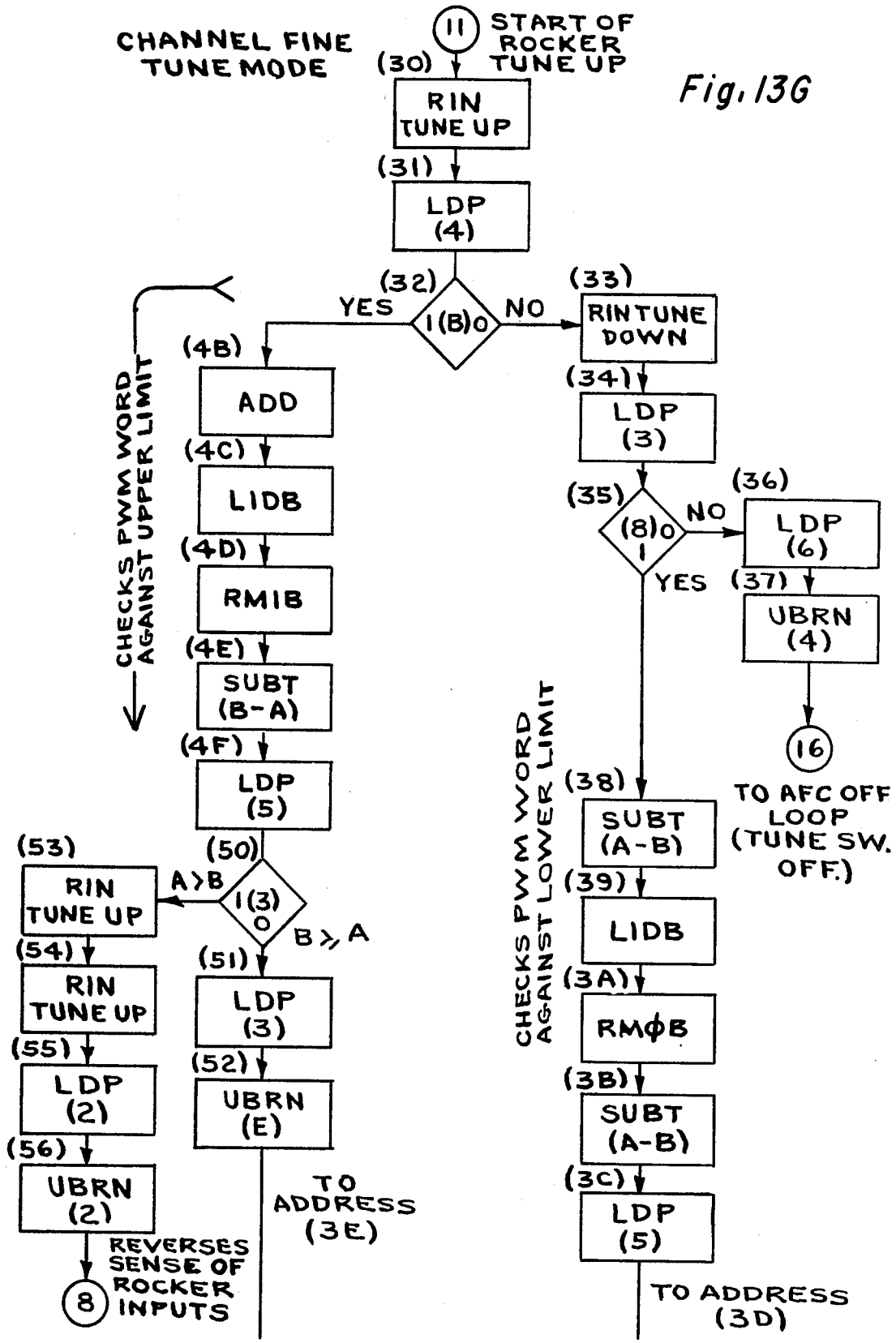
Figure 13H:
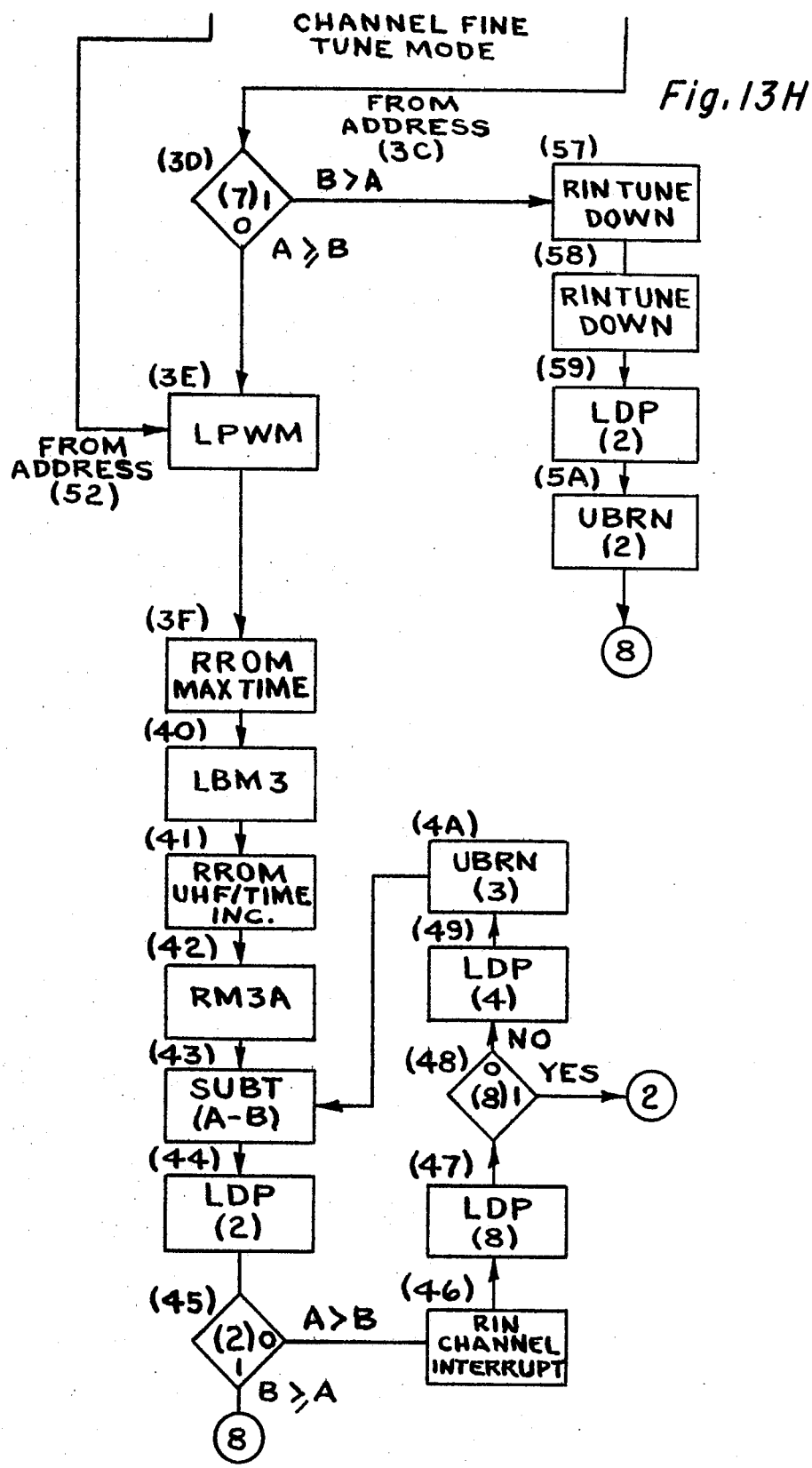
Figure 13J:
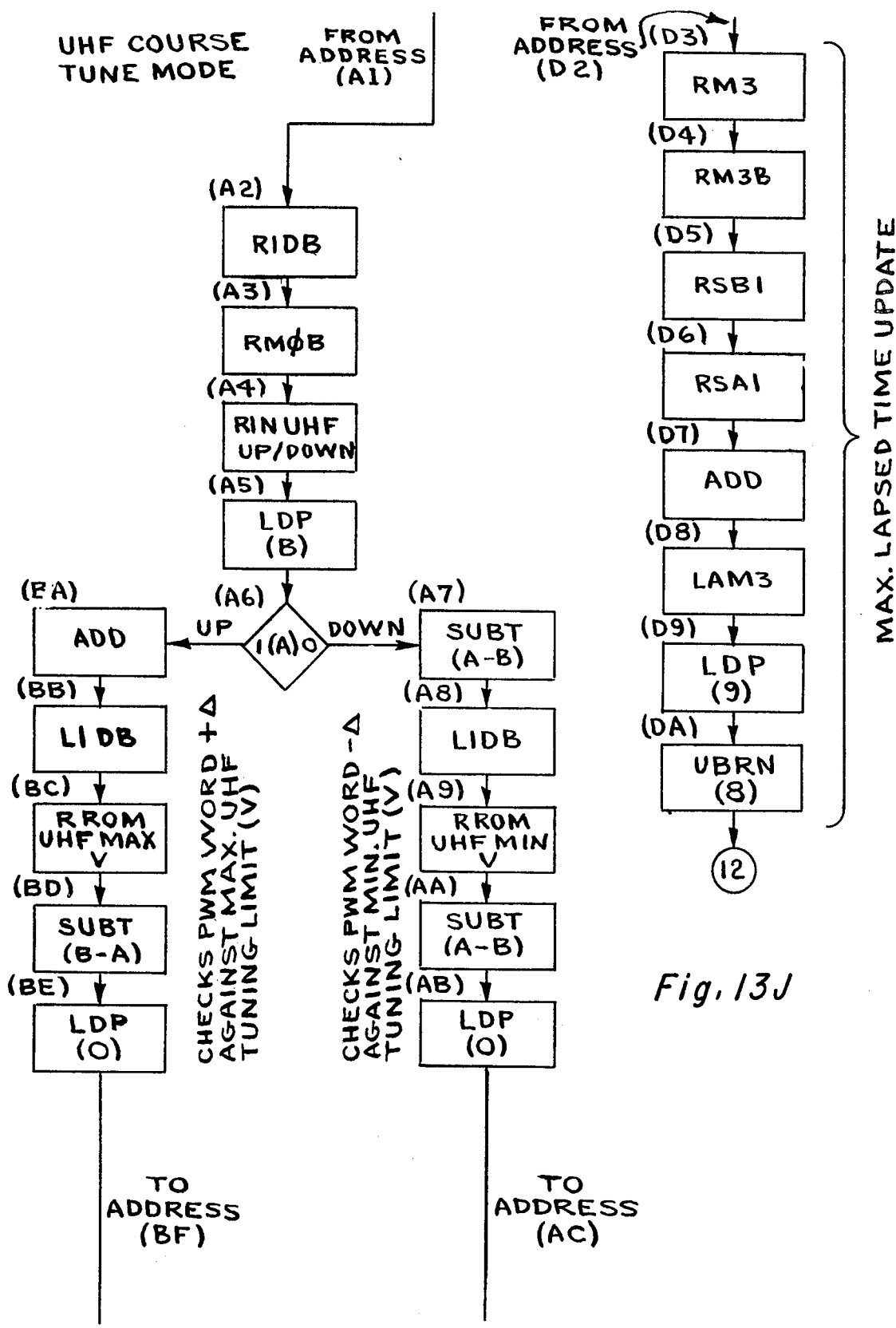
Figure 13K:
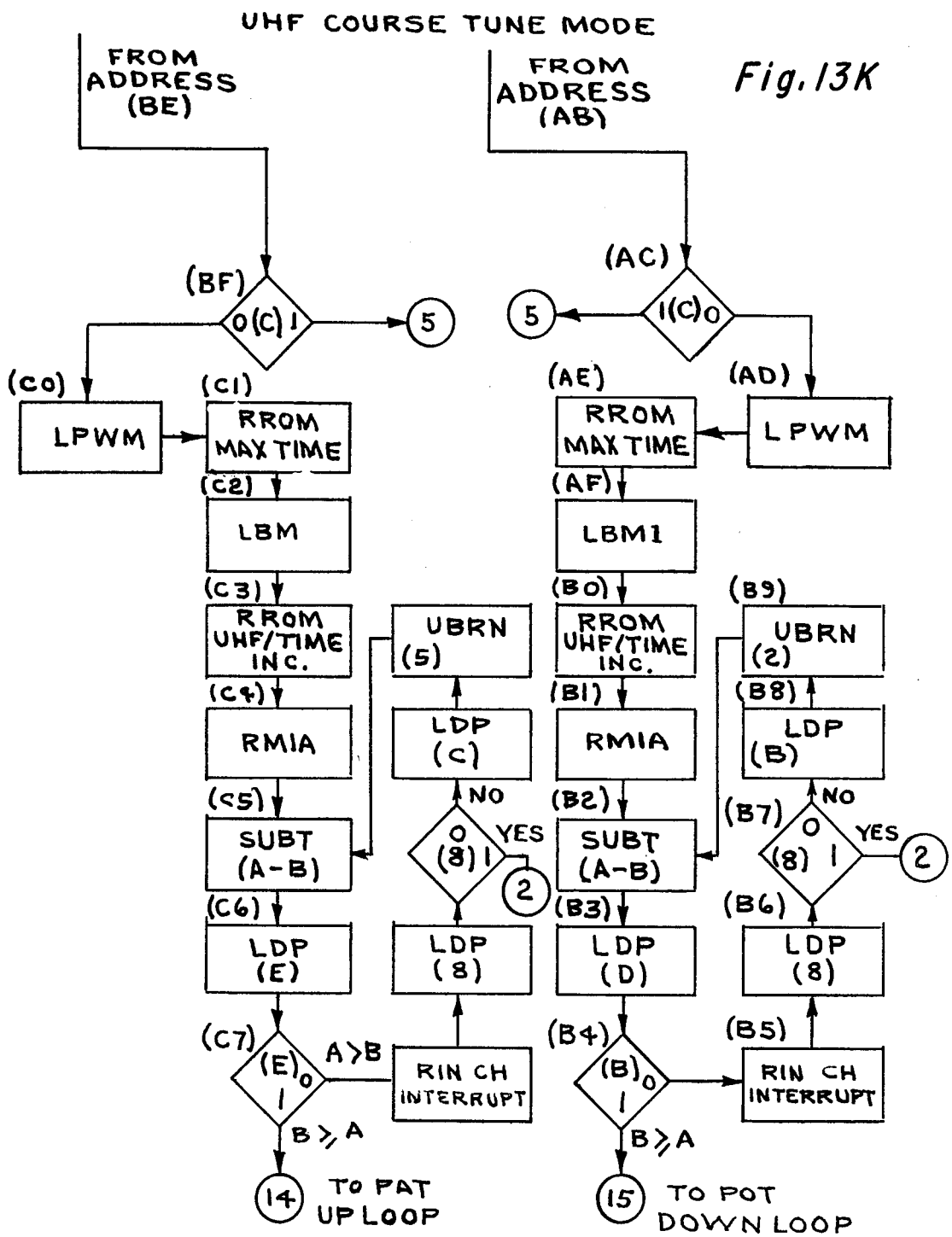
Figure 13L:
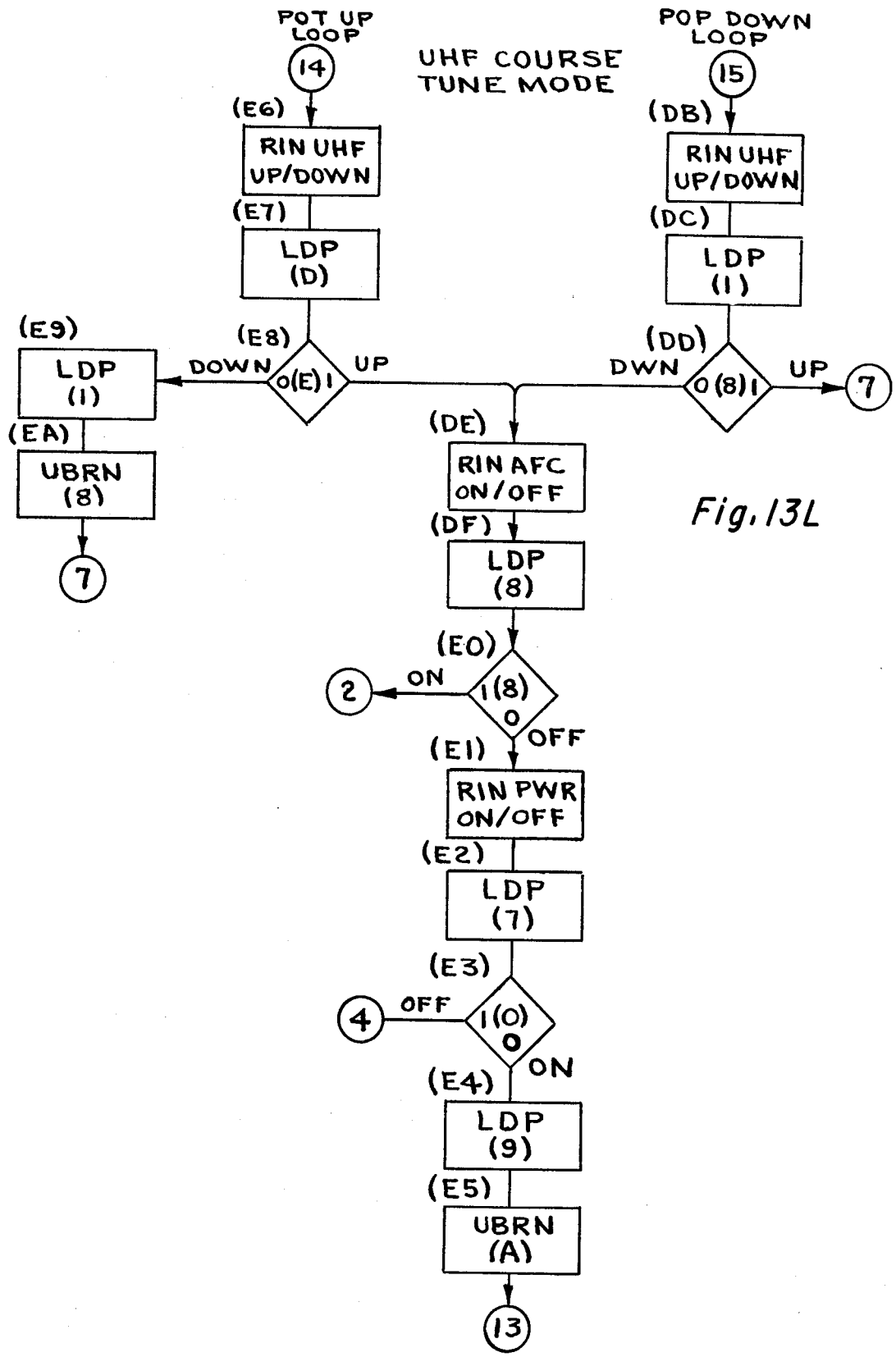

The tuning system is activated by a power up entry ① in FIG. 13A followed by a load page command (LDP) where a 4 bit address code is loaded into the page latch 294 to address one of the 16 pages in the instruction ROM 286. A clear write (SWRO) operation is performed to reset the sense line to the memory IC to switch the memory cells from a write mode to a read mode. A read channel interrupt loop is performed whereby the system reads the channel interrupt switch until the channel interrupt indication is no longer present.

A channel interrupt indication 224 from the selector switch 202 is applied to the input logic status switch 280. When the input signal matches a 12 bit binary decode 284 the status latch 282 is set. The read channel interrupt loop continuously reads the status latch to determine whether or not it has been set. As long as the status latch has been set from an indication of a channel interrupt the system will loop back into the read mode and will continue until the signal in the status latch is eliminated by the completion of a channel selection at the selector switch 202. The purpose of the channel interrupt read operation is to prevent the system from reading the channel tune word when the selector switch is being changed from one channel to another.

Upon jumping out of the read channel interrupt loop a read channel code switch (RCCS) is performed whereby the five bit address from the selector switch and address generator is parallel loaded into the nonvolatile memory address latch buffer 206 of the memory IC. A slow clock enable signal provides dampening to offset any electromechanical bouncing that may occur during the switching operation. Additional dampening is provided by right shift of the B working register 274 (RSB3) where at a slow clock rate the working register is right-shifted 14 times into itself followed by an unconditional branch command (UBRN) to the next address in the instruction ROM.

The next instruction is to sense the nonvolatile memory (SNVM) where the 15 bit word stored in the memory is parallel loaded into the data out buffer register 210 during a clock pulse. At the same time the 5 bit address from the address latch 206 is parallel loaded into the 5 bit address register 208. Two successive 10 right shift operations are performed by the registers 208 and 210 upon a read nonvolatile memory buffer command (RNVM). Upon completion of the 20 bit right shifts the 14 bit tune word is located in the 14 bit input data buffer register 234, the 15th bit indicating the skip indication is located in the skip toggle buffer 232, and the 5 bit select address code is located in the address buffer 230. The load PWM command (LPWM) parallel loads the 14 bit binary tune word from the 14 bit data latch 238 into the 14 bit PWM logic latch 248. This provides a binary word which is proportional to the analog voltage and sets a binary compare word for the PWM counter that is continuously counting. When the PWM counter reaches the 14 bit binary word that matches it in the 14 bit PWM logic latch, a signal trips the latch and sends the output to the PWM buffer and oscillator 252.

The digital signal is converted to an analog voltage by means of the drive buffer 312, the three-stage PWM filter 314, the tune voltage amplifier 316, and the final PWM filter 318. The analog output comprising the channel tune voltage is sent to the varactor tuner of the television.

If the system power is turned off the 14 bit tune word in the input buffer data register 234 is written into the nonvolatile memory 212. After reading the on/off power switch a 4 bit page address is loaded into the page latch 294 that corresponds to the page of instruction that the system will branch to if the system detects a power off state. In the algorithm this is page 7. The power on/off indication is read into the input logic status switch 280 which if present in the status latch the system branches to the power off write routine ④ in the algorithm at address 70.

The branch statement loads a "0" into the first four bits resulting in a page 7 instruction 0 address. Two successive 10 bit shifts are required to load the 14 bit tune word, the 1 bit skip indication, and the 5 bit select address into the nonvolatile memory. Upon two successive right shift operations the 14 bit tune word and the 1 bit skip indication is loaded into the 15 bit data in register 216 and the 5 bit select address is loaded into the 5 bit shift register 218. A write 0 command (WRO) sets the voltages in the nonvolatile memory for the subsequent write operation. The nonvolatile memory will remain in a write mode until the system is commanded to change by a clear (CWRO) command. The system is programmed for the duration of time it is to remain in the right mode by a read ROM (RROM) command. Fourteen bits of data comprising the right time is read from the ROM constant file 264 and parallel loaded into the 14 bit B working register 274. In the next operation the 14 bit word comprising the write time is serially loaded from the B register into the temporary storage RAM file in the third memory file location by a LBM3 command. This command also restores the data into the working register. The 14 bit binary write time word is now read out of the temporary storage RAM file into the 14 bit A working register 226 by a RM3A command. The 14 bit binary right time word is now stored in working registers A and B.

The instruction ROM 264 is again read by a read ROM command (RROM) whereby a 14 bit word comprising the UHF/time increment is parallel loaded into the B working register 274 from the ROM file. In the next operation the increment value stored in the B working register is subtracted from the magnitude word that is stored in the A working register. In a loop routine the increment value of the B register is subtracted from the decremented magnitude word in the A register until a test condition is reached where the word in the B register is greater than the word in the A register. This condition is detected by reading the status latch 282 as when the condition is satisfied a 1 will be detected. When the 1 is detected in the status latch the system will jump out of the loop and perform a clear write operation (CWRO) which takes the system out of the write mode after the time out operation.

The system now performs a loop routine of reading the channel interrupt and upon either a 0 or 1 indication in the status latch the system will loop back into the read channel interrupt mode. This provides a fixed loop to prevent the system for jumping to another part of the algorithm during a power down routine. When the system is powered up again the algorithm will begin at the ①power up entry location beginning with a load page command at address 00.

The write routine was entered into by an indication of a power off signal represented by a 1 in the status latch. If the power remains on the system will continue by a reading of the skip toggle input in the logic status switch 280. A load page (LDP) command will load a new page address into the page latch 294. If a skip toggle indication is detected a 1 state will be entered into the status latch in which it will trigger the page latch and enter the new address into the 8 bit program counter 290 that will perform a branch operation to the new page address. In the branch operation a slow clock enable is performed with a second read skip toggle and another load page. If the skip toggle indication has been removed the system will load a new page into the program counter and perform an unconditional branch (UBRN) to ⑥ of the algorithm at address 12. This branch operation tests the skip toggle to insure that it was not an accidental input. If the skip toggle indication is still present the system will read the skip toggle switch again and perform a looping operation until the skip toggle signal has been removed. When the skip toggle input is removed the program will jump to ③ at address 87 which is the skip toggle write routine. The write operation now performed is identical to the power off write routine at ④ address 70. This nonvolatile memory is sensed by an SNVM command followed by two 10 right shift commands in loading the nonvolatile memory (LNVM). A write command (WRO) sets the voltages for a write operation in the nonvolatile memory matris. A 14 bit binary word comprising the write time is read into the B working register 274 and is then read out into the temporary storage RAM file in memory location 3. It is then read into the 14 bit A working register 266. The ROM constant file 264 is read again for the UHF/time increment value and is loaded into the 14 bit B working register. In decrementing by subtracting, a loop operation is performed until the contents of the decremented A register is less than the stored increment value in the B register. At this point the system jumps back to page 0 instruction 0 at the power up entry level of the algorithm ①.

If no skip toggle input had been detected in instruction 0 F the program would perform a read channel interrupt command at instruction 12 and a load page operation to page 0. If the channel interrupt has been detected by a 1 in the status latch the algorithm will branch to ① which is the power up entry position at the beginning of the algorithm at address 00. If no channel interrupt has been detected the system will read the AFC on/off switch at the input logic status switch 280 and branch to ⑤ at address 04 which comprises a read channel code switch if an AFC on/off indication has been detected. If there is no AFC on/off indication the system will branch to ⑦ at address 18 which is the start of the AFC loop for the tune mode select and initialization.

With the AFC switch in the off position, the television may be tuned in a manual mode. Since the system is programmed for and has memory storage for only 8 UHF channels and there are a possible 72 UHF channels in existence, the tuning minimum and maximum limits must be set so that they may be utilized with any one of a possible 72 UHF channels. To accomplish this, a UHF channel limit is read from ROM at instruction address 5B and loads the contents into the B working register 274. In the UHF mode fixed channel limits may be set up about any one of the 72 possible channels because the varactor tuning curve has a linear transfer characteristic. This allows for the setting of fixed limits around any desired channel. The tune word from the input data buffer 234 is read into the A working register 266. The UHF tune limit in the B working register is added to the tune word in the A register and the result is stored in the temporary storage RAM file 276 in memory location 1. The original tune word is again read from the input data buffer 234 and stored into the A working register. The UHF channel limit from the B working register is now subtracted from the tune word in the A working register and loaded into the temporary storage RAM file 276 in memory location 0. This sequence of operations now stores in the temporary storage RAM file a lower tune word limit and an upper tune word limit for the particular UHF channel that has been selected.

The UHF/time increment value is read from the ROM at instruction address 62 and loaded into the B working register 274. This 14 bit binary word has a 1 in the LSB position and is used for incrementing the UHF as well as for incrementing time. This incrementor value is loaded into the temporary storage RAM file 276 in memory location 2. The temporary storage RAM file now has in its memory location 0, 1, and 2 the necessary information to perform UHF tuning if necessary. The system now reads whether the selector has been set for a UHF or a VHF channel by reading the input to the input logic status switch 280. The UHF/VHF input is directed from decoding of the 5 bit address at the address decode 260. The page latch 294 is loaded with page E and after the read operation if a UHF signal is detected by a 1 in the status latch the system will continue at address EB where the UHF on/off input is read. If a UHF tuning mode is detected the system after a load page operation will branch to ⑨ at address 94 which is the start of the UHF pot tune loop in the UHF coarse tune mode. If the UHF is in the off position, then the system will continue at address EE and branch to instruction 22.

This loop is applicable for both VHF and UHF tuning. If at instruction 64 a VHF mode was detected, the system would branch to page 1 instruction B where the VHF increment value would be read from the ROM constant file and loaded into the B working register 274. In the VHF mode each channel has one of four possible increment values. The increment value that has been read into the B working register is normalized by a NOR B command where a right shift operation serially shifts the VHF increment value until the weighted bit value is reached for the VHF channel that has been selected. The VHF increment value is loaded from the B working register into the temporary storage ramp file 276 in memory location 2. The ROM constant file 264 is read and the VHF maximum tune word is loaded into the B working register 274 and then loaded into the temporary storage ramp file in memory location 1. The ROM constant file is read again for the VHF minimum tune word and is read into the B working register and then read into the temporary storage RAM file in memory location 0.

The temporary storage RAM file now has in memory location 1 the VHF maximum tune word, in memory location 2 the weighted VHF increment value, and in memory location 0 the VHF minimum tune word. Each of the twelve VHF channels has a unique minimum tune value and a maximum tune value in contrast to the UHF channel limit.

The system at address 22 now operates in either the UHF or VHF mode. The increment value is read from the memory 2 location of the RAM file into the B working register 274. The tune word in the input data buffer 234 is read into an A working register 266. Before updating the tune word a series of read operations is performed. First the AFC on/off switch is read. If the AFC is at an on state, the program will jump to ②at address 88 where a normal write routine is performed to write the tune word from the input data buffer into the nonvolatile memory. If the AFC control is in the off state, the system will read the power on/off input. If the power is off, the system will jump to ④at address 70 for a power off write routine to again write the word in the input data buffer into the nonvolatile memory location. If the power is in the on state, the system will read skip toggle, and if a skip toggle is present will go into a skip toggle loop similar to that previously discussed. If no skip toggle is indicated, the system will read the channel interrupt input and if present will go to ⑪ at address 30 which is a rocker tune loop. If there is a channel interrupt, the system will go to ②at address 88 for a normal write routine to write the tune word from the input data buffer 234 into the nonvolatile memory 212.

Address 30 is the start of the rocker tune loop for fine tuning in either the UHF or VHF mode. A read tune-up command is used to determine whether the system is in a tune-up mode or a tune-down mode. In a tune-up mode the system branches to address 4B where the contents of working registers A and B are added together comprising the tune word and the increment value with the result being stored in the input data buffer 234. The maximum tune limit is read out of the temporary storage RAM file into the B working register. A subtract operation at address 4E subtracts the updated incremented tune word from the maximum tune limits. If the resulting operation results in a positive number, the system will branch to address 3E and will load the updated tune word into the PWM logic latch 248. This address is additionally reached by reading the tunedown indicator at address 33 and upon an indication of a tunedown input checking the PWM tune word against the lower tune limit. The PWM logic latch 248 will be loaded where upon subtracting the lower tune limit from the tune word results in a positive number at address 3D.

After loading the PWM, a timing routine is performed. This routine provides a fixed timing sequence for incrementing the tuned word. The present system is designed for eight pulses per second. However, other timing sequences may be employed; for example, 16 pulses per second or 32 pulses per second. The timing varies as a function of how fast it is desired to perform the updating of the tune word in the fine tuning mode.

The maximum time limit is read from the ROM constant file into the B working register 274 and additionally loaded into the temporary storage RAM file 276 in memory location 3. The ROM constant file is read again for the UHF/time incrementing value and loaded into the B working register. Memory location 3 containing the maximum time limit is read into the A working register 266. Subtracting the contents of the B working register from the A working register is performed in a loop routine until register A has been decremented to a negative number. At this point the system will jump to ⑧at address 22 where the increment value is again read from the temporary storage RAM file into the B working register and reading the latest updated tune words from the input data buffer 234 into the A working register. The A working register now contains the latest incremented or decremented tune word. The system would also jump out of the loop during the timing cycle if a channel interrupt indication was present at address 4A where the system would jump to ②at address 88 to perform a normal write routine of the updated tune word into the nonvolatile memory.

The program will continue through the incrementing or decrementing of the tune word. In addition in the tune-up mode at address 50 the updated tune word is compared with the upper limit and in the tune-down mode at address 3D the updated tune work is compared with the lower tune limit. At these addresses if the system has gone beyond the upper tune limit or gone beyond the lower tune limit, a branch operation will be performed to read the tune-up input at address 53 or the tune-down input at 57 depending upon whether the system has been operating in a tune-up or tune-down mode. In either case, the system will unconditionally branch to ⑧at address 22.

During the sequence of operation the tune-up or tunedown indication is read twice. The purpose of the double read operation is to change the function of the input switch. Where the system was reading up we want the system to read down and where the system was reading down before we want the system to read up. This provides for an automatic reversing of direction during the AFC/off tuning of the TV. If during the AFC/off tuning in either the up mode or down mode exceeds the upper or lower limits, the system will automatically reverse direction and tune in the other direction.

If during a tuning mode the UHF tune switch is read in the on state at address EB, the system at address ED will branch to ⑨which is the beginning of the UHF pot tune loop at address 94 at the beginning of the UHF coarse tuning mode. The ROM constant file is read for the UHF/time increment value and loaded into the B working register 274 and into the temporary storage RAM file 276 in the memory location 0. The ROM constant file is read again for the maximum time value which is loaded into the B working register and into the temporary storage RAM file at memory location 3. The ROM constant file is read again for the UHF/time increment value which is loaded into the B working register and into memory location 2 of the temporary storage RAM file.

In the UHF tuning mode a different rate of tuning is programmed into the system. The system starts off at a slow tuning rate then accelerates the tuning rate as a function of time to allow tuning from one end of the tuning band to the other end of the tuning band within a reasonable time yet allow for the contingency of tuning initially at a slow rate if the desired tune voltage is close to the starting point. The UHF/time increment value is read from memory location 2 of the temporary storage RAM file into the A working register and also the UHF/time increment value is additionally read from the ROM constant file into the B working register. These two UHF/time increment values in the A and B working register are added together and the results stored in memory location 2 of the temporary storage RAM file. The maximum time for UHF tuning is read from memory location 3 of the temporary storage RAM file into the B working register. After a subtract operation of the updated UHF/time increment value from the maximum tune time in the B working register, a test operation at address A 1 is performed. If the maximum time value is greater than the lapsed time, the system will read the input data buffer register 234 which contains the tune word that is going to be updated into the A working register. The input data buffer acts as a temporary storage file during the tuning operation. In addition, the UHF/time increment value is read out of memory location 0 of the temporary storage RAM file into the B working register. The UHF/time increment value has a 1 in the LSB position and zeros in all the other bit positions. This is used to increment the tune word by 1 in the LSB position. The UHF up/down control is read to determine the direction of the UHF tuning.

The UHF up/down input is fed from a comparator 282. The output of the comparator is compared with the actual tune voltage in the system. If the system is tuning in an up mode at address 86, the system will perform an add function which will add the contents of the B working register with the A working register and load it into the input data buffer 234 which will now contain an incremented UHF tune word. The UHF maximum tune value is read from the ROM constant file into the B working register and the updated tune word in the A working register is subtracted from it to determine if the updated tuning word has exceeded the UHF tuning limit. At this point it would be desired to stop the tuning in the up mode and reverse direction. If at address BF the test condition indicates that the maximum UHF tuning limit has been reached, the system will branch to ⑤ at address 04 which is a non-tuning mode.

If the maximum UHF tuning limit has not been reached, the system at address CO will load the updated UHF tune word into the PWM logic latch 248. The next operation performed is a time out for UHF tuning. The maximum time value is read from the ROM constant into the B working register and read into memory location 1 of the temporary storage RAM file. The UHF/time increment value is read from the ROM and stored in the B working register. The maximum time value is read from the memory 1 of the temporary storage RAM file into the A working register 266. The UHF/time increment value from the B working register is subtracted from the maximum time value in the A working register. A test loop routine is provided at address C5 to continue the subtract operation of the UHF/time increment value from the maximum time until it is decremented to a negative number.

During the loop operation of the time out the channel interrupt select switch is read for a positive input whereby the system would branch to ② at address 88 which is a normal write routine. If no channel interrupt is detected, the system will continue looping until a negative value is reached during the subtract operation, and the system will branch to ⑭ at address E6 which is the start of the pot up loop.

In an identical routine the system will perform UHF tuning in the down mode at address A7. Here the system checks the PWM word against the minimum UHF tuning limit that has been read from ROM and stored in working register B at address A9.

A time out routine is provided at address AE identical to the time out routine performed during the uptuning in the UHF mode. At the completion of the time out for the UHF tuning in the down mode, the system will branch to ⑮ at address DB which is the start of the pot down loop.

At address E6 the system will read the UHF up/down switch to determine whether the system is tuning in the up mode or down mode. If the system has detected that it is tuning in a down mode, it will branch to ⑦ at address 18 which is the start of the AFC off loop. If the system is continuing the UHF tuning in the up mode, the system will continue by reading the AFC on/off switch and branch to ② at address 8A for normal write routine if the AFC is in the on position. If the AFC is in the off position the system will read the power on/off switch and branch to ④ at address 70 for a power off write routine if the power has been turned off. If the power has remained on, the system will branch to ⑬ at address 9A which is the start of the lapse time counter.

In a similar manner at address DB for the pot down loop the system will read the UHF up/down switch and if an up tuning mode is detected, the system will branch to ⑦ at address 18. If the system is continuing to tune in the down mode, then the system will continue with the sequence at address DE.

On completion of this loop in branching back to address 9A a complete cycle of updating the tune word has been completed for either the UHF up tuning of UHF downtuning.

In continuing a second loop at address 9A the UHF/time increment value will be incremented by its own value to provide a new UHF/time increment value which is double the original value. This new UHF/time increment value will be added to the previously updated UHF tune word which is stored in the input data buffer 234. Prior to the addition a test condition will determine whether or not the updated UHF/time increment value has exceeded the UHF maximum time value. If the UHF maximum time value has not been reached, the system will continue updating the tune word in a closed loop routine starting at address 9A. The updated tune word will be incremented by an increasing UHF/time increment value during each loop until the maximum time value has been reached. When the UHF maximum time limit has been reached at the test operation at address A1, the system will branch to address CD. This new loop routine provides a continuous incrementing or decrementing of the UHF tune word first at a slow rate and then upon each successive loop at an increased rate by increasing the value of the UHF/time increment value in the ROM constant file.

Once the UHF maximum time limit has been reached, the system will change the UHF tuning rate beginning as address CD. The subsequent routine provides a high speed bit weight update of the UHF/time increment value for increasing the rate of tuning. In addition, the maximum tuning time value is also increased. The UHF/time increment value is read from memory location 0 of the temporary storage RAM file into the A working register. At address CD an RSA 14 operation is performed. This function performs a right shift operation of the A working register by 1 bit. The UHF/time increment value is read from memory location 0 of the temporary storage RAM file into the B working register and is also right shifted by 1 bit. The contents of the A and B working registers are added together, and the result stored in memory location 0 of the temporary storage RAM file. This additional operation increases the UHF/time increment value by a factor of 2. This operation now provides a high speed bit weight update by employing the increased UHF/time increment value.

The maximum time value is read from memory location 3 of the temporary storage RAM file into the A working register. Working registers A and working registers B are right shifted 14 bits with a restore operation. The content of the A and B working registers are added together and stored in memory location 3 of the temporary storage RAM file. This addition of the two working registers results in a doubling of the UHF maximum time limit. Upon completion of the doubling of the UHF/time increment value and the UHF maximum time value, the system branches back to ⑫ at address 98 of the program. At this point tuning will be at double the UHF/time increment value and for double the maximum tune time.

The system will continue tuning through the program by testing for an up or down tuning direction at address 86 and checking the PWM word against the maximum UHF tuning limit during an up tuning mode and checking the PWM word against the minimum UHF tuning limit in a down tuning mode. If neither limits have been exceeded, the system will load the PWM data latch with the updated tuning word and perform a time out operation followed by a branch to either the pot up loop for up tuning or pot down loop for down tuning. In either case the loop will detect a change in tuning direction and if detected branch to ⑦ at address 18. If the system has not received a change in direction indication, it will continue by reading the AFC on/off and power on/off controls with a branch to ⑬ at address 98 if neither of the controls have been activated.

At this point the system will continue the loop routine through the lapse time counter and incrementing or decrementing the updated tune word until the lapse time counter has been decremented to a negative number where the system will branch to address CD. In this new loop the UHF/time increment value and the maximum tune time value will again be doubled, that is quadruple the original values stored in the ROM, and the system will continue tuning by branching to ⑫ at address 98. The sequence will be as previously described where the lapsed time counter routine will be performed with a new UHF/time increment value and maximum time value which will be double the previous value. This provides for a high speed bit weight update in the tuning of the UHF channel.

A binary word corresponding to each of the individual VHF and UHF channels selected may be programmed into the nonvolatile memory matrix by the manufacturer of the system prior to sale. The binary tune word would correspond to the nominal tune voltage of the corresponding channel. In the alternative, however, the manufacturer may allow the ultimate user to perform this function. In this instance the user would initially go through the tuning mode for each channel selected until the tune voltage is arrived at that satisfies the user's requirement. At this point the tune word would be stored into the nonvolatile memory by one of the write modes defined in the instruction set.

Whereas the present invention has been described with respect to a specific embodiment thereof, it will be understood that various changes and modifications will be suggested to one skilled in the art, and it is intended to encompass such changes and modifications as fall within the scope of the appended claims.

What is claimed is:

1. A method for tuning a broadcast receiver to a selected frequency using a microcomputer comprising the steps of:
   generating a binary address for outputting a digital tune word corresponding to said selected frequency from a memory matrix containing a plurality of said digital tune words;
   storing said outputted digital tune word and said binary address in a shift register;
   updating said digital tune word stored in said shift register by incrementing or decrementing said digital tune word by an increment value read from a data memory matrix; and
   converting said digital tune word stored in said shift register into an analog voltage operative to tune said broadcast receiver to said selected frequency.

2. A method of claim 1 further including the steps of:
   generating a plurality of operating instructions and logic functions operative to perform said updating;
   providing binary data responsive to said binary address and said instructions operative in updating said digital tune word; and
   reading a plurality of input control functions operative to alter said operating instructions.

3. A method of claim 1 wherein said converting said digital tune word into an analog voltage comprises the steps of:
   outputting a digital signal proportional to said digital tune word by means of a pulse width modulator generator; and
   converting said digital signal to said analog voltage by means of an operational amplifier.

4. A method of claim 1 wherein said incrementing and decrementing comprises the steps of:
   storing said digital tune words from said shift register into a first working register;
   reading from said data memory matrix said increment value;
   storing said increment value in a second working register;
   adding and subtracting said increment value in said second working register to said digital tune word in said first working register by means of an adder; and
   loading said updated digital tune word into said shift register.

5. A method of claim 4 further including restoring said updated tune word into said first working register.

6. A method of claim 4 wherein said adding is performed in a tuning mode and said subtracting is performed in a tuning down mode.

7. A method of claim 4 further includng temporarily storing said increment value in a storable memory.

8. A method of claim 4 wherein said system is tuning in the VHF mode comprises the steps of:

reading from said data memory matrix and minimum VHF tune limit;

storing said limit in said second working register; and comparing said updated digital tune word against said limit.

9. A method of claim 4 further including the step of performing a time out operation by decrementing a maximum time value.

10. A method of claim 4 further including right shifting said increment value in providing a normalized increment value for updating said digital tune word while tuning in a VHF mode.

11. A method of claim 4 where the system is tuning in the VHF mode, comprising the steps of:

storing said maximum tune limit in said second working register;

adding said maximum tune limit to said digital tune word in said first working register;

reading from said data memory matrix a UHF channel limit;

storing said channel limit in said second working register;

adding said UHF channel limit to said digital tune word in said first working register resulting in a maximum UHF tune limit;

subtracting said UHF channel limit from said digital tune word in said first working register resulting in a minimum UHF tune limit;

storing said maximum and minimum UHF tune limits in a memory; and comparing said updated digital tune word against said limit.

12. A method of claim 8 further including the step of storing said minimum and maximum limits in a storage memory.

13. A method of claim 8 where each VHF channel has a unique minimum tune limit and maximum tune limit stored in said data memory matrix.

14. A method for tuning a broadcast receiver to a selected frequency using a microcomputer comprising the steps of:

generating a binary address on a multibus line;

addressing a digital tune word corresponding to said selected frequency from a memory matrix by means of said binary address;

storing said binary address and said addressed digital tune word in a shift register;

updating said stored digital tune word by incrementing or decrementing said stored digital tune word by means of an increment value read from a binary data memory matrix;

generating a plurality of operating instructions and logic functions operative in updating said digital tune word;

producing a plurality of input control functions operable to change the sequence of said operating instructions and converting said digital tune word stored in said shift register into an analog voltage operative to tune said broadcast receiver to said selected frequency.

15. A method of claim 14 wherein said broadcast receiver is tuning to a plurality of UHF and VHF channels.

16. A method of claim 14 wherein said generating a plurality of operating instructions and logic functions comprises the steps of:

outputting a binary address from a program counter;

addressing an instruction memory by means of said binary address for outputting a selected operating instruction from said instruction memory; and addressing a program logic array by means of said operating instruction for outputting a selected logic function.

17. A method of claim 14 wherein said producing a plurality of input control functions comprises the steps of:

decoding said inputted control functions by means of a binary code provided by said operating instruction;

applying said decoded inputted control function to a status latch; and loading a new instruction address into a program counter by means of said status latch and said logic function.

* * * * *